United States Patent
Joo et al.

(10) Patent No.: US 11,456,428 B2
(45) Date of Patent: Sep. 27, 2022

(54) INDOLOCARBAZOLE DERIVATIVES AND ORGANIC ELECTROLUMINESCENT DEVICES USING THE SAME

(71) Applicant: SFC CO., LTD., Cheongju-si (KR)

(72) Inventors: SungHoon Joo, Cheongju-si (KR); Ji-Hwan Kim, Cheongju-si (KR); Byung-sun Yang, Cheongju-si (KR); Hyeon Jun Jo, Cheongju-si (KR); Sungeun Choi, Cheongju-si (KR); Su-jin Kim, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 227 days.

(21) Appl. No.: 16/687,890

(22) Filed: Nov. 19, 2019

(65) Prior Publication Data
US 2020/0161552 A1    May 21, 2020

(30) Foreign Application Priority Data

Nov. 21, 2018 (KR) .................. 10-2018-0144529
Oct. 25, 2019 (KR) .................. 10-2019-0133617

(51) Int. Cl.
*H01L 51/50* (2006.01)
*H01L 51/00* (2006.01)

(52) U.S. Cl.
CPC .......... *H01L 51/008* (2013.01); *H01L 51/508* (2013.01); *H01L 51/5024* (2013.01); *H01L 51/5076* (2013.01); *H01L 51/5092* (2013.01); *H01L 51/5096* (2013.01)

(58) Field of Classification Search
None
See application file for complete search history.

(56) References Cited

U.S. PATENT DOCUMENTS

| 2005/0142379 A1* | 6/2005 | Juni ............... G02B 5/0242 428/690 |
| 2009/0053557 A1* | 2/2009 | Spindler ........... H01L 51/0058 428/690 |
| 2016/0126464 A1* | 5/2016 | Yokoyama ........ C07D 307/91 257/40 |

(Continued)

FOREIGN PATENT DOCUMENTS

| EP | 3 109 253 A1 | 12/2016 |
| JP | 2018-43984 A | 3/2018 |
| KR | 10-2018-0122298 A | 11/2018 |

(Continued)

OTHER PUBLICATIONS

Extended European Search Report dated Mar. 16, 2020 in corresponding European Patent Application No. 19210240.8 (6 pages in English).

(Continued)

*Primary Examiner* — Gregory D Clark
(74) *Attorney, Agent, or Firm* — NSIP Law

(57) ABSTRACT

Disclosed are indolocarbazole polycyclic aromatic derivatives that can be employed in various organic layers of organic electroluminescent devices. The indolocarbazole derivatives have a boron-containing structure. Also disclosed are organic electroluminescent devices including the indolocarbazole derivatives. The organic electroluminescent devices are highly efficient and long lasting and have greatly improved luminous efficiency.

16 Claims, 1 Drawing Sheet

(56) References Cited

U.S. PATENT DOCUMENTS

2018/0069182 A1 3/2018 Hatakeyama et al.
2020/0058885 A1* 2/2020 Hong ..................... C09K 11/06

FOREIGN PATENT DOCUMENTS

| WO | WO 2015/001726 | * | 1/2015 | ............. H01L 51/50 |
|----|----|----|----|----|
| WO | WO 2015/102118 A1 | | 7/2015 | |
| WO | WO 2017/183625 A1 | | 10/2017 | |
| WO | WO 2018/168991 A1 | | 9/2018 | |
| WO | WO 2018/203666 A1 | | 11/2018 | |

OTHER PUBLICATIONS

Korean Office Action dated Mar. 25, 2020 in corresponding Korean Patent Application No. 10-2019-0133617 (7 pages in Korean).
Japanese Office Action dated Sep. 29, 2020 in counterpart Japanese Patent Application No. 2019-210587 (5 pages in Japanese).

* cited by examiner

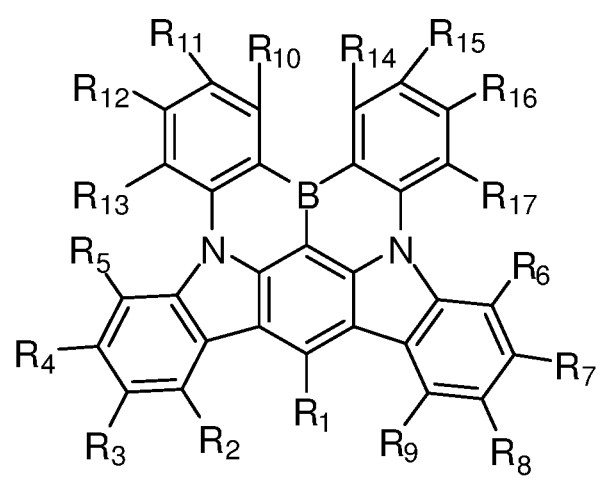

INDOLOCARBAZOLE DERIVATIVES AND ORGANIC ELECTROLUMINESCENT DEVICES USING THE SAME

CROSS-REFERENCE TO RELATED APPLICATIONS

This application claims the benefit under 35 USC § 119(a) of Korean Patent Application No. 10-2018-0144529 filed on Nov. 21, 2018 and Korean Patent Application No. 10-2019-0133617 filed on Oct. 25, 2019 in the Korean Intellectual Property Office, the entire disclosure of which is incorporated herein by reference for all purposes.

BACKGROUND OF THE INVENTION

1. Field of the Invention

The present invention relates to indolocarbazole derivatives and highly efficient and long-lasting organic electroluminescent devices with greatly improved luminous efficiency using the indolocarbazole derivatives.

2. Description of the Related Art

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized structures of organic layers for organic electroluminescent devices and stable and efficient materials for organic layers of organic electroluminescent devices.

There has been much research aimed at improving the characteristics of organic electroluminescent devices by changes in the performance of organic layer materials. In addition, a technique for improving the color purity and enhancing the luminous efficiency of a device by optimizing the optical thickness of layers between an anode and a cathode is considered as a crucial factor for improving the device performance. For example, the formation of a capping layer on an electrode achieves increased luminous efficiency and high color purity.

Thus, there is a continued need to develop structures of organic electroluminescent devices optimized to improve their luminescent properties and new materials capable of supporting the optimized structures of organic electroluminescent devices.

SUMMARY OF THE INVENTION

Therefore, the present invention intends to provide organic electroluminescent compounds that are employed in organic layers of organic electroluminescent devices, achieving high efficiency and long lifetime of the devices. The present invention also intends to provide organic electroluminescent devices including the organic electroluminescent compounds.

One aspect of the present invention provides an organic electroluminescent compound represented by Formula A:

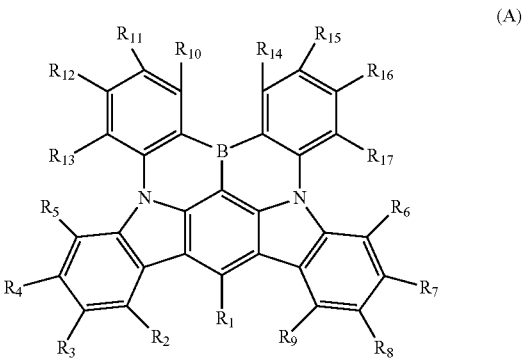

(A)

A description will be given concerning more detailed structures of the compound of Formula A, the definitions of the substituents in the compound of Formula A, and specific examples of indolocarbazole derivatives that can be represented by Formula A.

A further aspect of the present invention provides an organic electroluminescent device including a first electrode, a second electrode opposite to the first electrode, and one or more organic layers interposed between the first and second electrodes wherein at least one of the organic layers includes the indolocarbazole derivative represented by Formula A and optionally another indolocarbazole derivative represented by Formula A.

The indolocarbazole derivative of the present invention is employed in at least one of the organic layers of the organic electroluminescent device, achieving high efficiency and long lifetime of the device.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 1 shows a representative structure of an indolocarbazole derivative according to the present invention.

DETAILED DESCRIPTION OF THE INVENTION

The present invention will now be described in more detail.

The present invention is directed to an indolocarbazole derivative represented by Formula A:

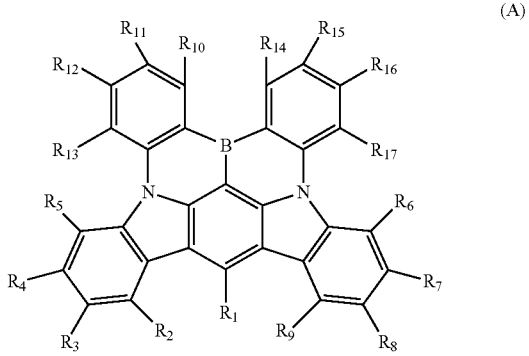

(A)

wherein $R_1$ to $R_{17}$ are each independently selected from the group consisting of hydrogen, deuterium, substituted or unsubstituted $C_1$-$C_{20}$ alkyl, substituted or unsubstituted $C_2$-$C_{20}$ alkenyl, substituted or unsubstituted $C_3$-$C_{20}$ cycloalkyl, substituted or unsubstituted $C_5$-$C_{20}$ cycloalkenyl, substituted or unsubstituted $C_1$-$C_{20}$ alkoxy, substituted or unsubstituted $C_6$-$C_{30}$ aryloxy, substituted or unsubstituted $C_1$-$C_{20}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_6$-$C_{50}$ aryl, substituted or unsubstituted $C_3$-$C_{50}$ heteroaryl, substituted or unsubstituted silyl, substituted or unsubstituted germanium, substituted or unsubstituted boron, substituted or unsubstituted aluminum, carbonyl, phosphoryl, amino, nitrile, hydroxyl, nitro, halogen, selenium, tellurium, amide, and ester, with the proviso that each of $R_1$ to $R_{17}$ and substituents thereof optionally forms a fused aliphatic, aromatic, heteroaliphatic or heteroaromatic ring with an adjacent substituent.

The indolocarbazole derivative of Formula A can be employed in an organic electroluminescent device, achieving high efficiency and long lifetime of the device.

As used herein, the term "substituted" in the definition of $R_1$ to $R_{17}$ indicates substitution with one or more substituents selected from the group consisting of hydrogen, deuterium, cyano, halogen, hydroxyl, nitro, alkyl, alkoxy, alkylamino, arylamino, heteroarylamino, alkylsilyl, arylsilyl, aryloxy, aryl, heteroaryl, germanium, phosphorus, and boron, or a combination thereof. The term "unsubstituted" in the same definition indicates having no substituent.

In the "substituted or unsubstituted $C_1$-$C_{10}$ alkyl", "substituted or unsubstituted $C_6$-$C_{30}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted aliphatic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

In the present invention, the alkyl groups may be straight or branched. The number of carbon atoms in the alkyl groups is not particularly limited but is preferably from 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and terphenyl groups. Examples of the polycyclic aryl groups include naphthyl, anthracenyl, phenanthrenyl, pyrenyl, perylenyl, tetracenyl, chrysenyl, fluorenyl, acenaphthcenyl, triphenylene, and fluoranthrene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The alkoxy group may be specifically a methoxy, ethoxy, propoxy, isobutyloxy, sec-butyloxy, pentyloxy, iso-amyloxy or hexyloxy group, but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —NH$_2$, alkylamine groups, and arylamine groups. The arylamine groups are aryl-substituted amine groups and the alkylamine groups are alkyl-substituted amine groups. Examples of the arylamine groups include substituted or unsubstituted monoarylamine groups, substituted or unsubstituted diarylamine groups, and substituted or unsubstituted triarylamine groups. The aryl groups in the arylamine groups may be monocyclic or polycyclic ones. The arylamine groups may include two or more aryl groups. In this case, the aryl groups may be monocyclic aryl groups or polycyclic aryl groups. Alternatively, the aryl groups may consist of a monocyclic aryl group and a polycyclic aryl group. The aryl groups in the arylamine groups may be selected from those exemplified above.

The aryl groups in the aryloxy group and the arylthioxy group are the same as those described above. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

More specifically, the indolocarbazole derivative represented by Formula A may be selected from the following compounds:

1

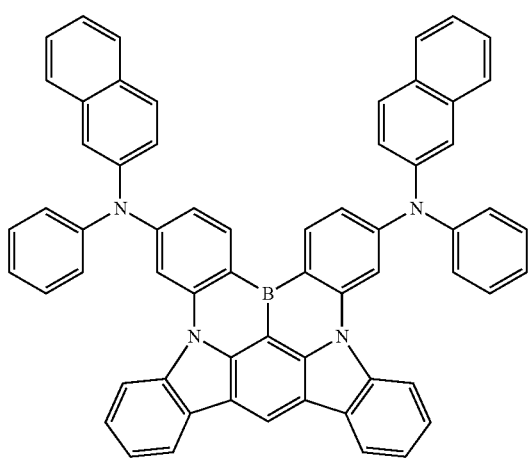

2

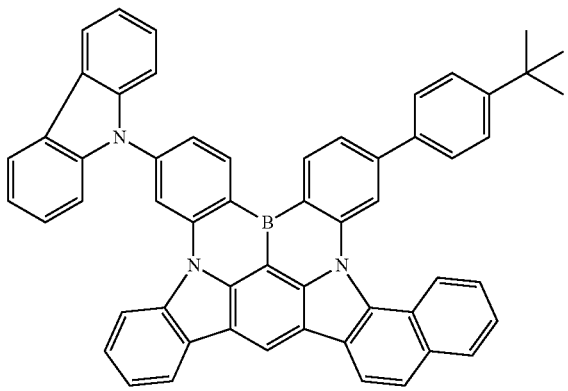

3

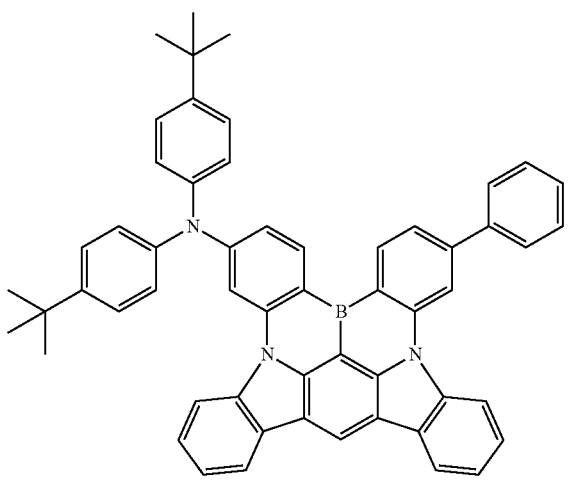

4

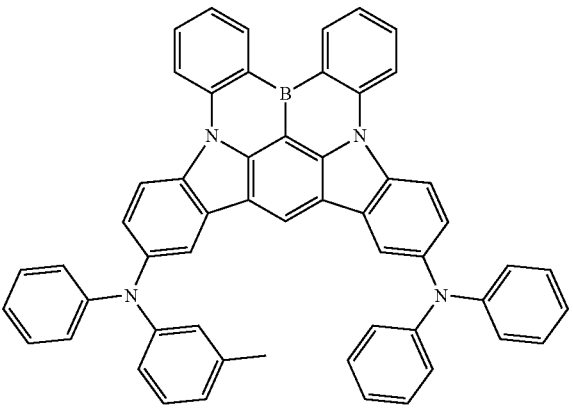

5
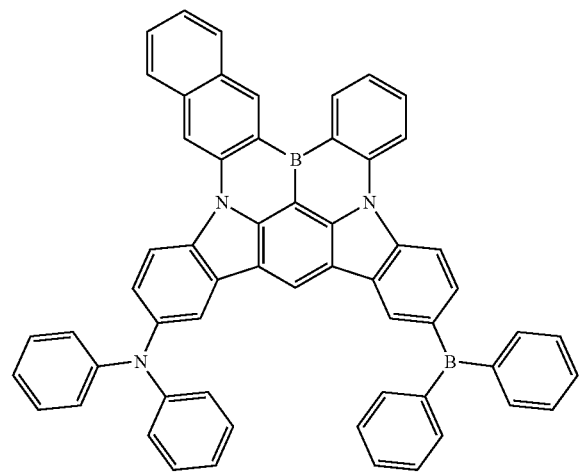
6
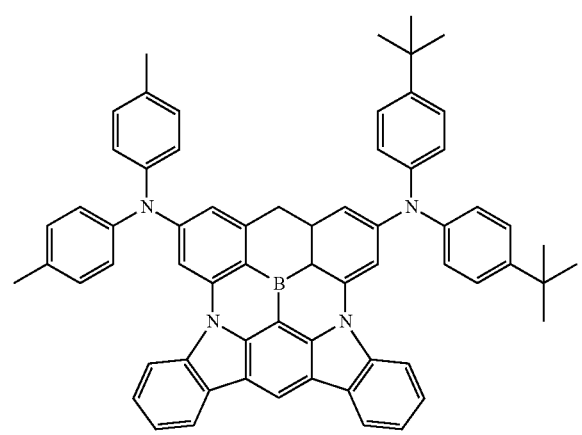
7
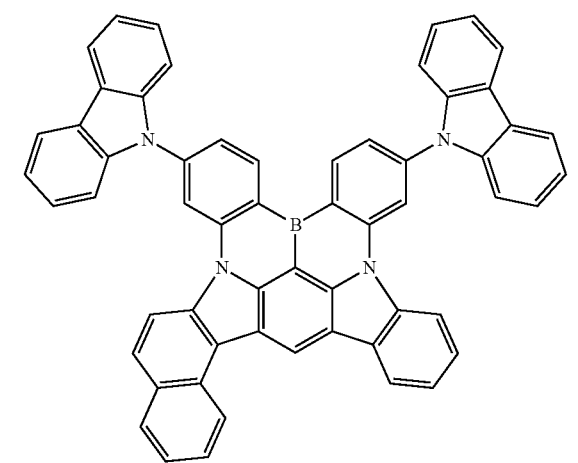
8
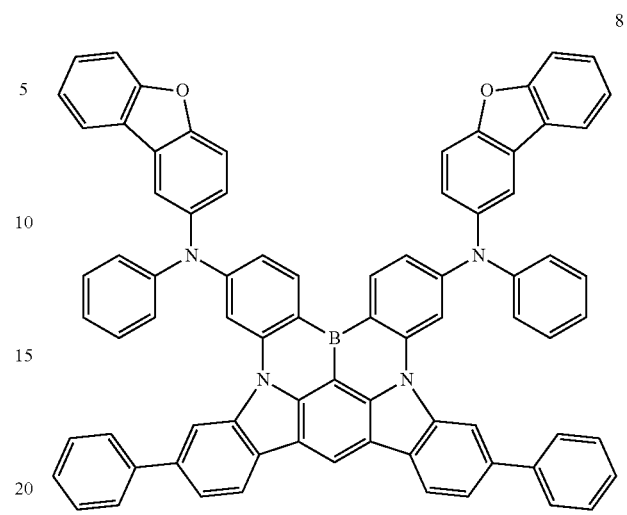
9
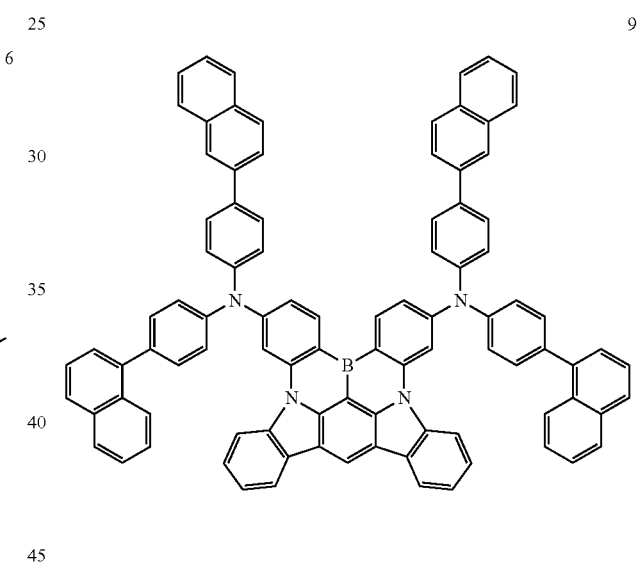
10
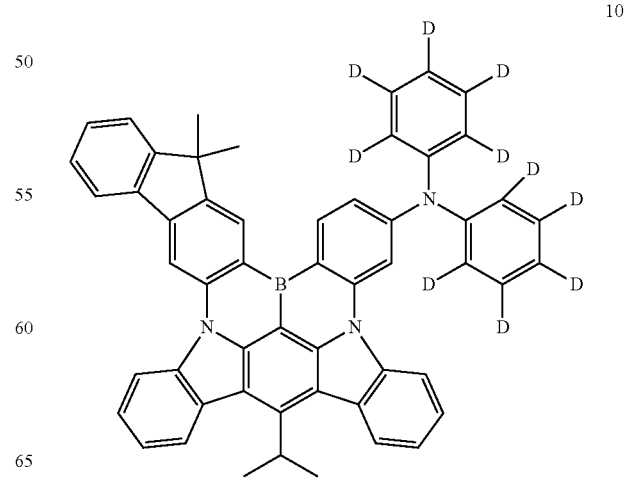

11
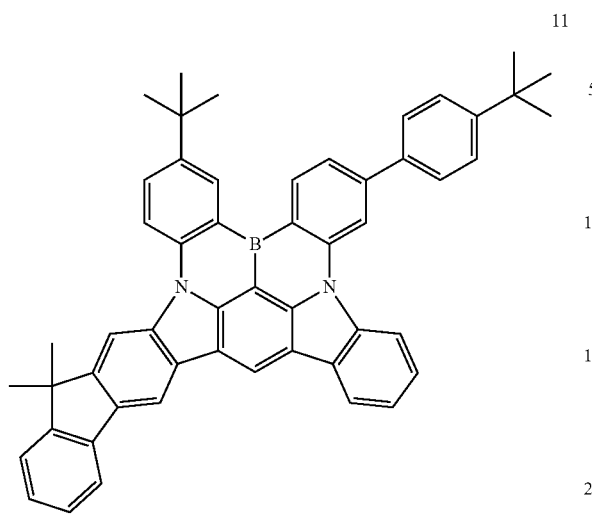
12
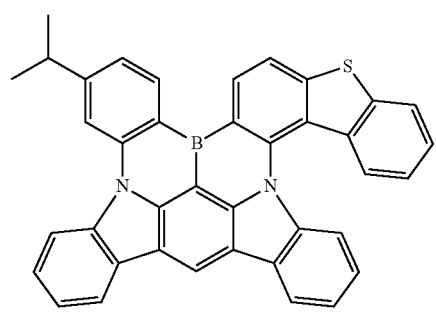
13
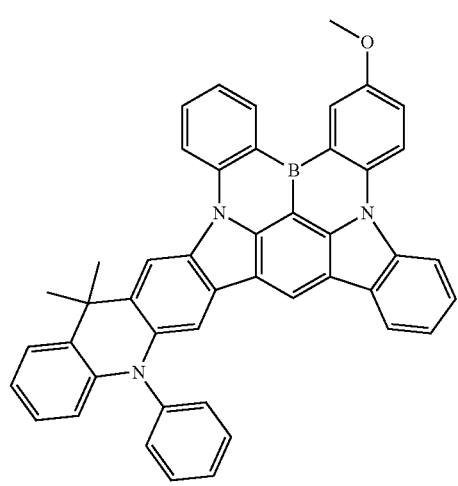
14
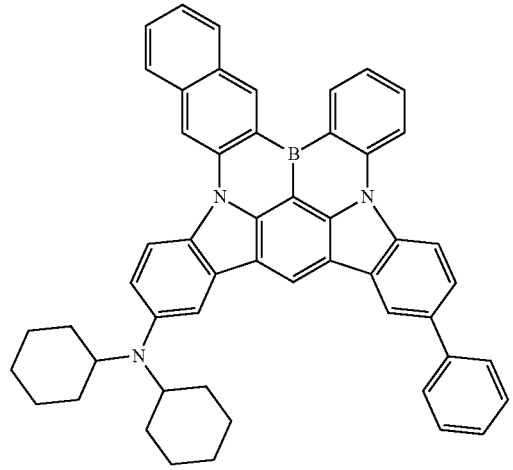
15
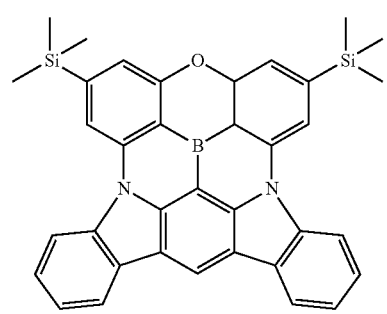
16
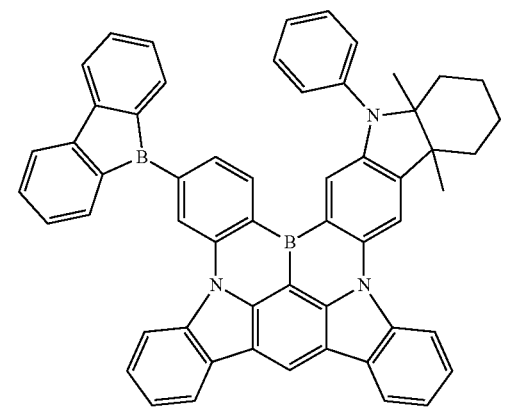
17
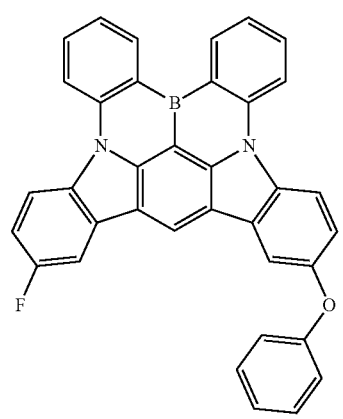

18
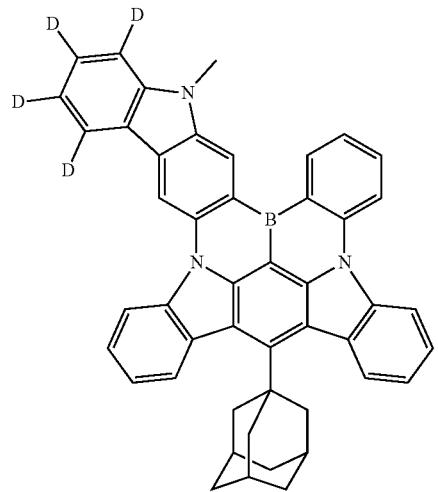
19
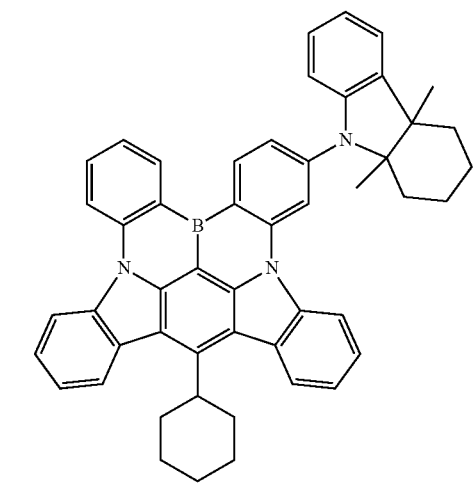
20
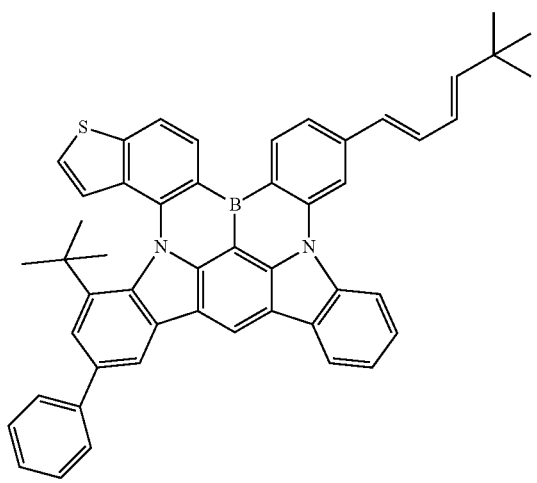
21
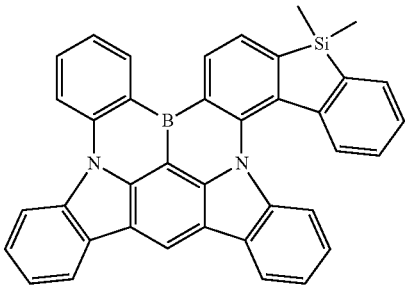
22
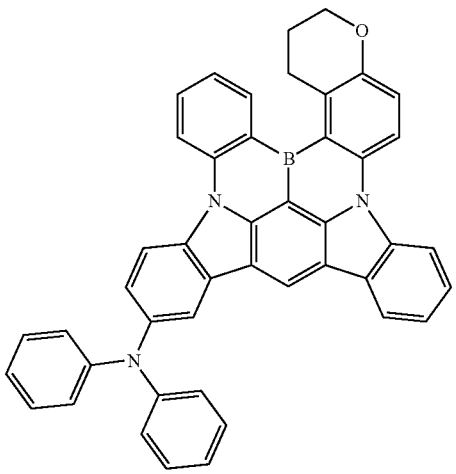
23
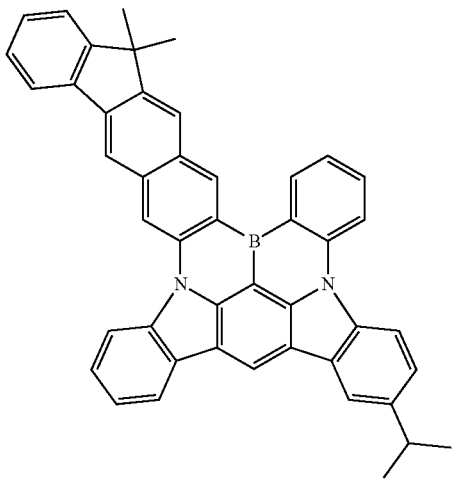
24
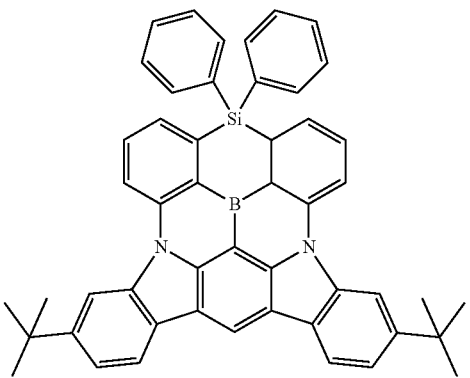

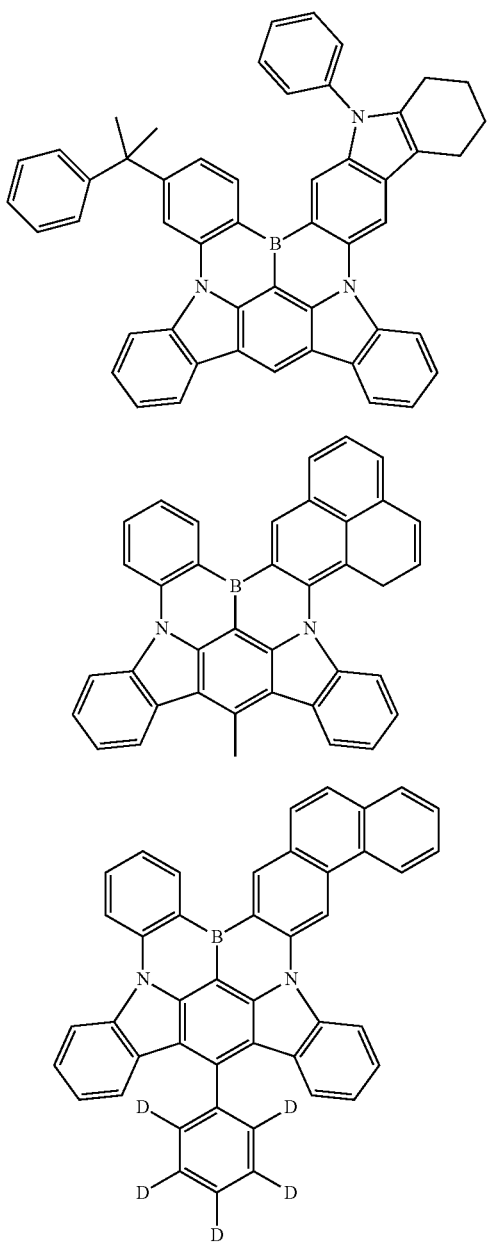

The specific examples of the substituents defined above can be found in the compounds of Formulae 1 to 27 but are not intended to limit the scope of the compound represented by Formula A.

The introduction of various substituents, including a boron atom, on the indolocarbazole moiety to form polycyclic heteroaromatic structures allows the organic light emitting materials to have inherent characteristics of the substituents. For example, the introduced substituents may be those that are typically used in materials for hole injecting layers, hole transport layers, light emitting layers, electron transport layers, electron injecting layers, electron blocking layers, and hole blocking layers of organic electroluminescent devices. This introduction meets the requirements of the organic layers and enables the fabrication of high efficiency organic electroluminescent devices. The compound of the present invention may be used alone or in combination with other compounds to form various organic layers. The compound of the present invention may also be used as a material for a capping layer (CPL).

A further aspect of the present invention is directed to an organic electroluminescent device including a first electrode, a second electrode, and one or more organic layers interposed between the first and second electrodes wherein at least one of the organic layers includes the organic electroluminescent compound represented by Formula A and optionally another organic electroluminescent compound represented by Formula A.

That is, according to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that the organic electroluminescent compound of Formula A is used to form the corresponding organic layer.

The organic layers of the organic electroluminescent device according to the present invention may form a monolayer structure. Alternatively, the organic layers may have a multilayer laminate structure. For example, the structure of the organic layers may include a hole injecting layer, a hole transport layer, a hole blocking layer, a light emitting layer, an electron blocking layer, an electron transport layer, and an electron injecting layer, but is not limited thereto. The number of the organic layers is not limited and may be increased or decreased. Preferred structures of the organic layers of the organic electroluminescent device according to the present invention will be explained in more detail in the Examples section that follows.

According to one embodiment of the present invention, the organic electroluminescent device may include a substrate, a first electrode (anode), one or more organic layers, a second electrode (cathode), and a capping layer formed under the first electrode (bottom emission type) or on the second electrode (top emission type).

When the organic electroluminescent device is of a top emission type, light from the light emitting layer is emitted to the cathode and passes through the capping layer (CPL) formed using the compound of the present invention having a relatively high refractive index. The wavelength of the light is amplified in the capping layer, resulting in an increase in luminous efficiency. Also when the organic electroluminescent device is of a bottom emission type, the compound of the present invention can be employed in the capping layer to improve the luminous efficiency of the organic electroluminescent device based on the same principle.

A more detailed description will be given concerning exemplary embodiments of the organic electroluminescent device according to the present invention.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers such as a capping layer that have various functions depending on the desired characteristics of the device.

The light emitting layer of the organic electroluminescent device according to the present invention includes, as a host compound, an anthracene derivative represented by Formula C:

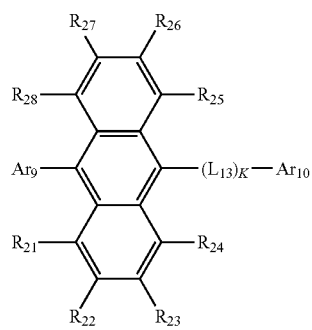

(C)

wherein $R_{21}$ to $R_{28}$ are identical to or different from each other and are as defined for $R_1$ to $R_{17}$ in Formula A, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_{20}$ arylene, and k is an integer from 1 to 3, provided that when k is 2 or more, the linkers $L_{13}$ are identical to or different from each other.

Arg in Formula C is represented by Formula C-1:

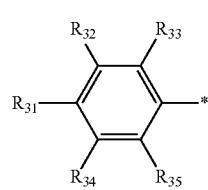

(C-1)

wherein $R_{31}$ to $R_{35}$ are identical to or different from each other and are as defined for $R_1$ to $R_{17}$ in Formula A, and each of $R_{31}$ to $R_{35}$ is optionally bonded to an adjacent substituent to form a saturated or unsaturated ring.

The compound of Formula C employed in the organic electroluminescent device of the present invention may be specifically selected from the compounds of Formulae C1 to C48:

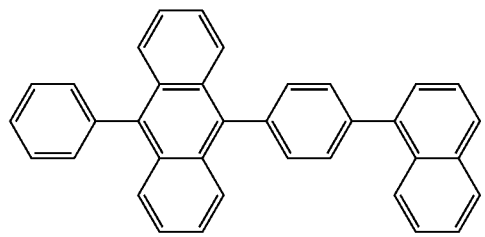

C1

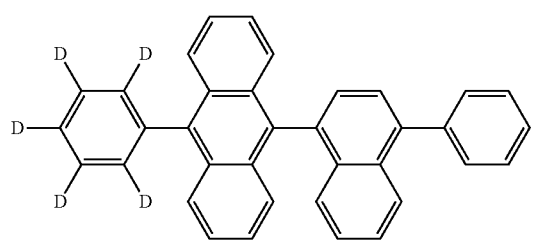

C2

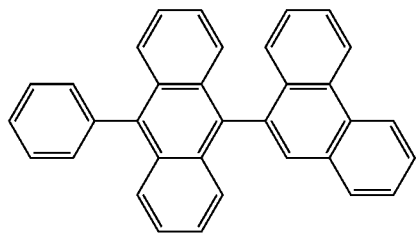

C3

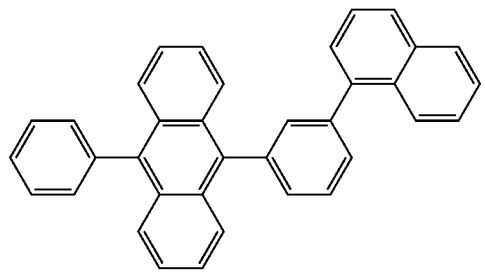

C4

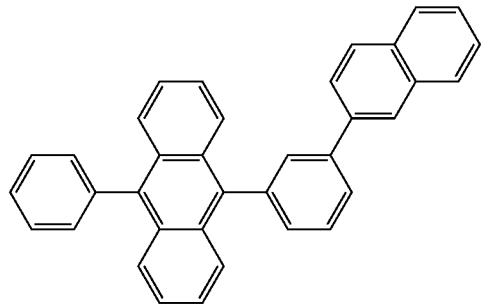

C5

C6
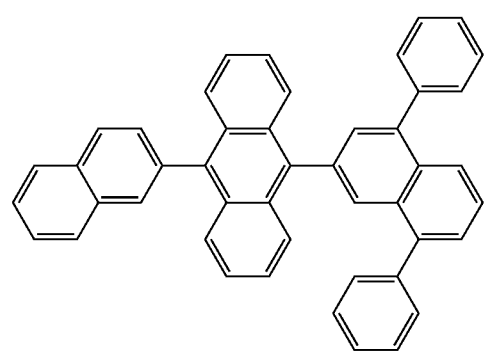
C7
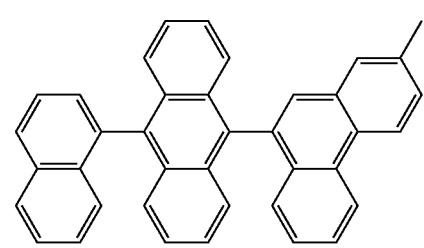
C8
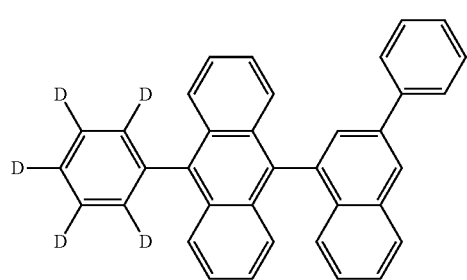
C9
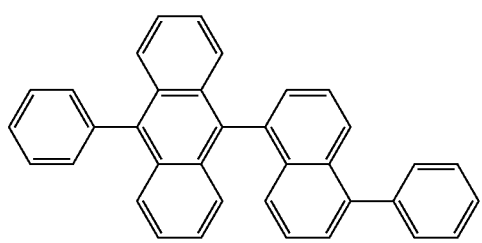
C10
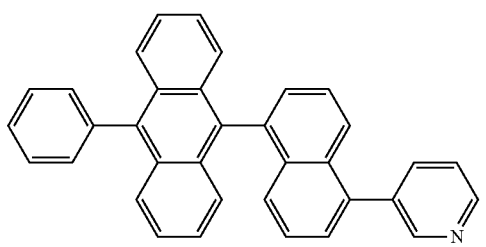
C11
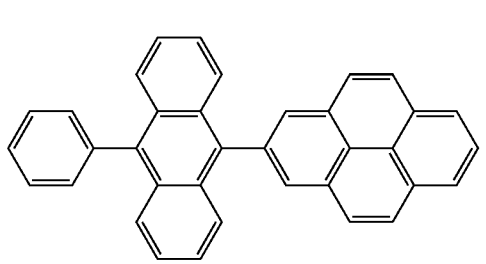
C12
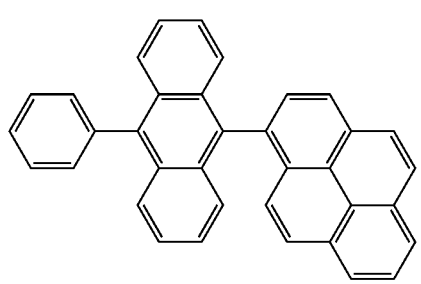
C13
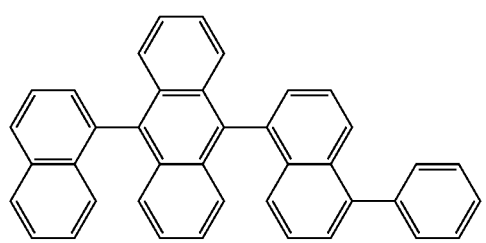
C14
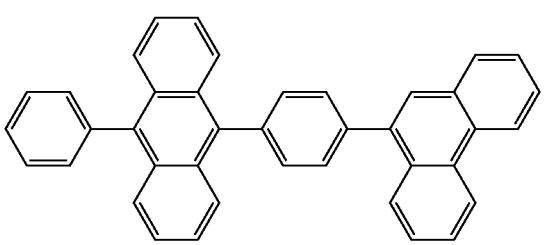
C15
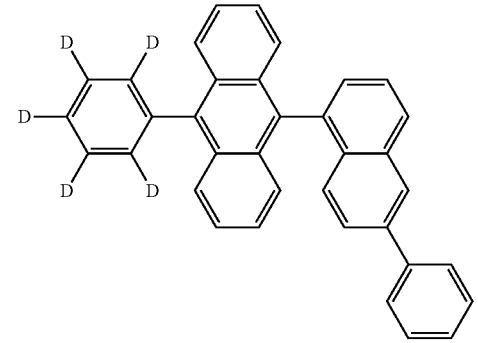
C16
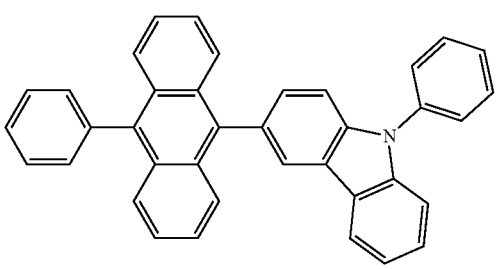

C17
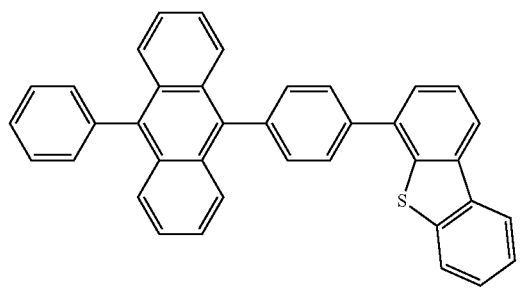
C18
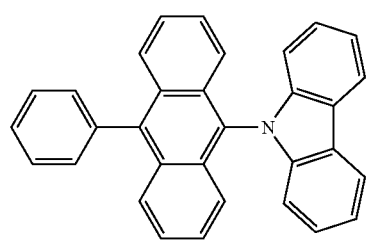
C19
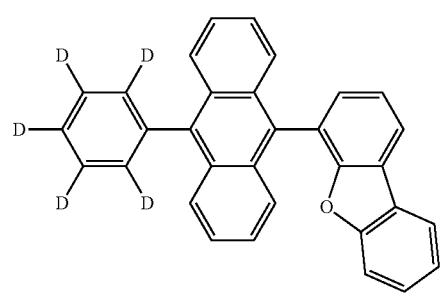
C20
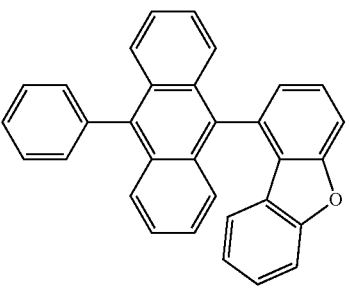
C21
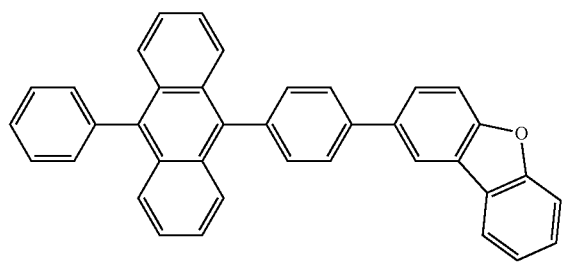
C22
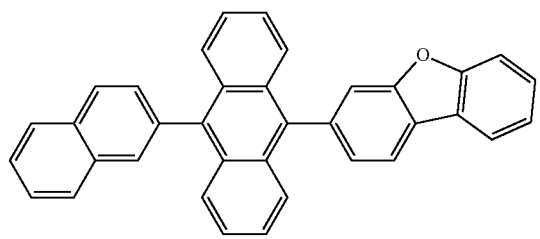
C23
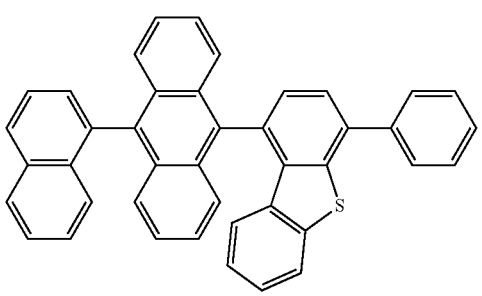
C24
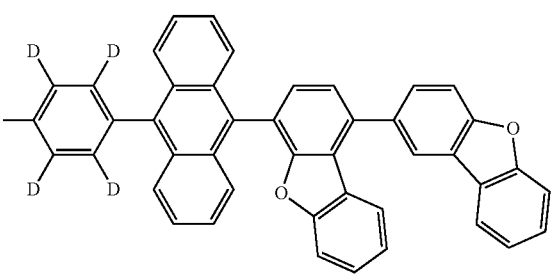
C25
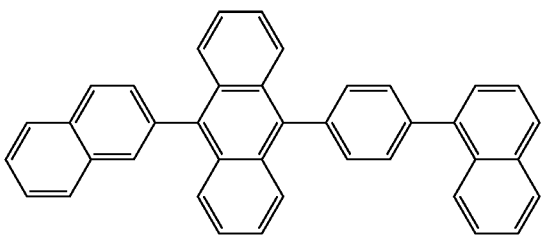
C26
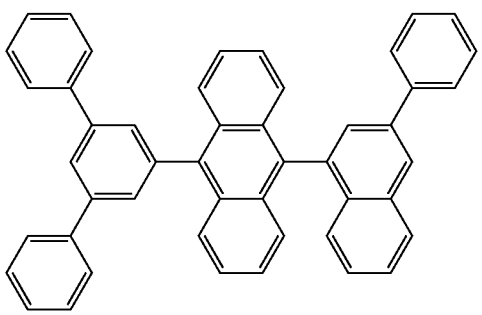

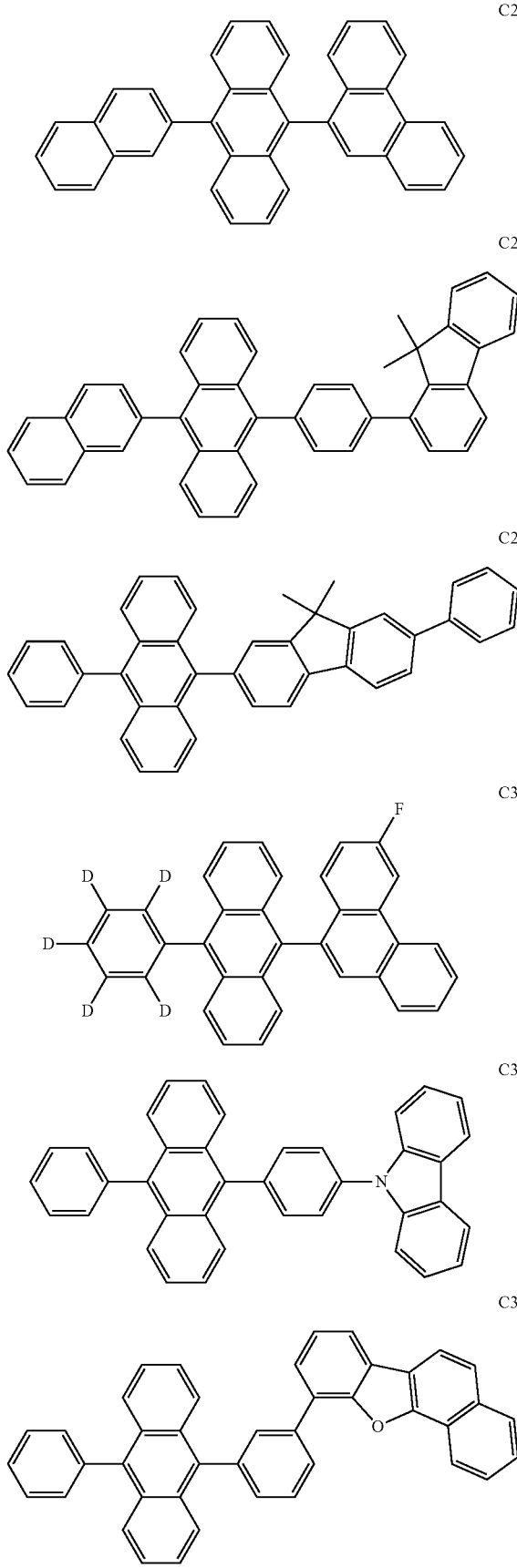

-continued
C38
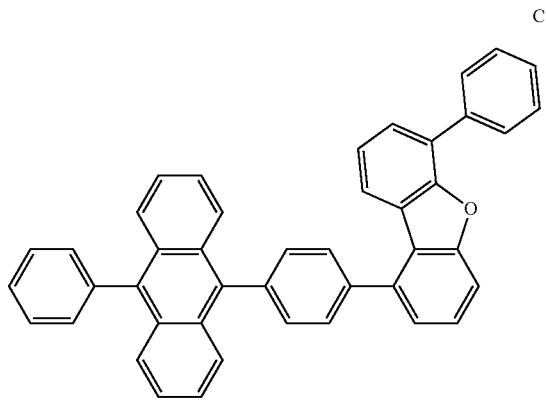
C42
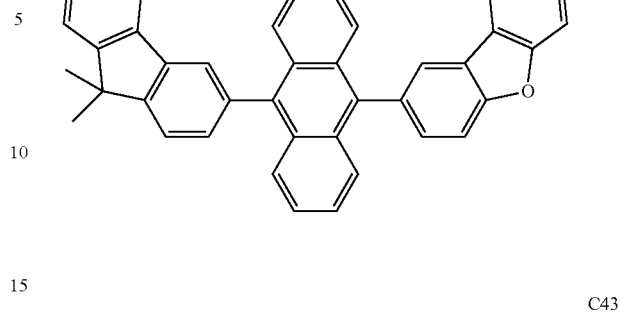
C39
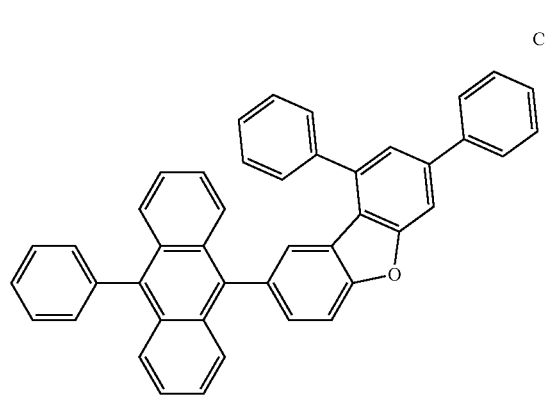
C43
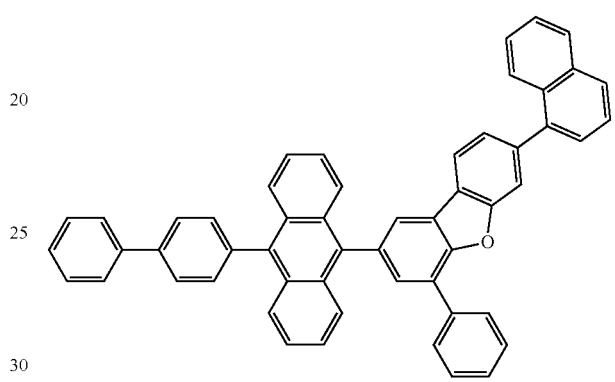
C40
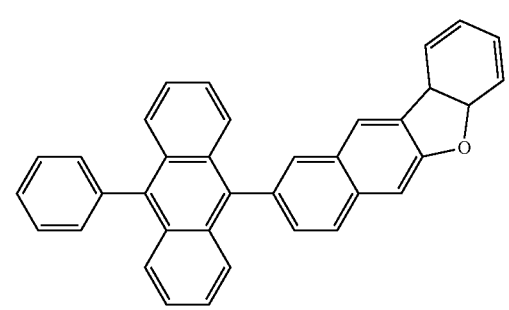
C44
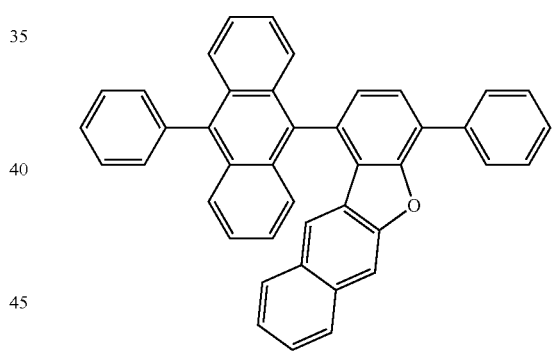
C41
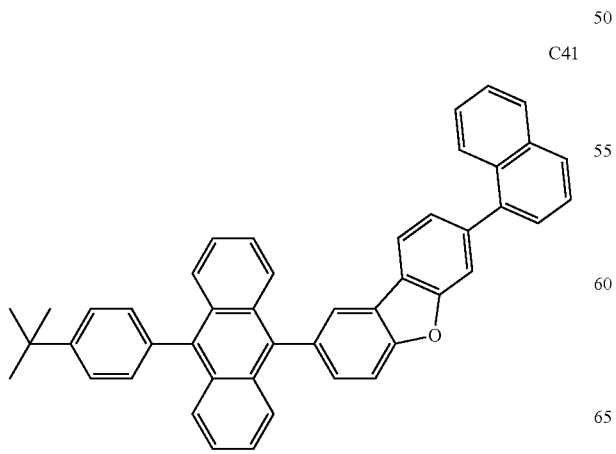
C45
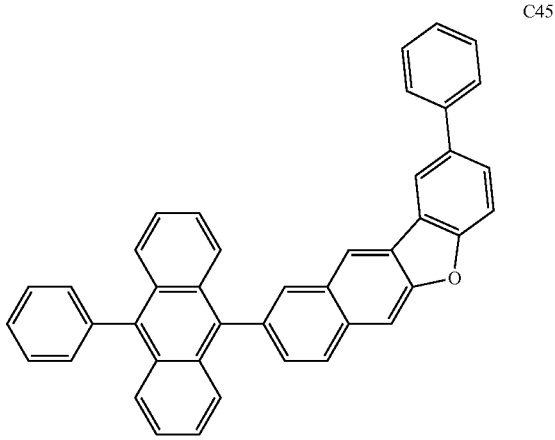

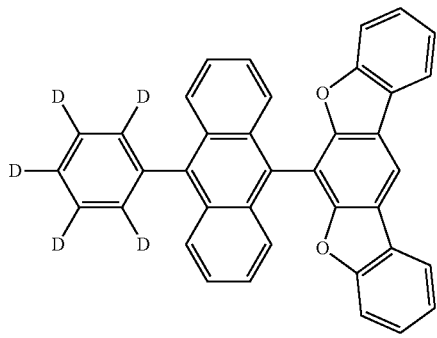

C46

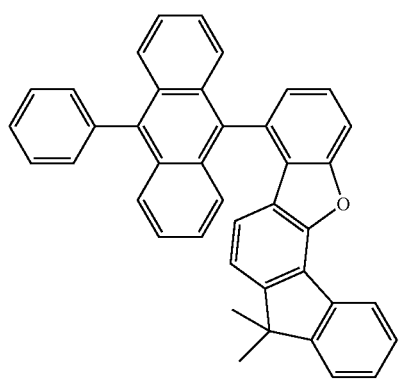

C47

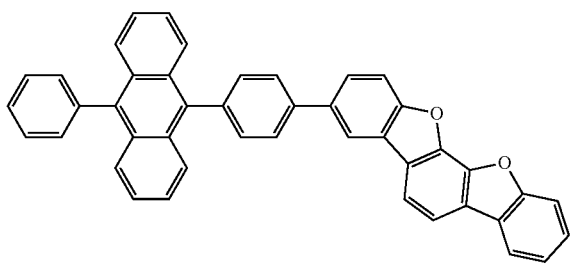

C48

The organic electroluminescent device of the present invention may further include one or more organic layers, for example, a hole transport layer and an electron blocking layer, each of which may include a compound represented by Formula D:

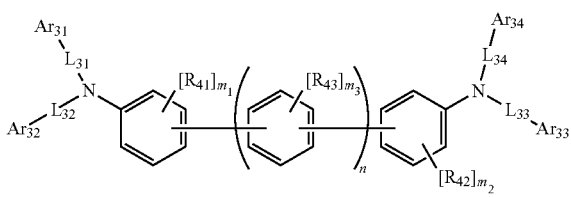

(D)

wherein $R_{41}$ to $R_{43}$ are identical to or different from each other and are each independently selected from hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_3$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

In Formula D, at least one of $Ar_{31}$ to $Ar_{34}$ is represented by Formula E:

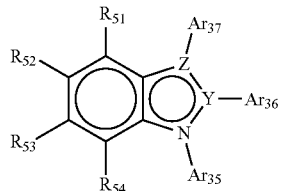

(E)

wherein $R_{51}$ to $R_{54}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, and $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula D.

The compound of Formula D employed in the organic electroluminescent device of the present invention may be specifically selected from the compounds of Formulae D1 to D79:

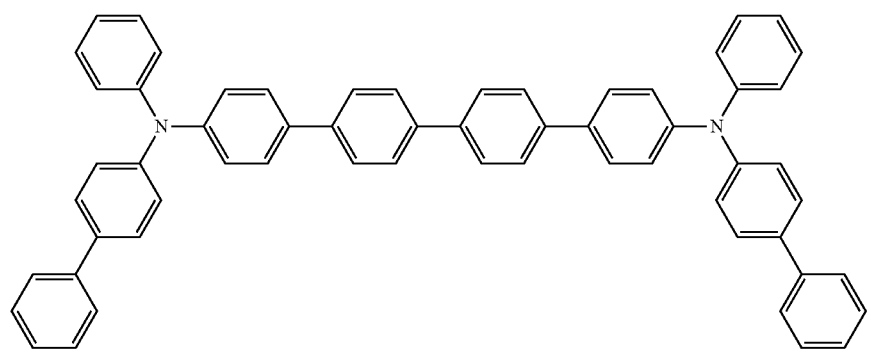
D1
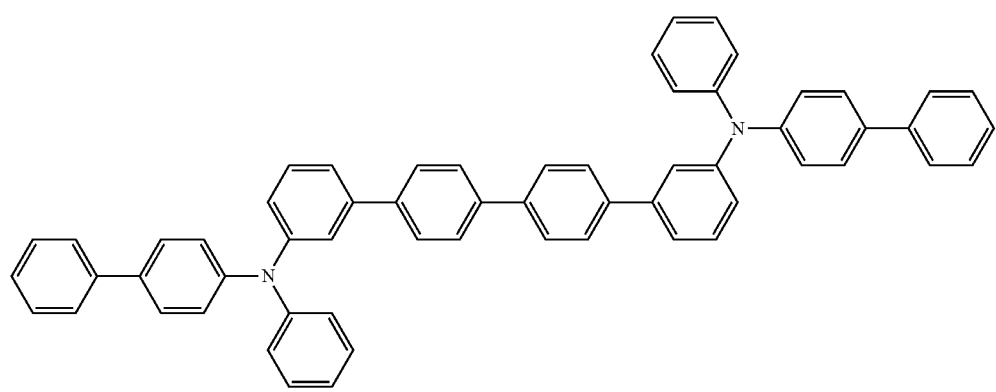
D2
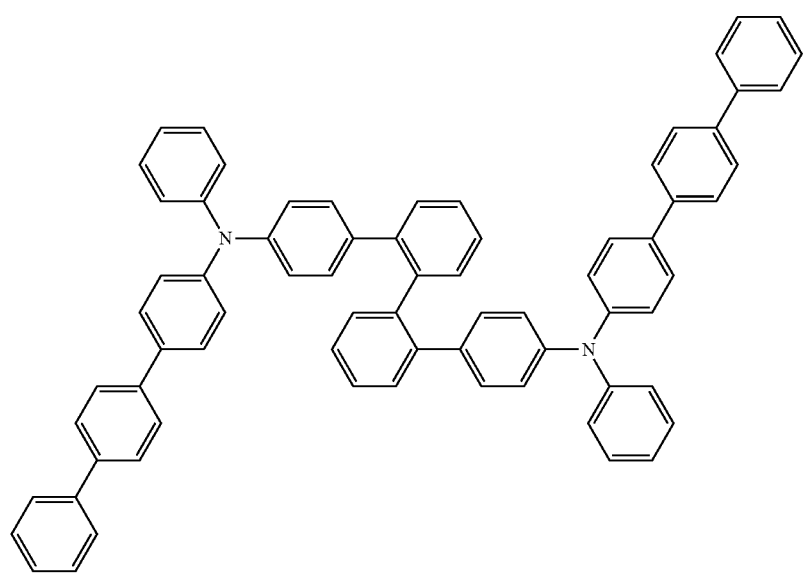
D3
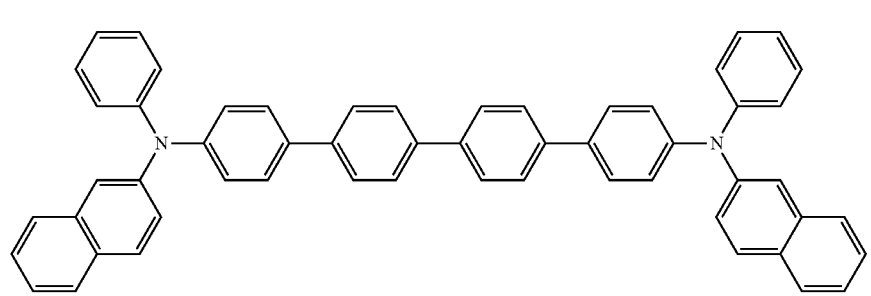
D4

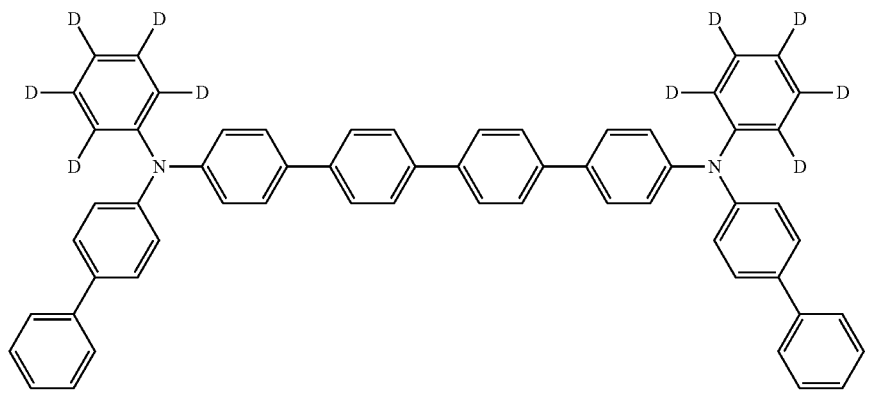
D5
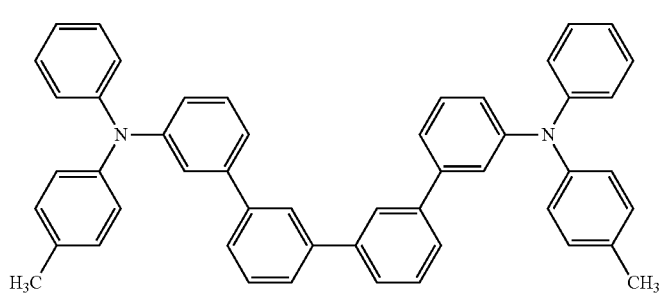
D6
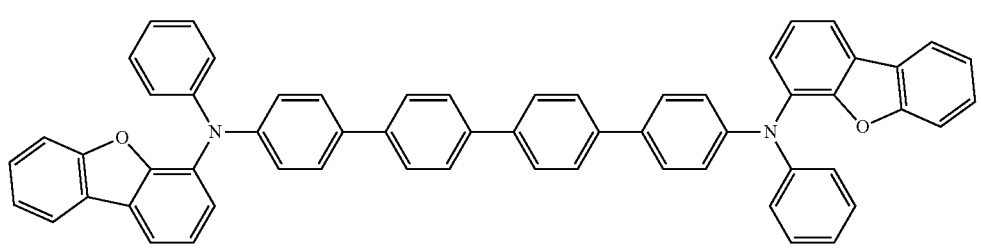
D7
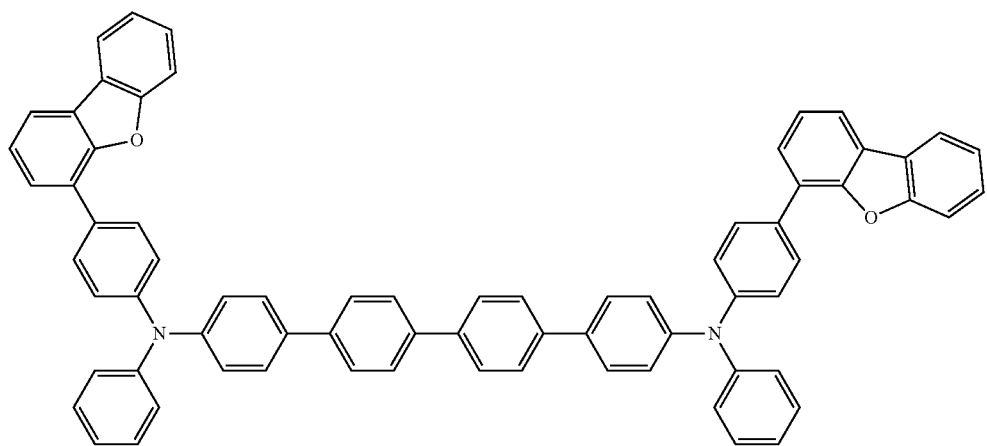
D8

-continued
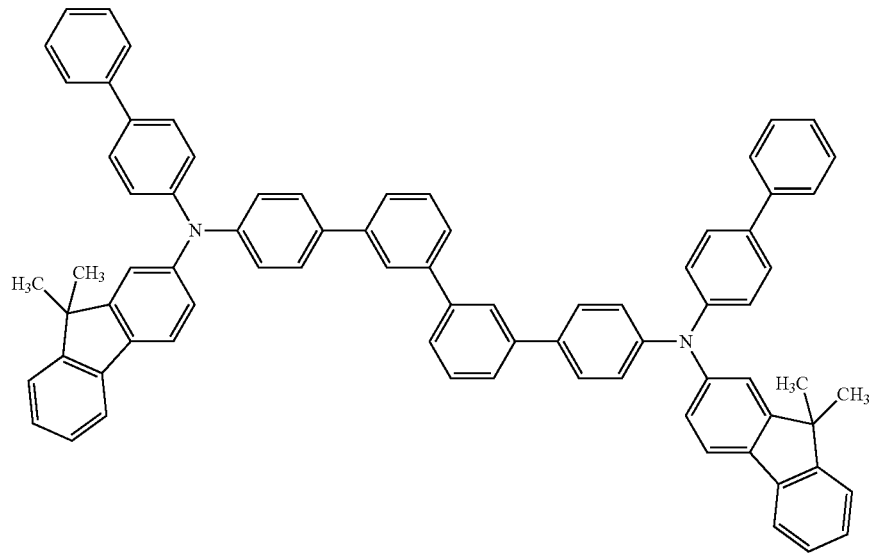
D9
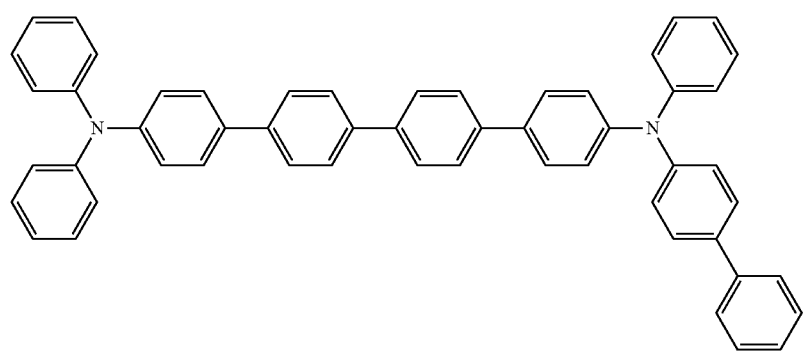
D10
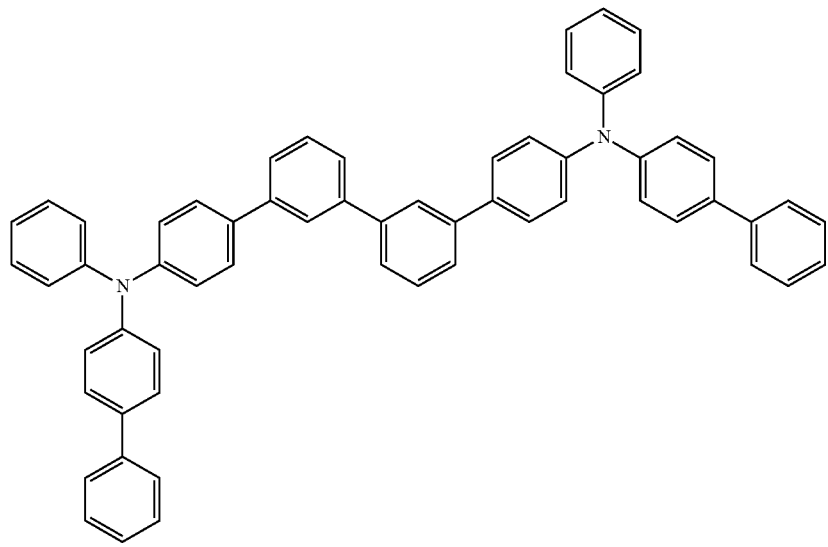
D11

-continued
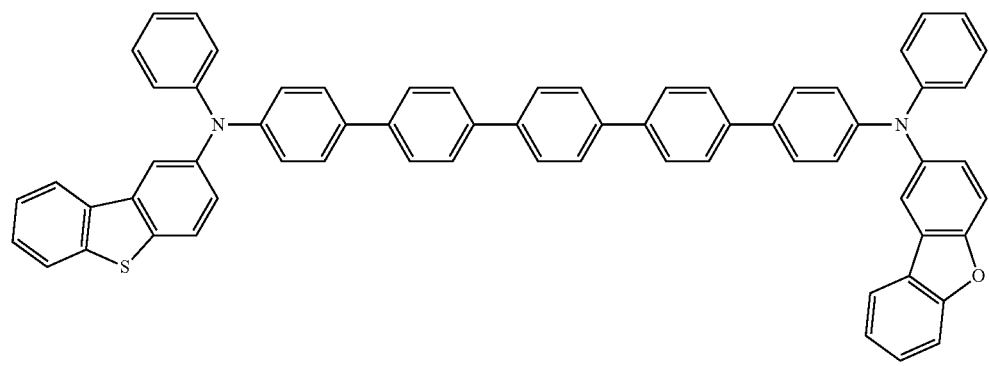
D12
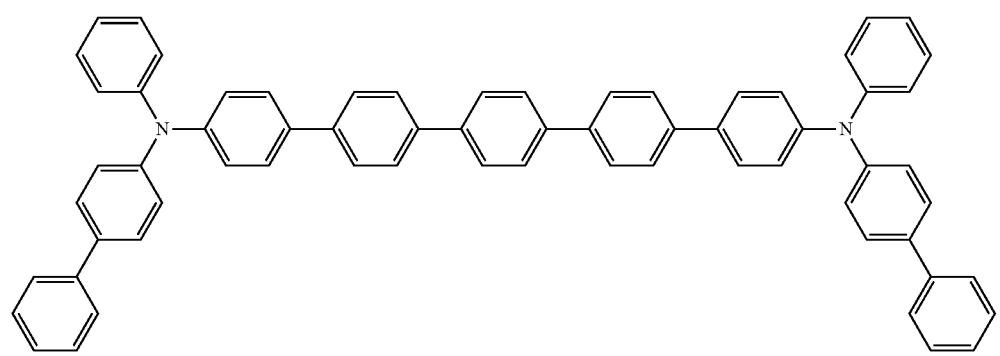
D13
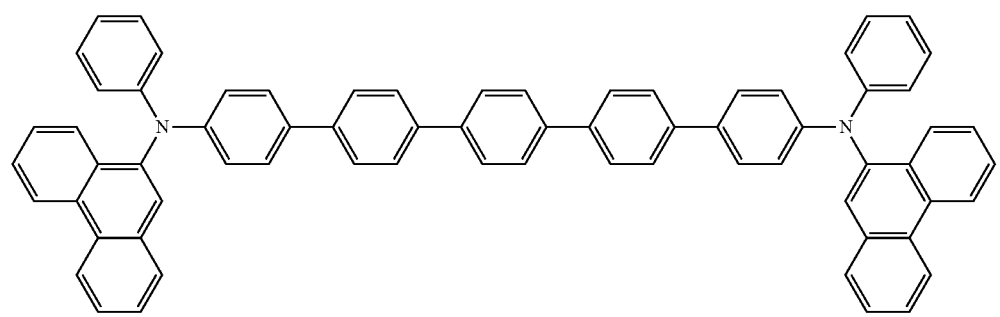
D14
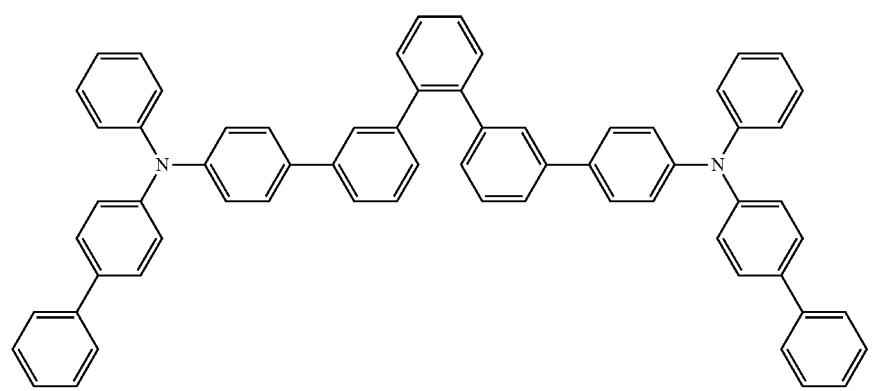
D15

-continued
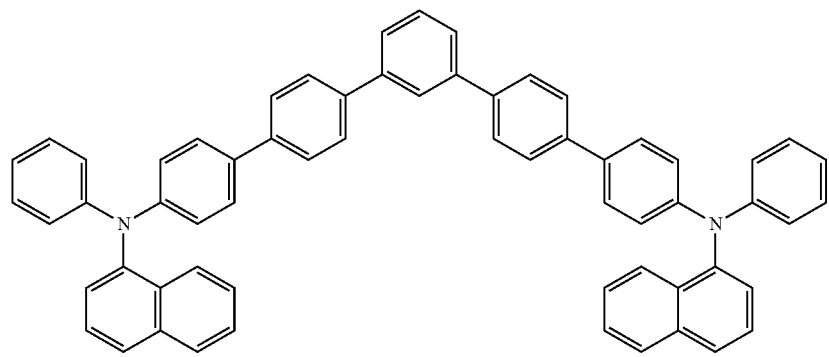
D16
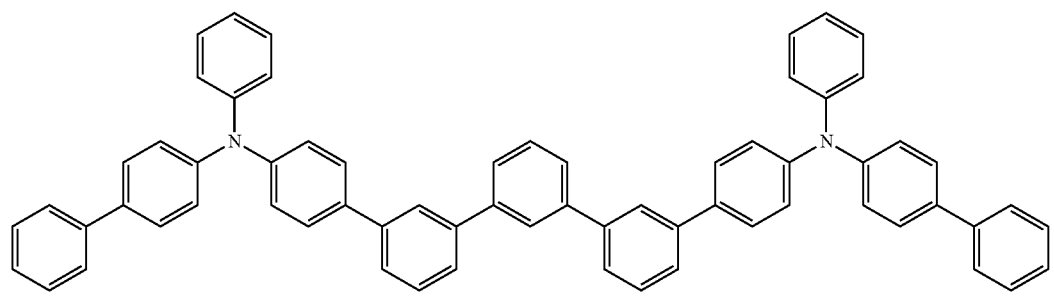
D17
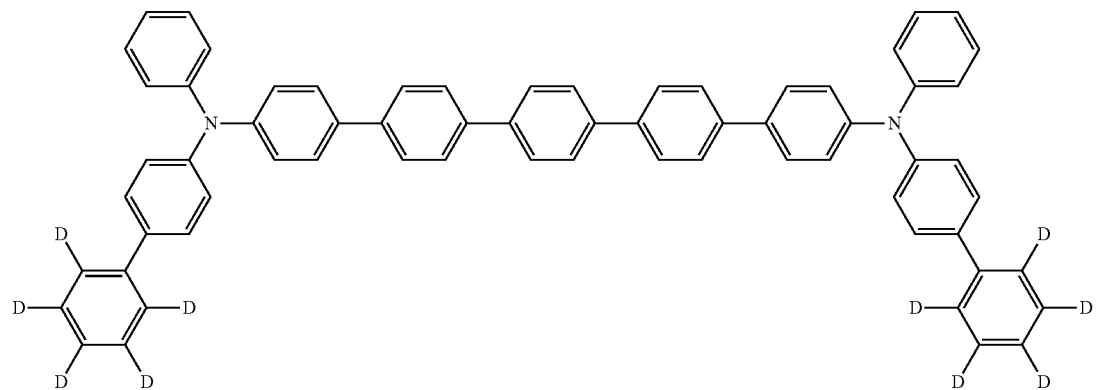
D18
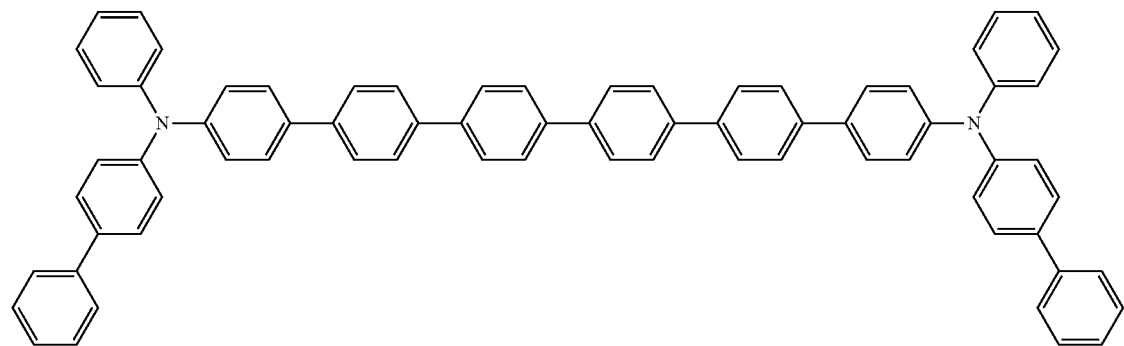
D19

-continued
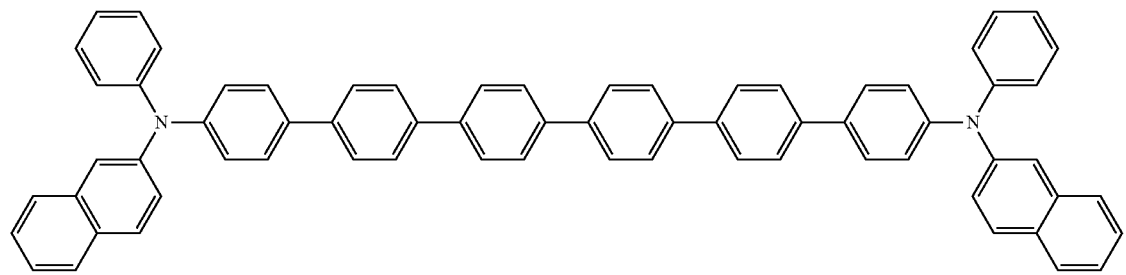
D20
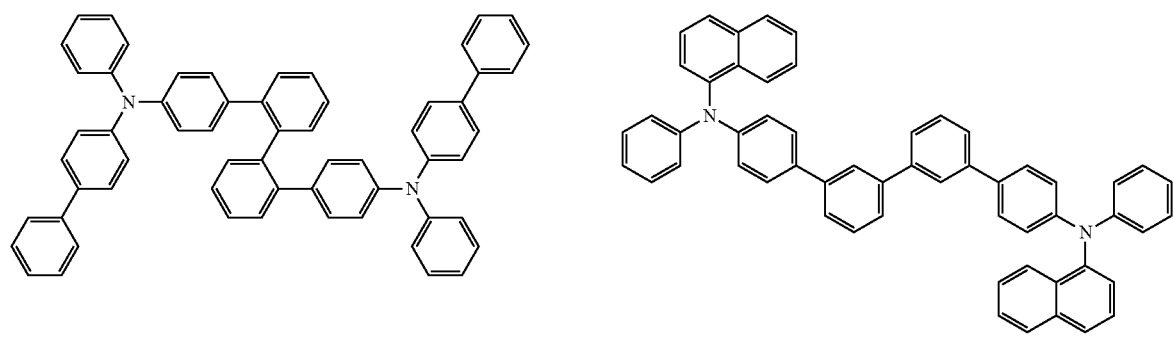
D21 D22
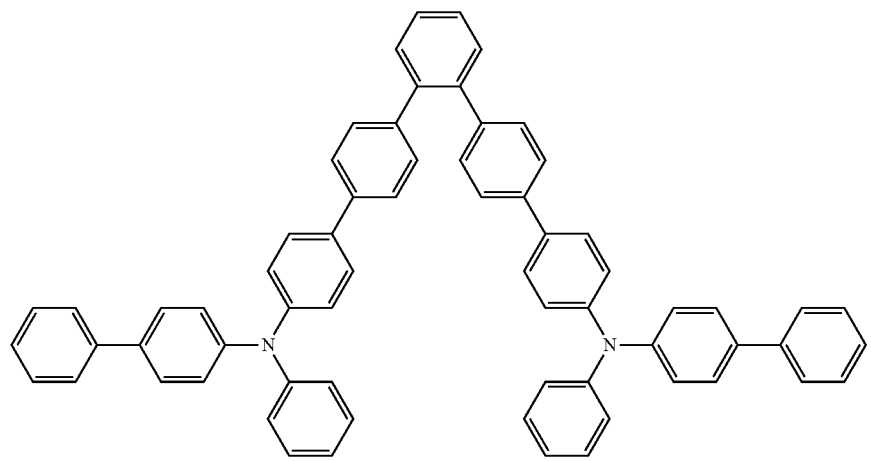
D23
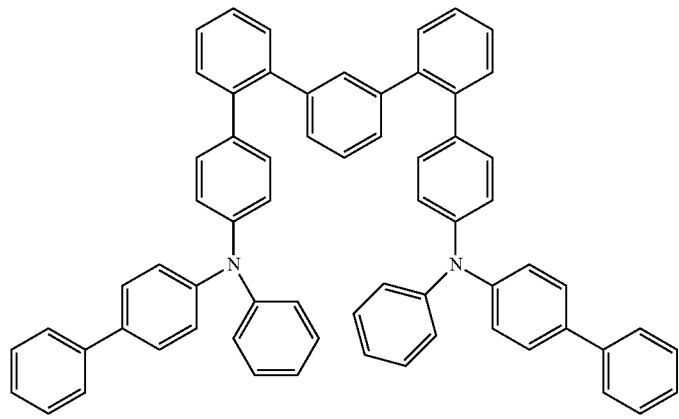
D24

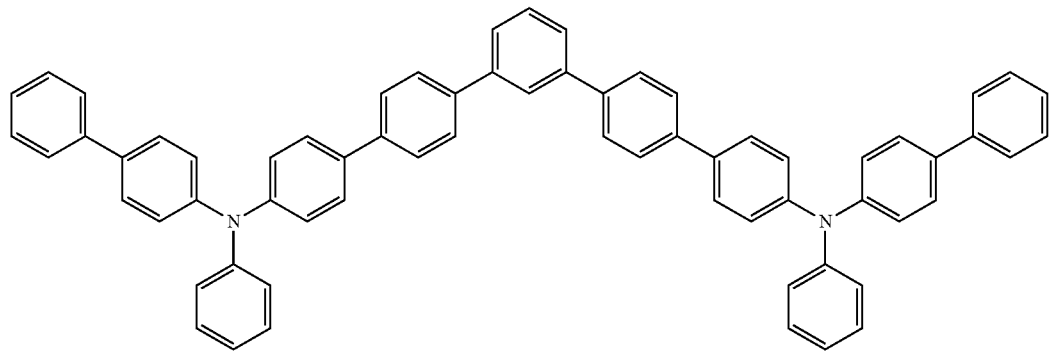
D25
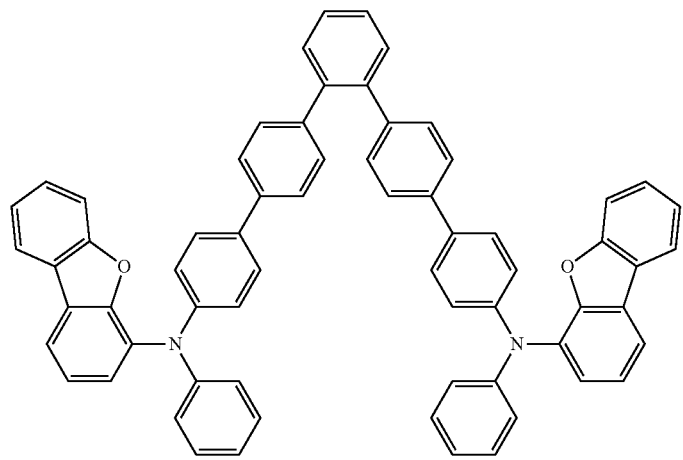
D26
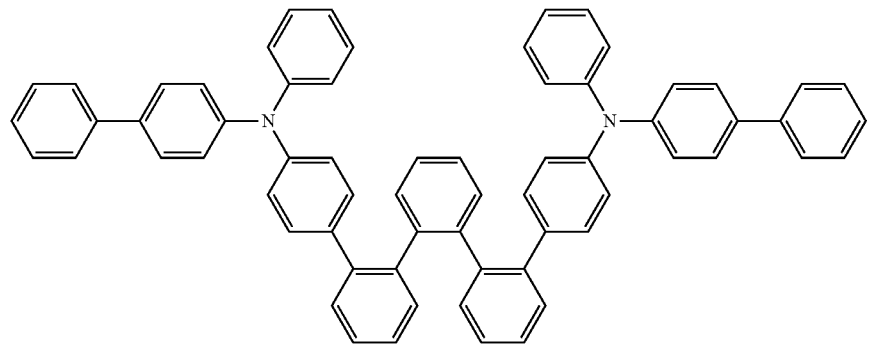
D27
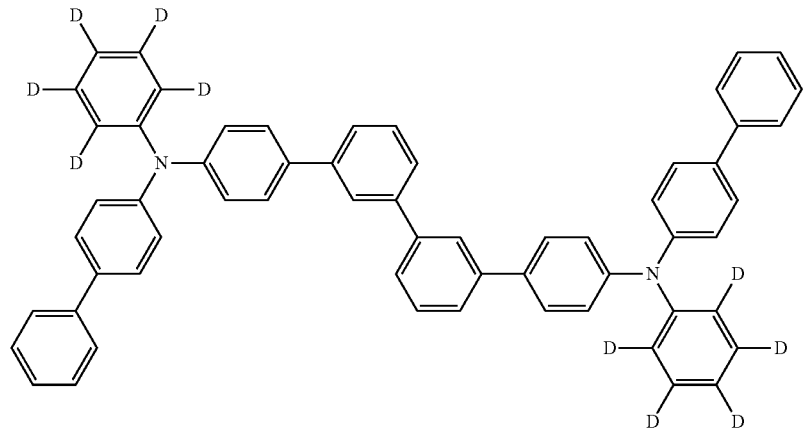
D28

-continued
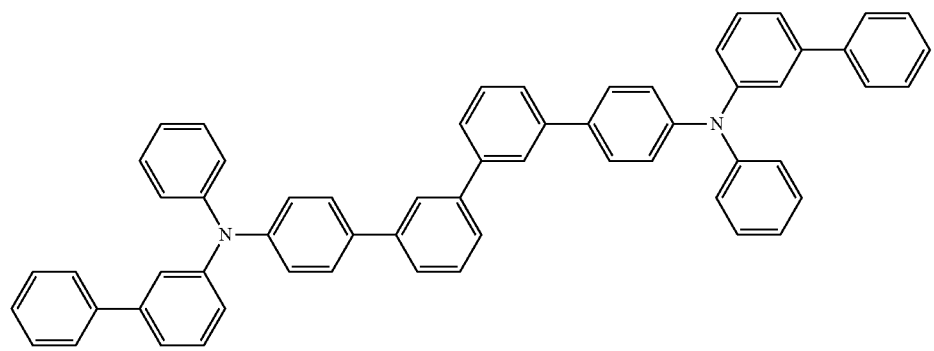
D29
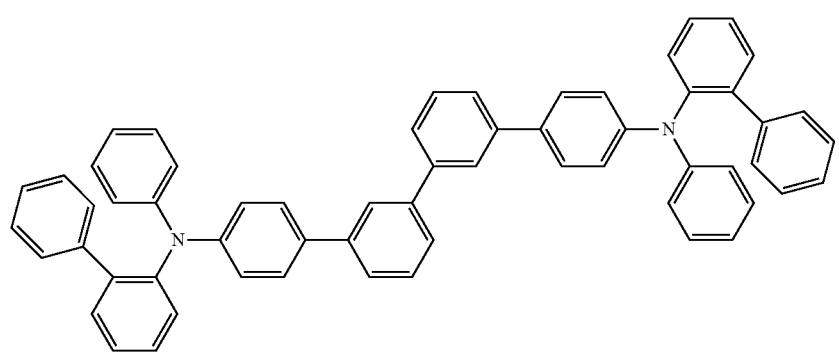
D30
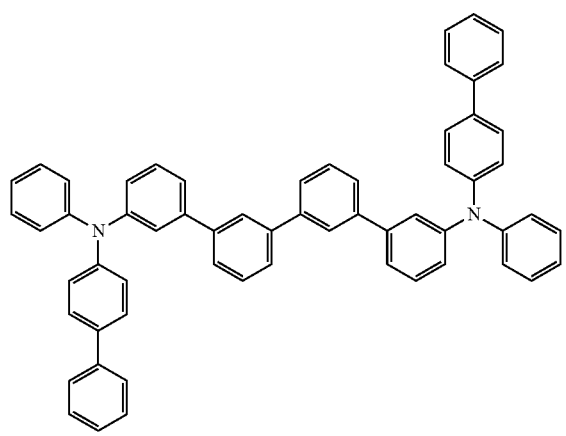
D31
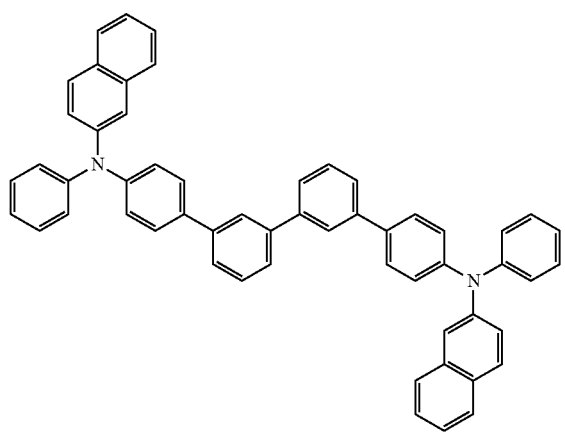
D32
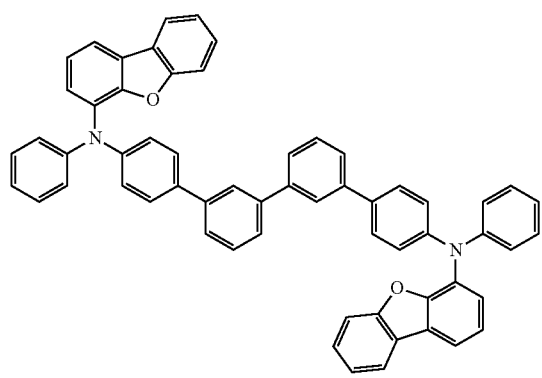
D33
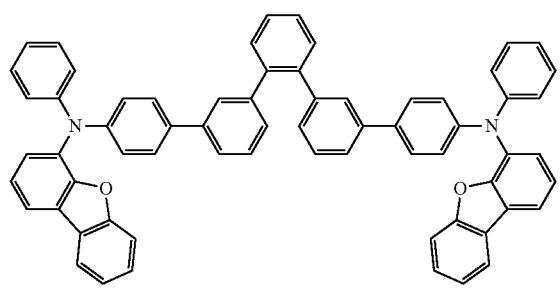
D34

-continued
D35
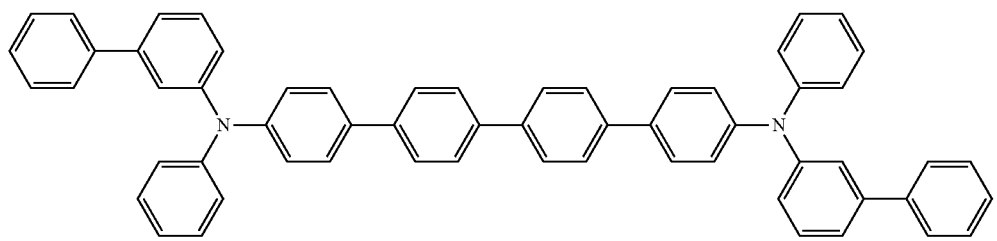
D36
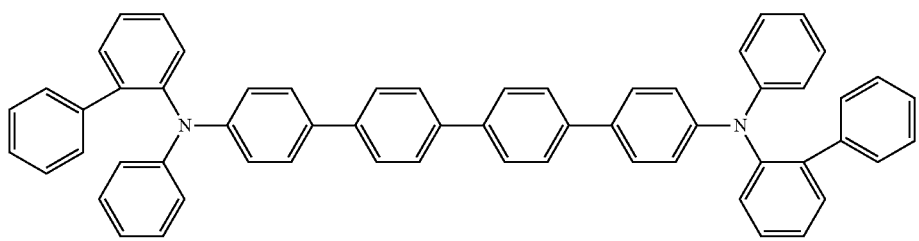
D37
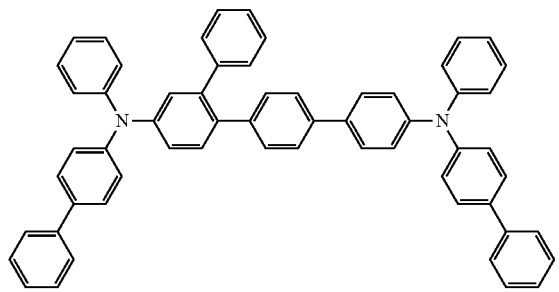
D38
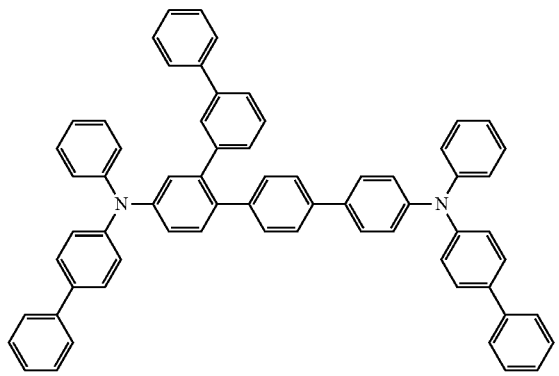
D39
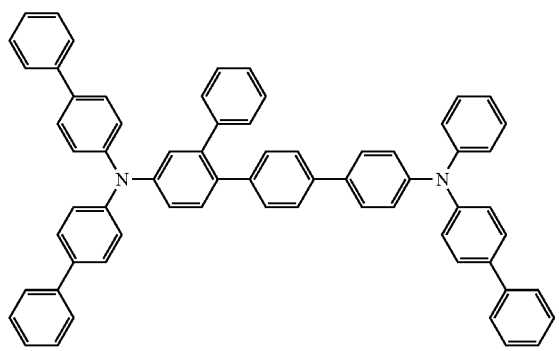
D40
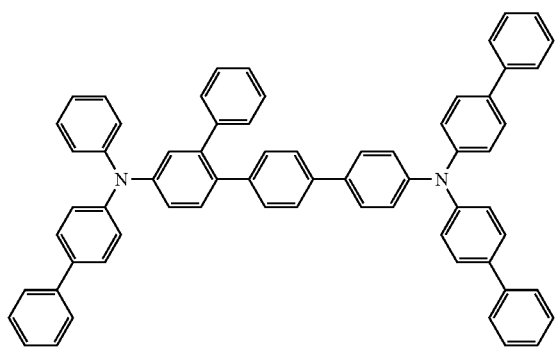
D41
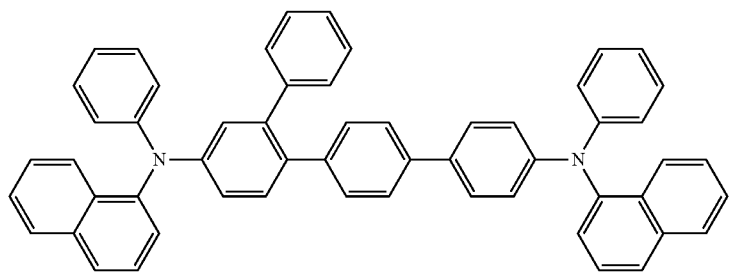

-continued
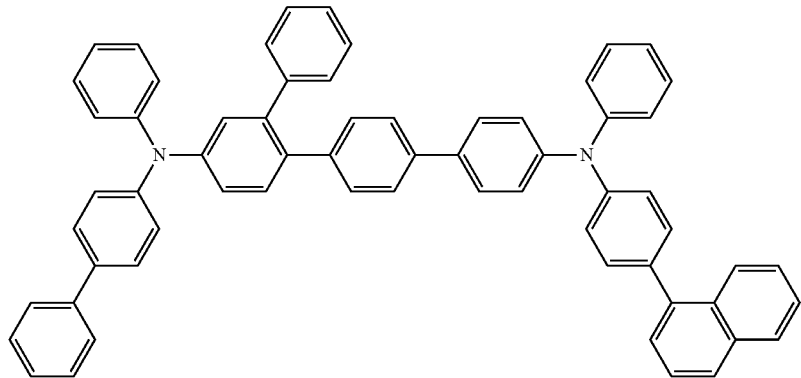
D42
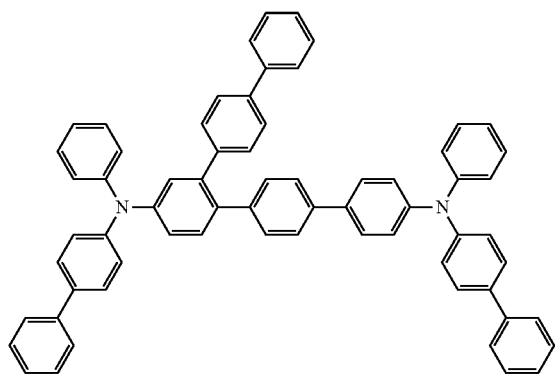
D43
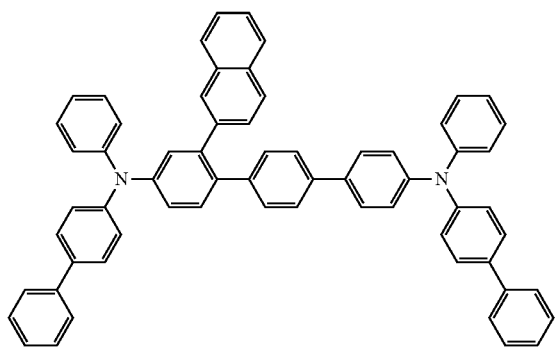
D44
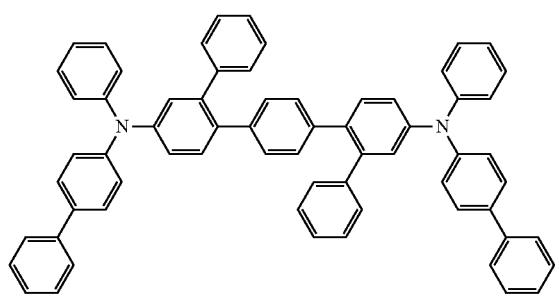
D45
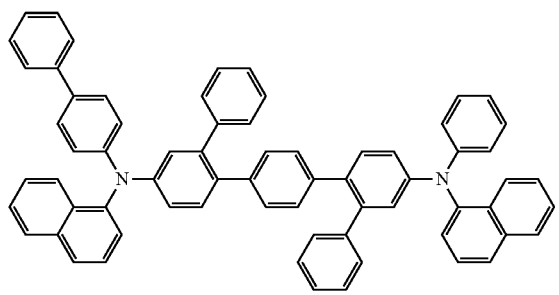
D47
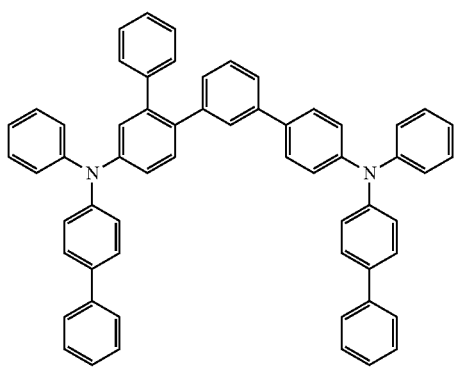
D48

-continued
D49
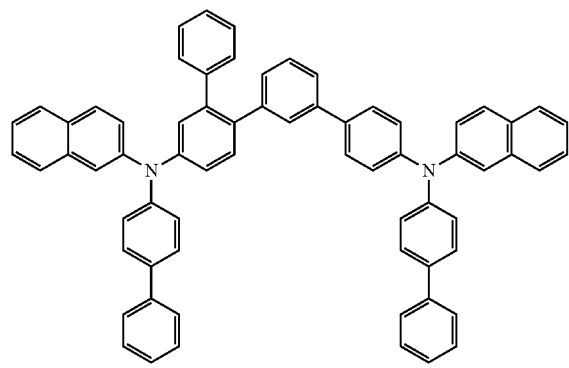
D50
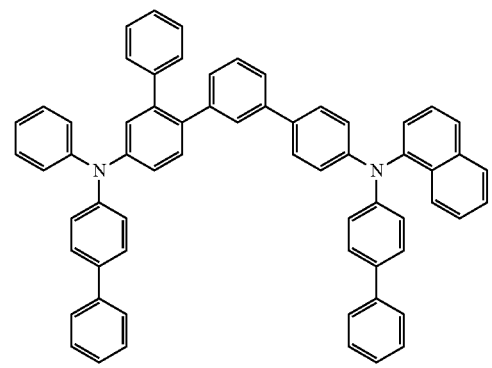
D51
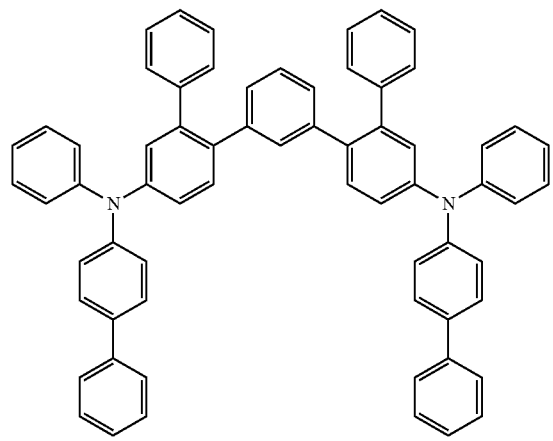
D52
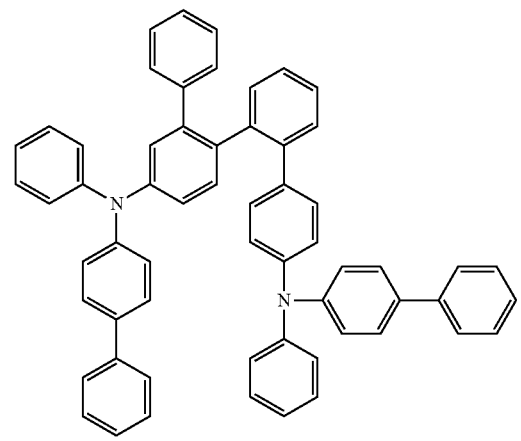
D53
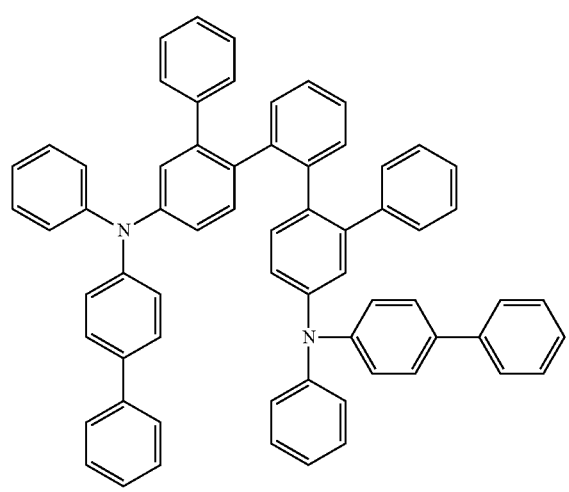

-continued
D54
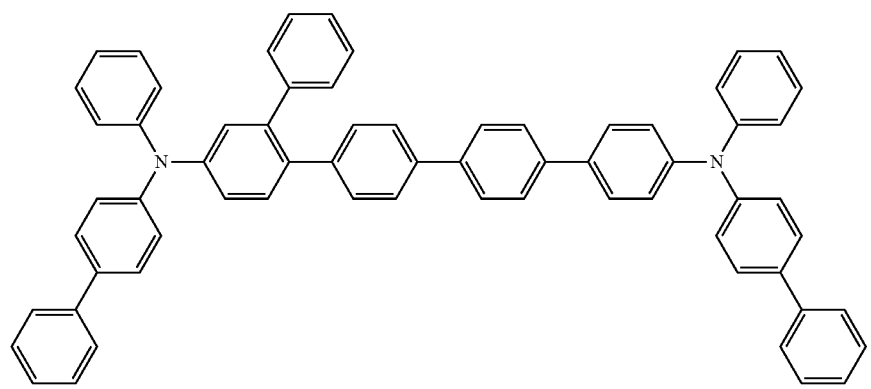
D55
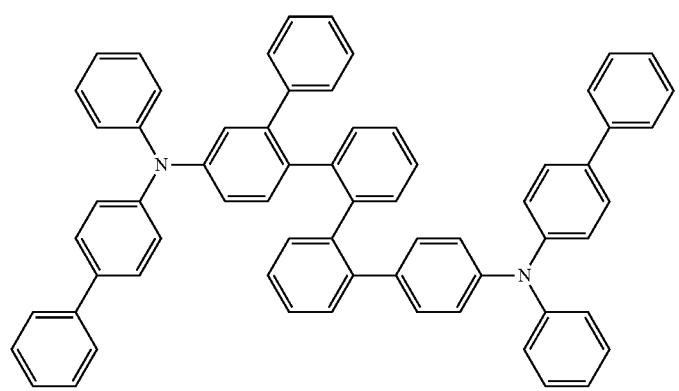
D56
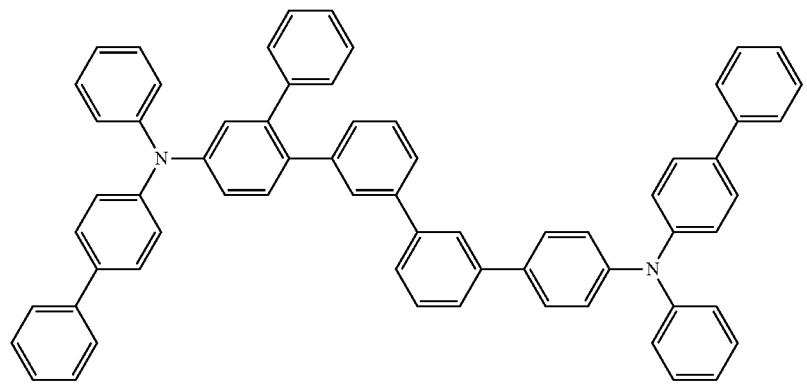
D57
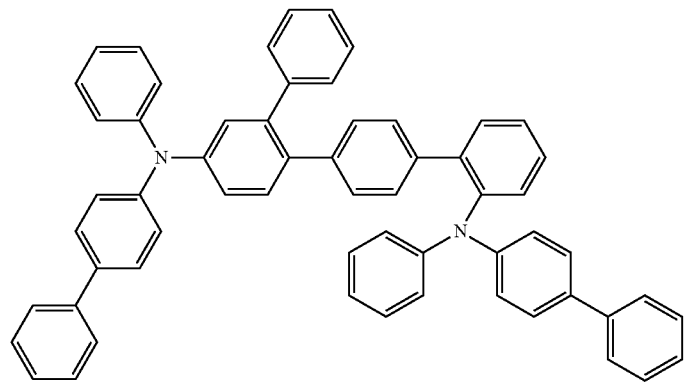

D58
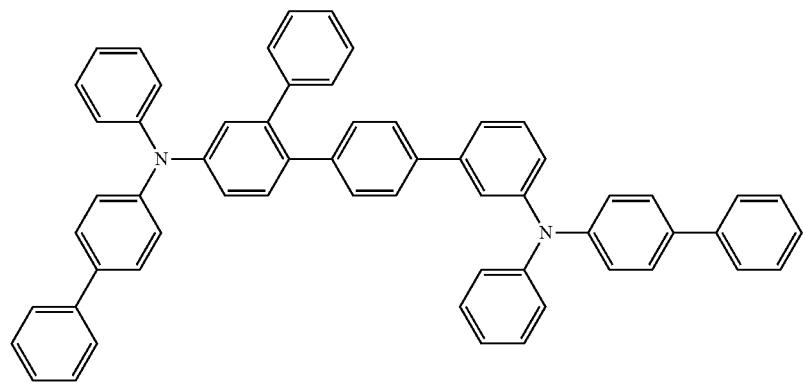
D59 D60
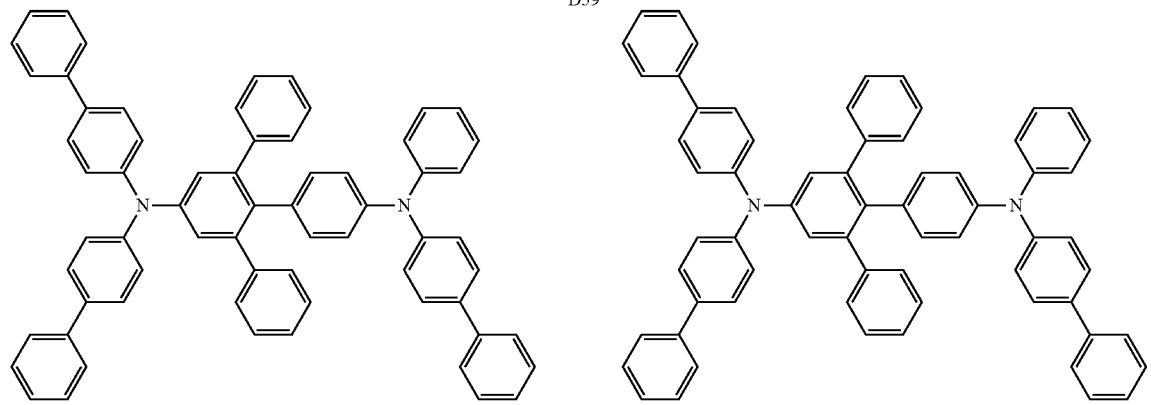
D61 D62
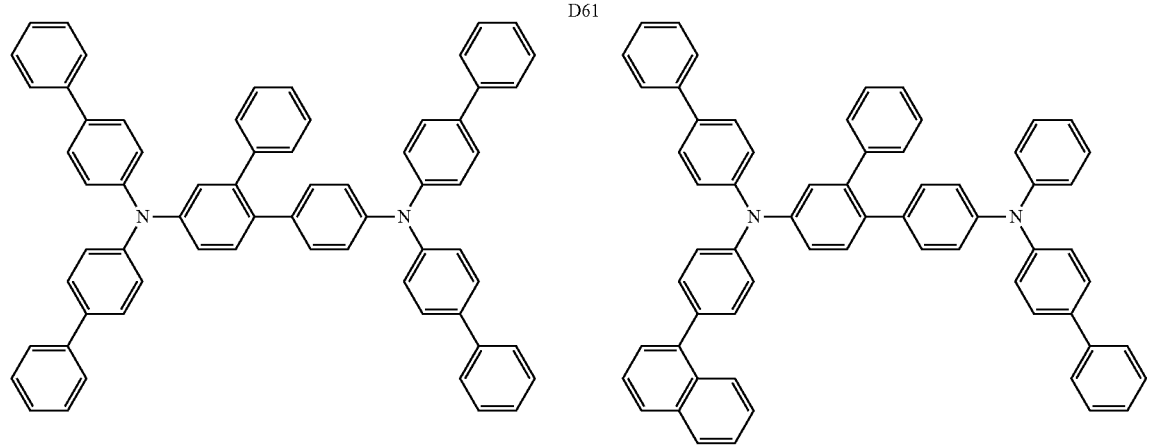

-continued
D63
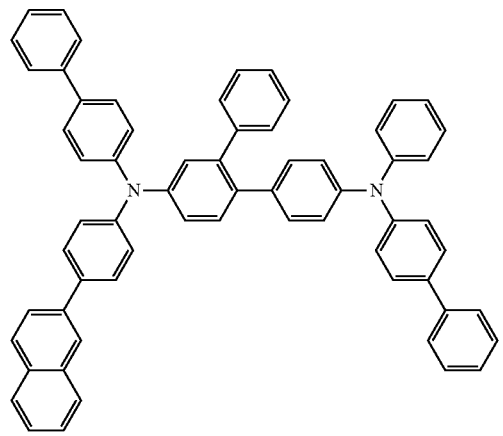
D64
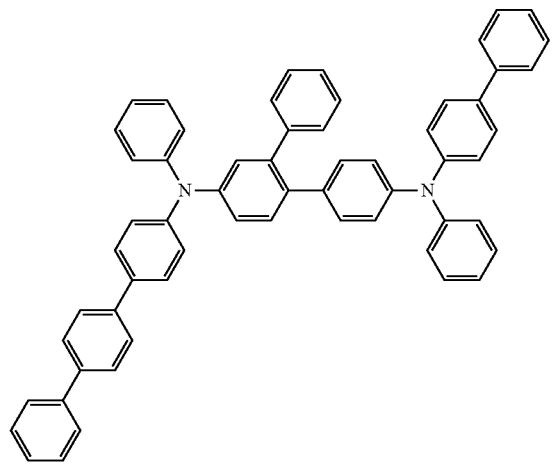
D65
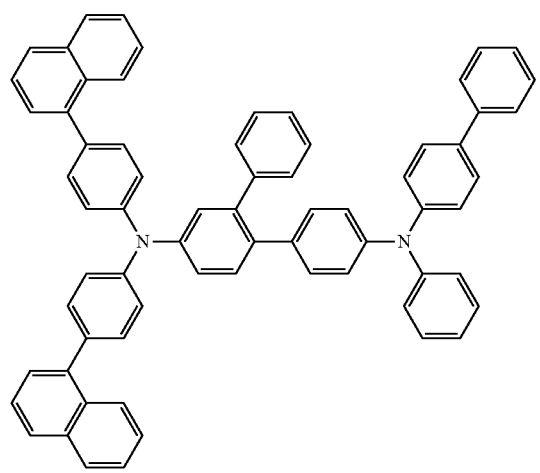
D66
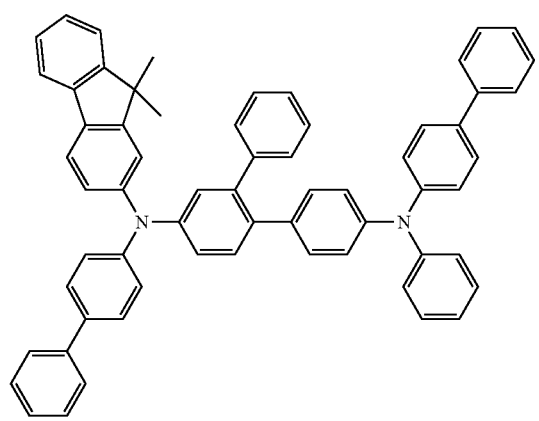
D67
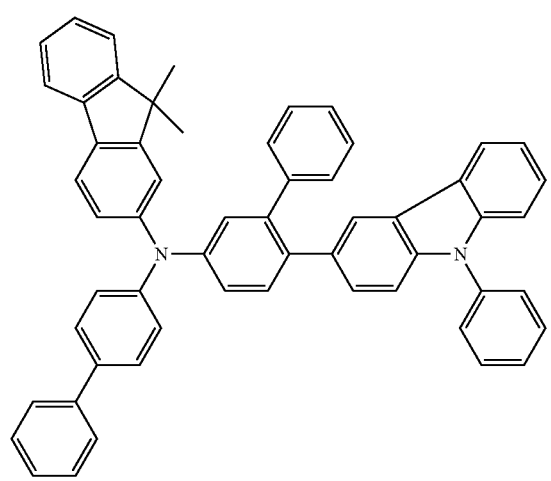
D68
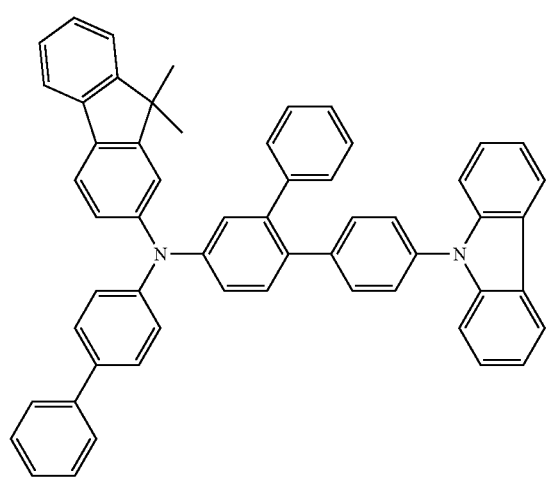

-continued
D69
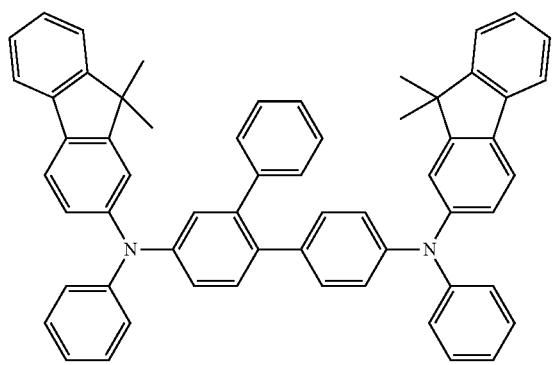
D70
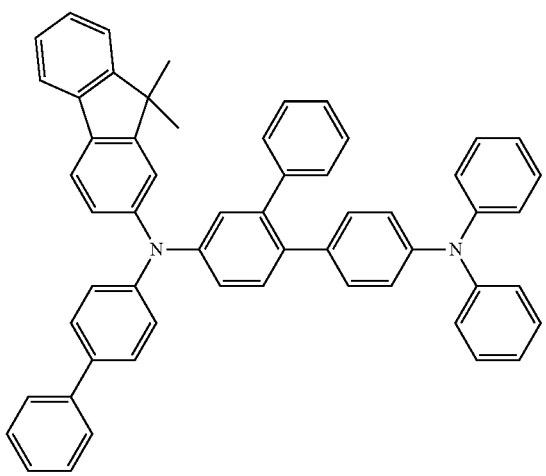
D71
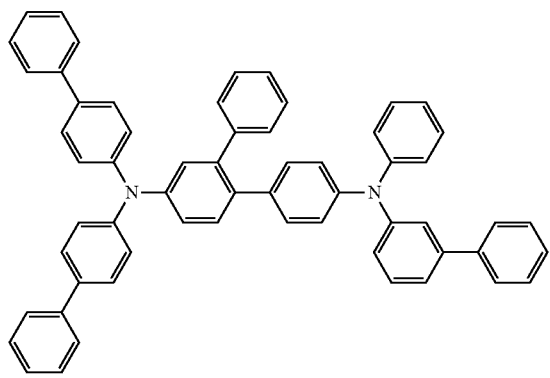
D72
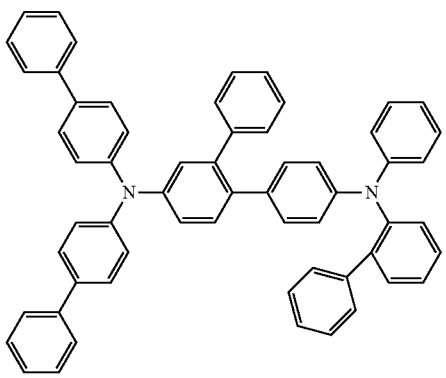
D73
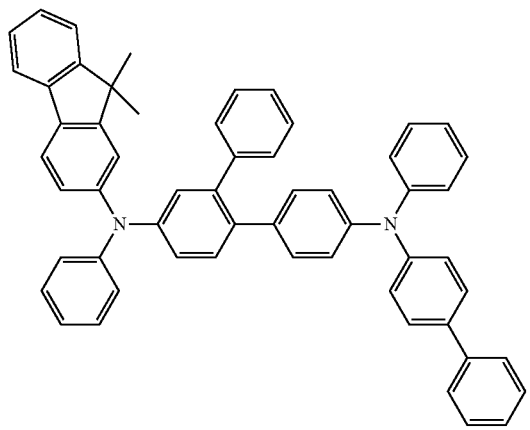
D74
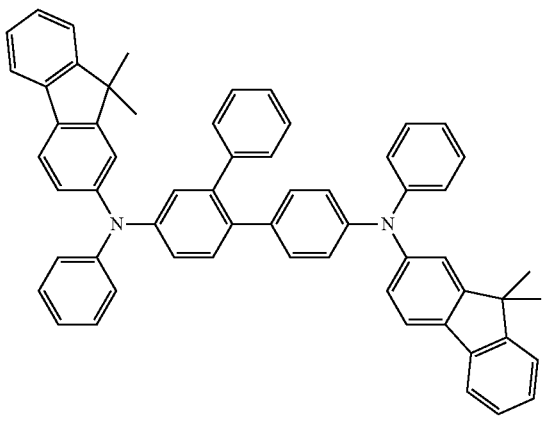

-continued
D75
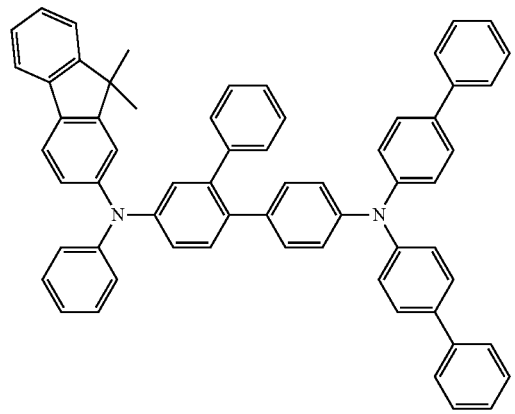
D76
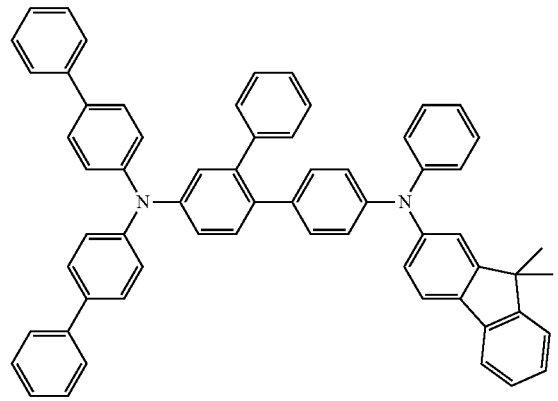
D77
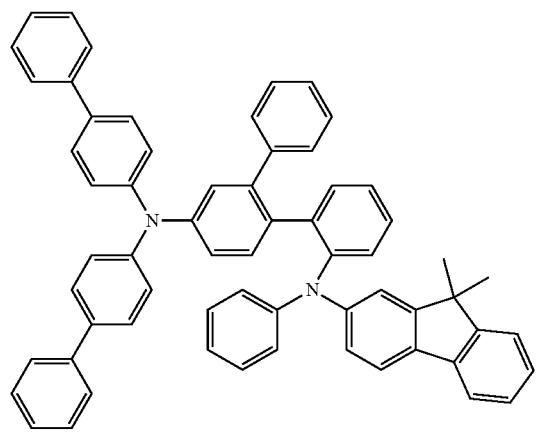
D78
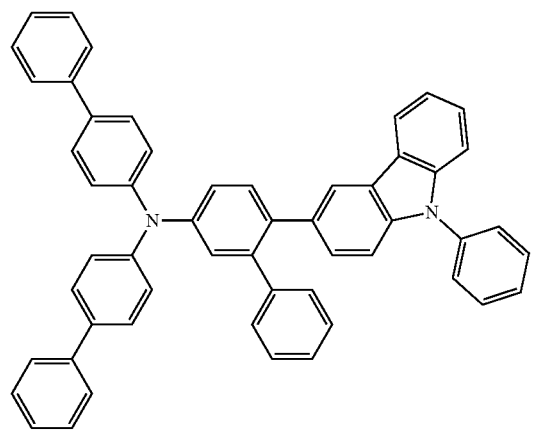
D79
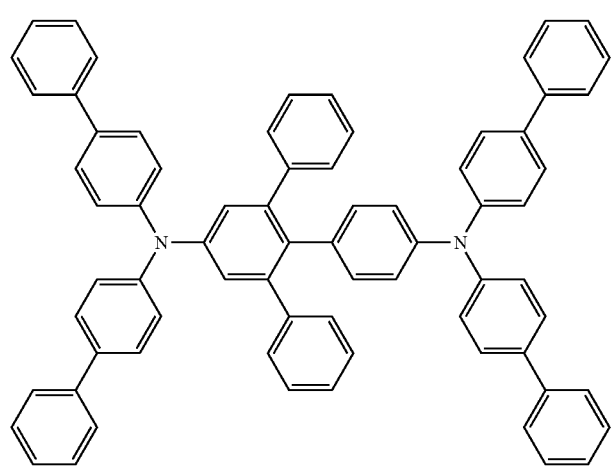

The compound of Formula D employed in the organic electroluminescent device of the present invention may be specifically selected from the compounds of Formulae D101 to D145:
D101
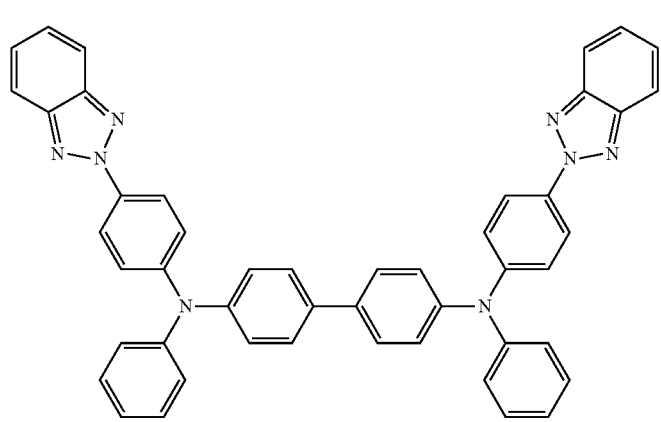
D102
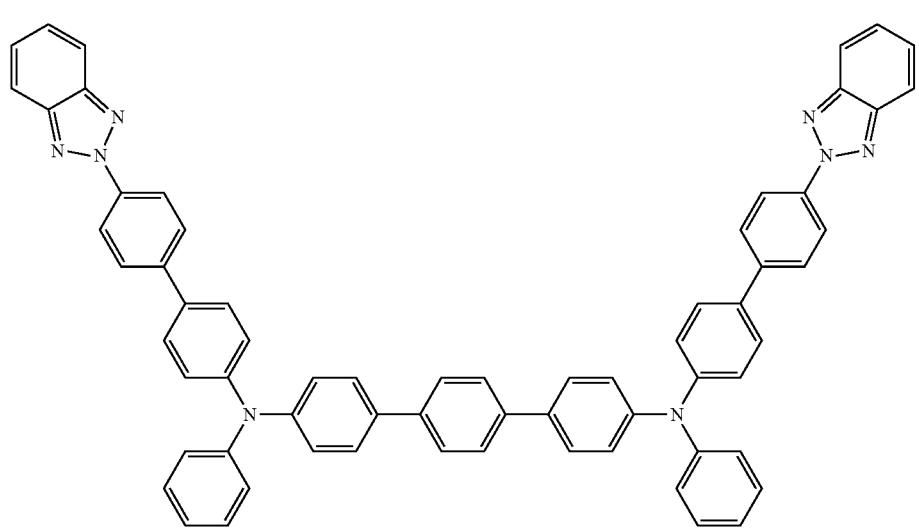
D103
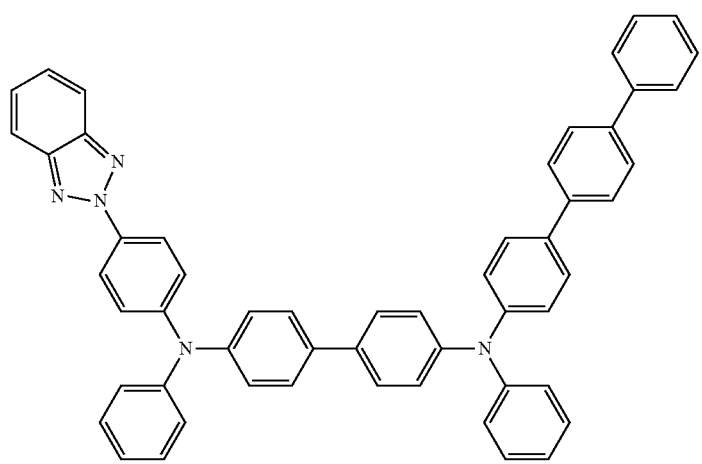

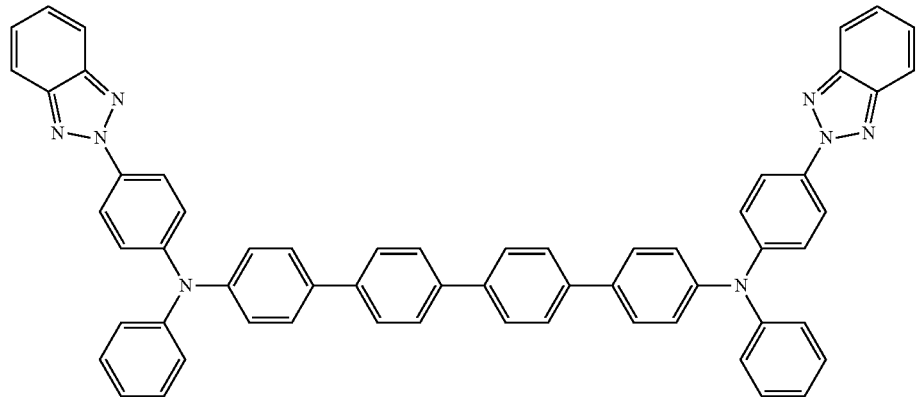
D104
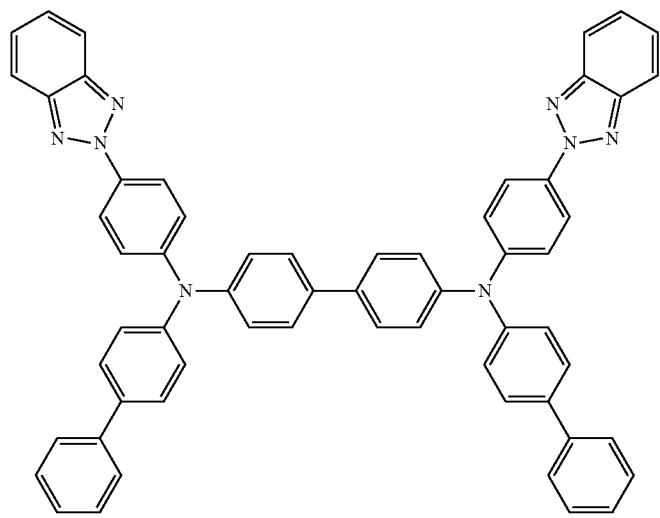
D105
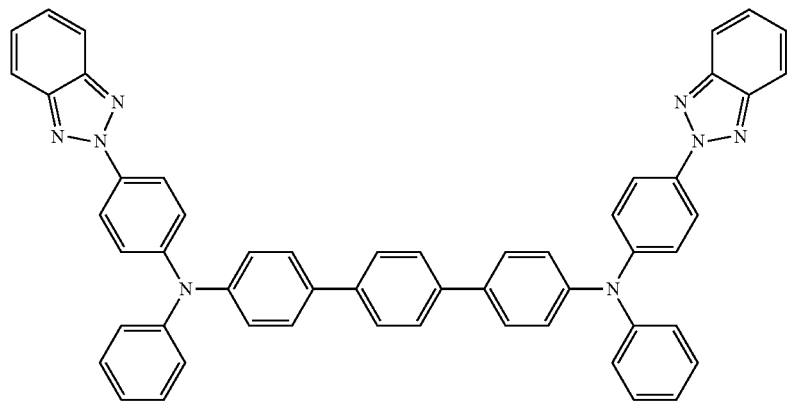
D106

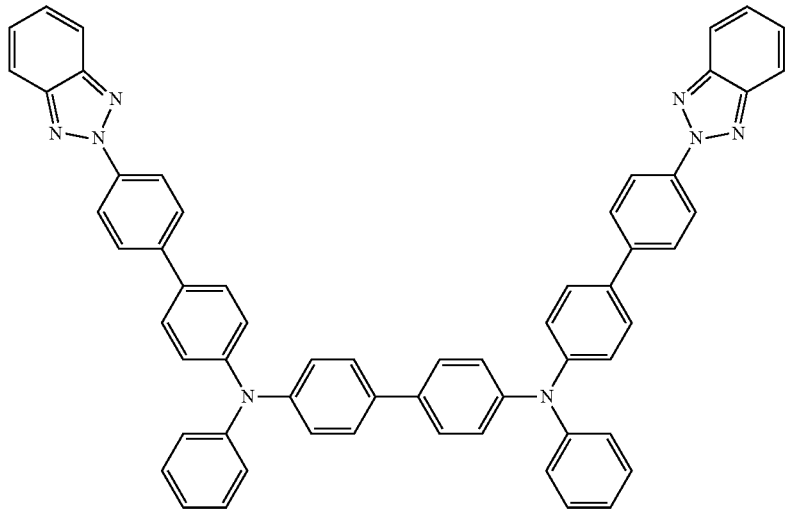
D107
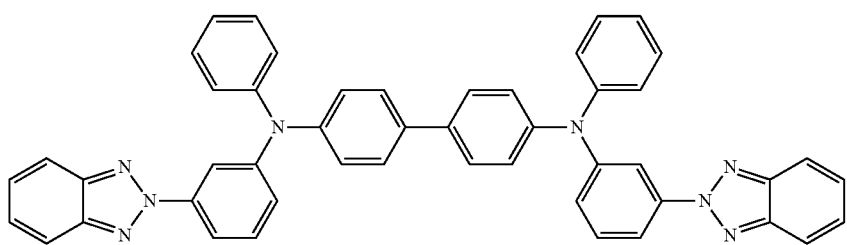
D108
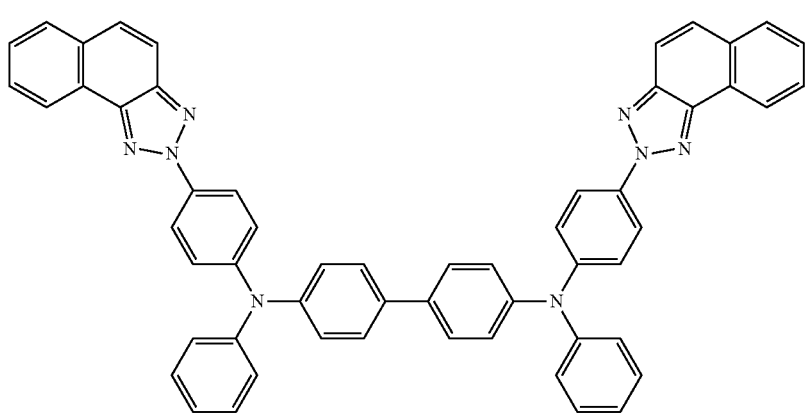
D109
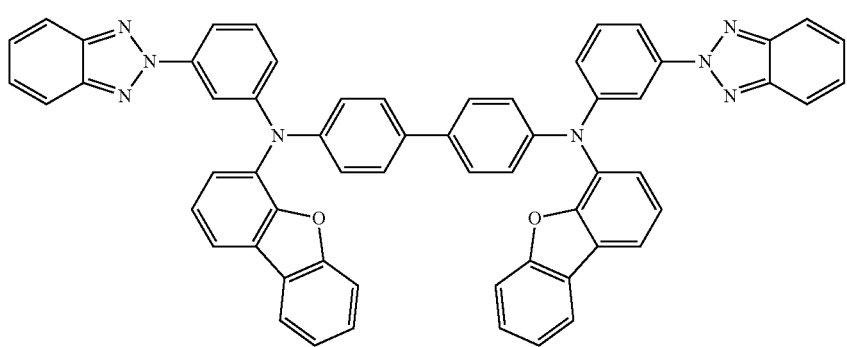
D110

-continued
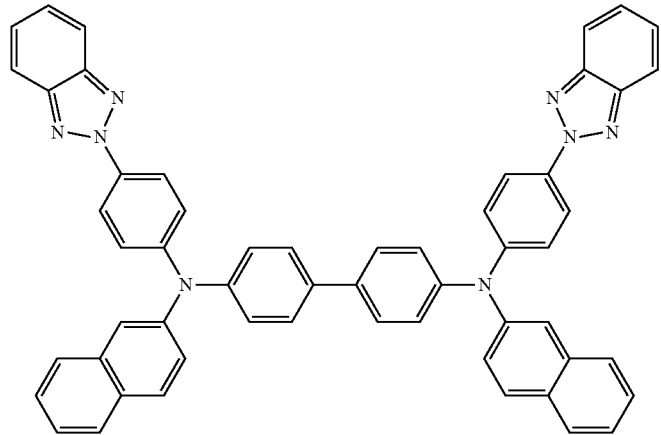
D111
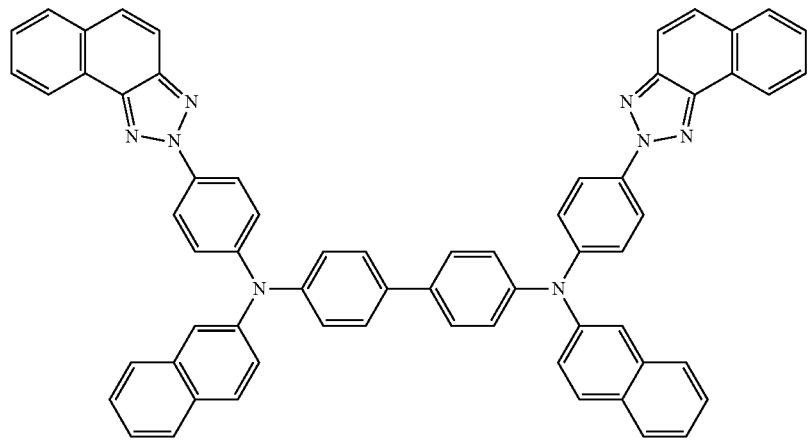
D112
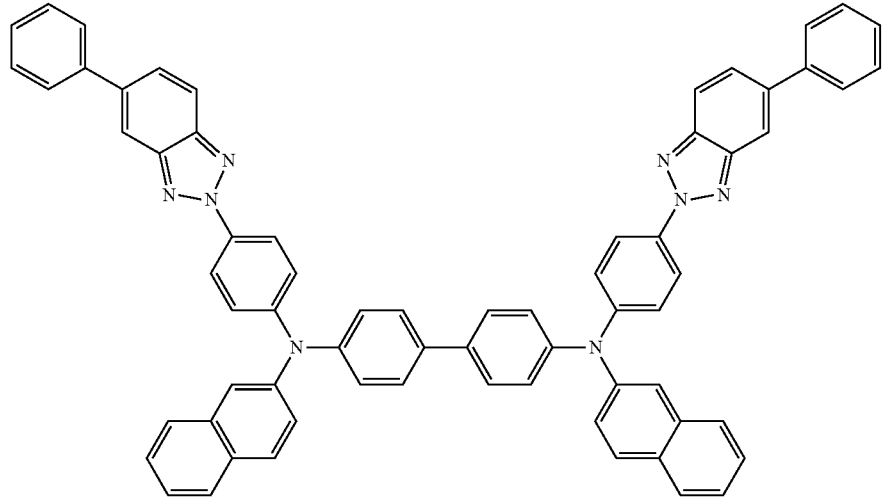
D113

-continued
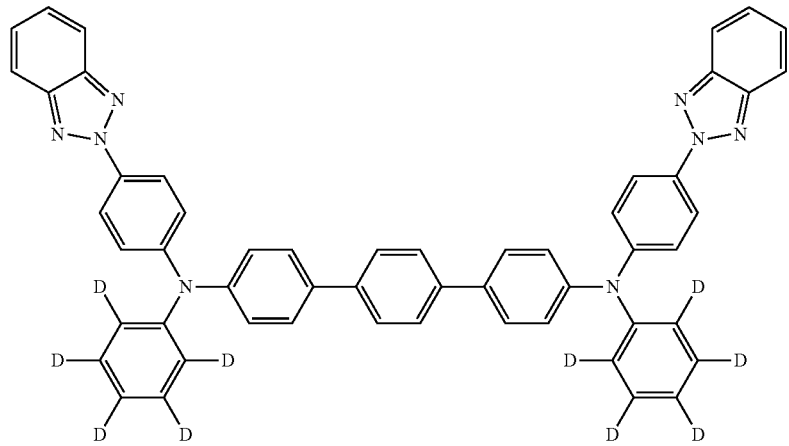
D114
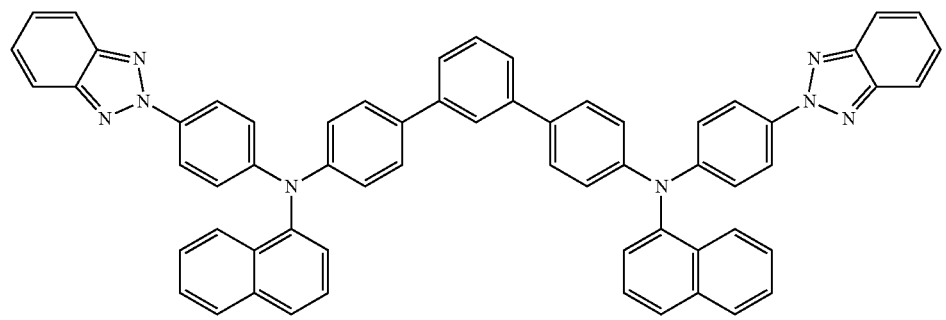
D115
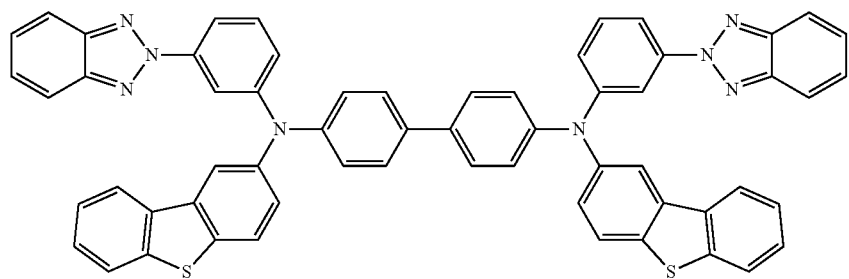
D116
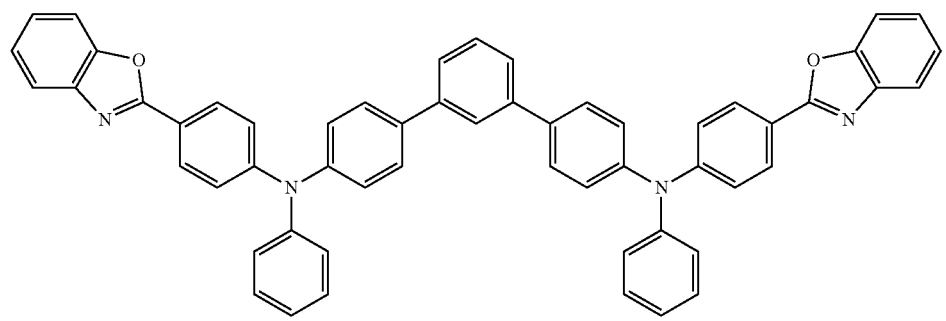
D117

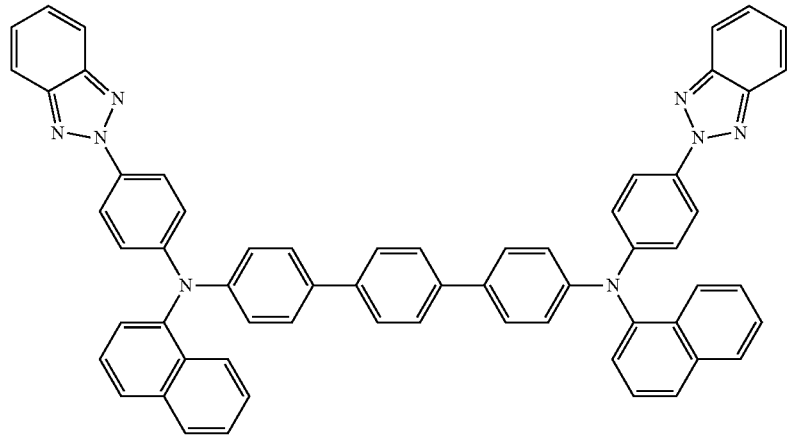
D118
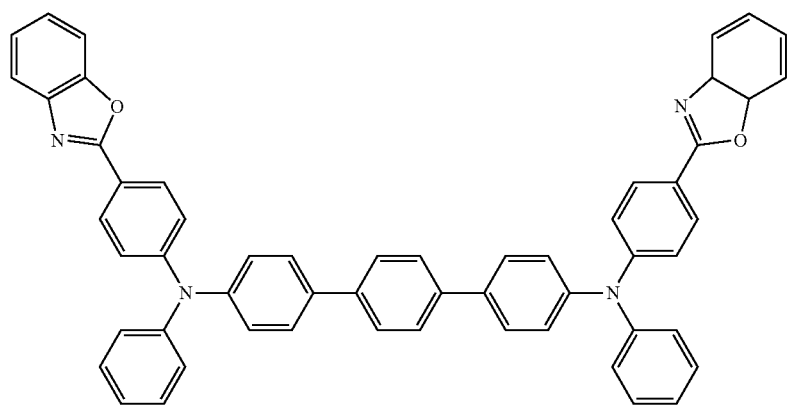
D119
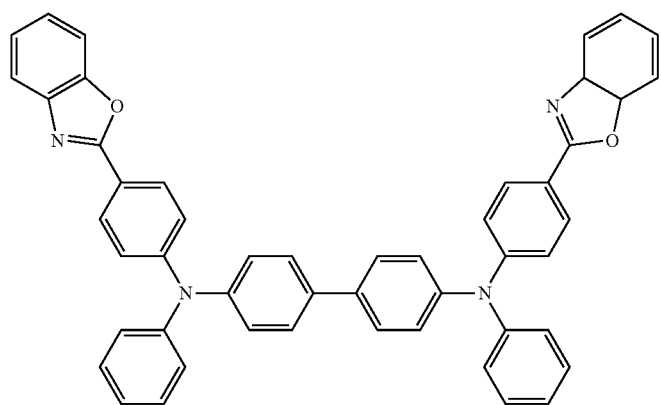
D120

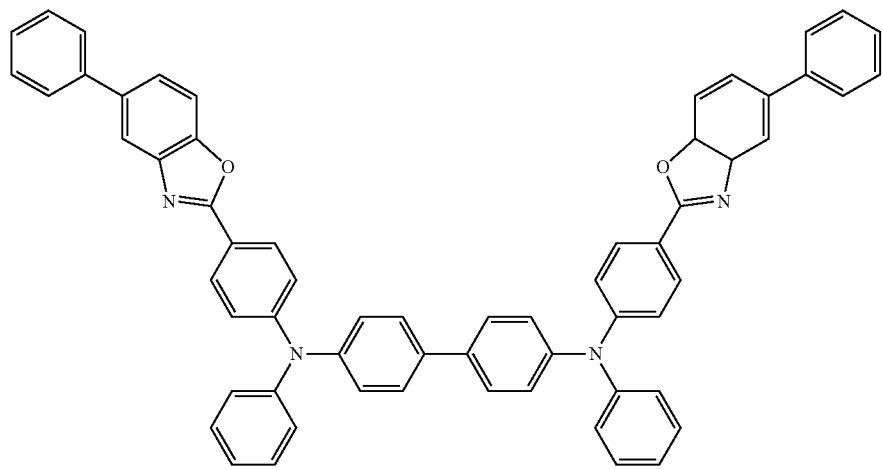
D121
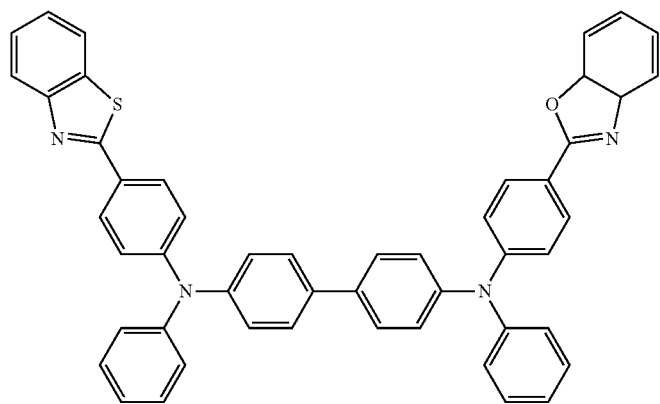
D122
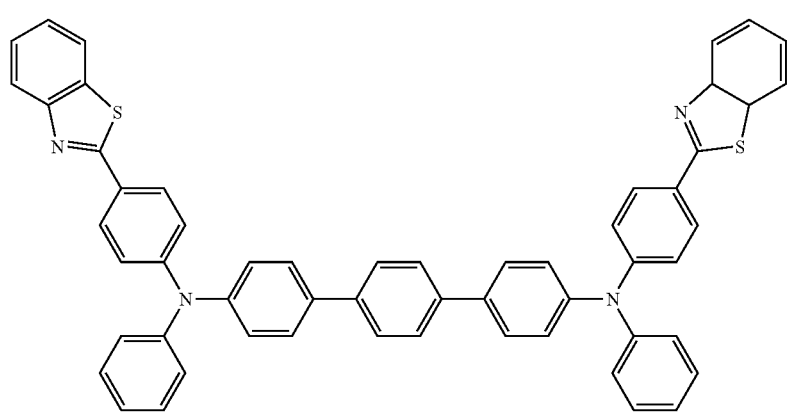
D123

-continued
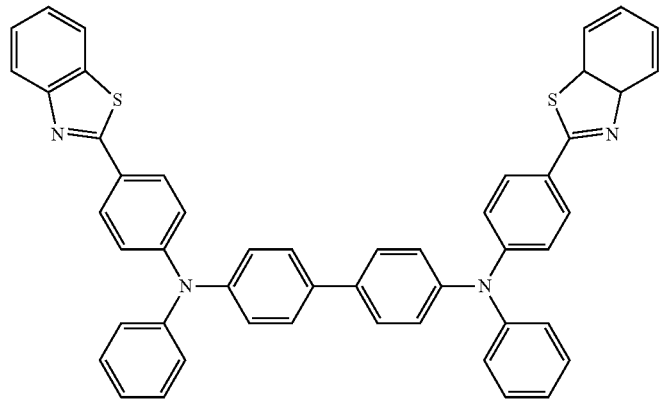
D124
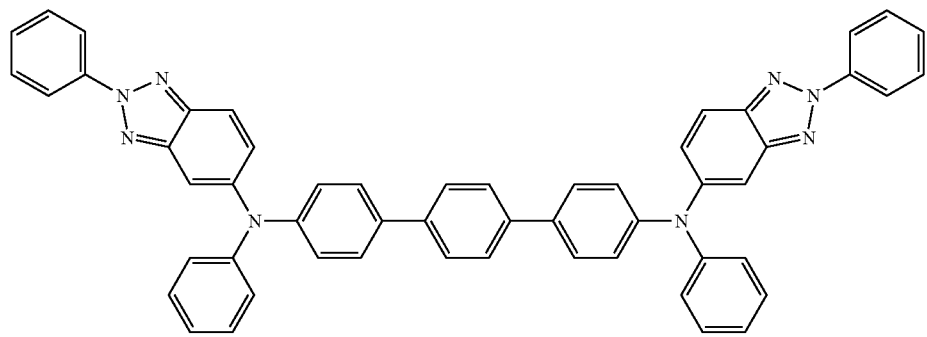
D125
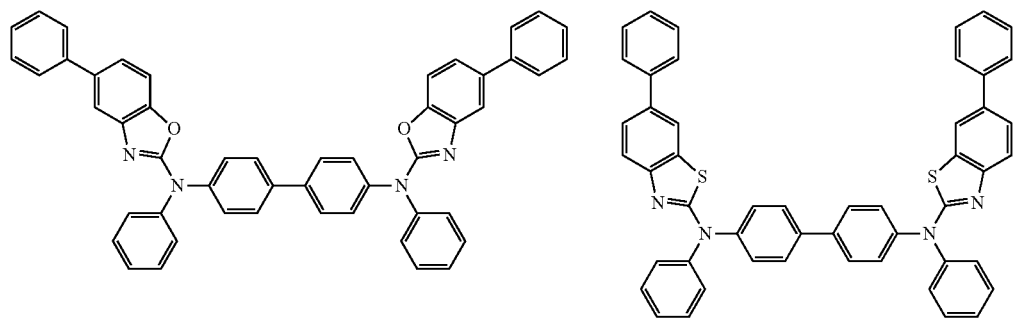
D126 D127
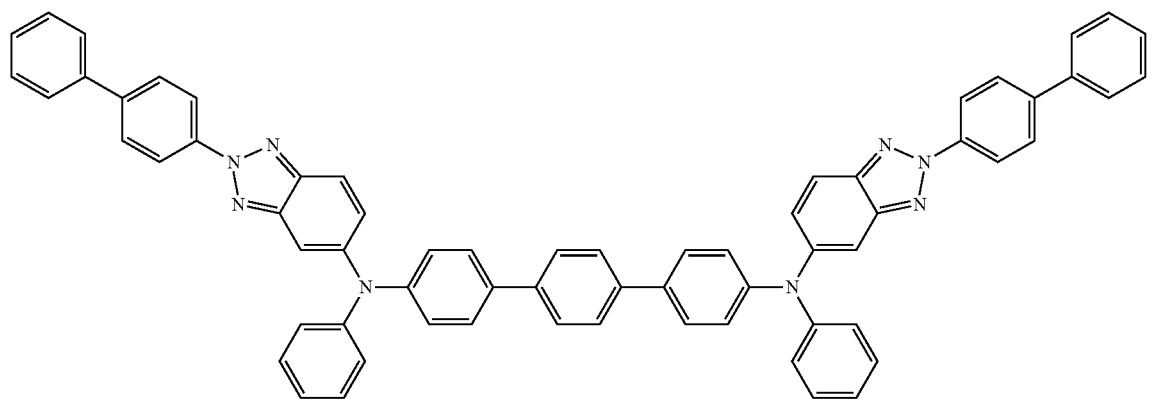
D128

-continued
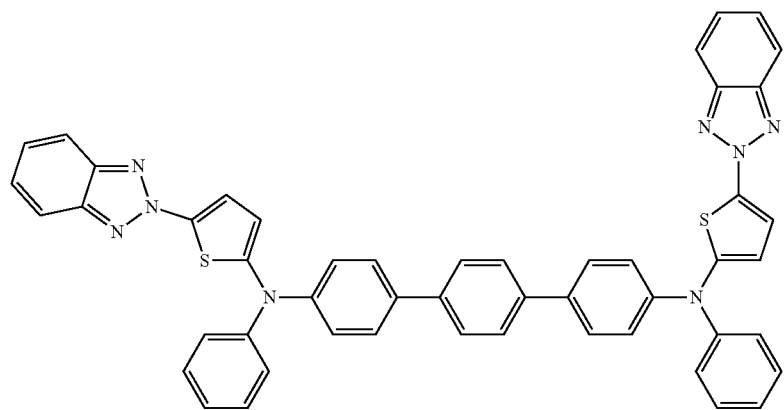
D129
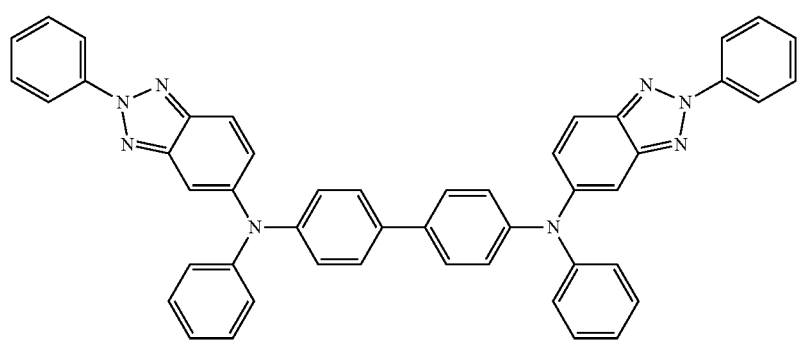
D130
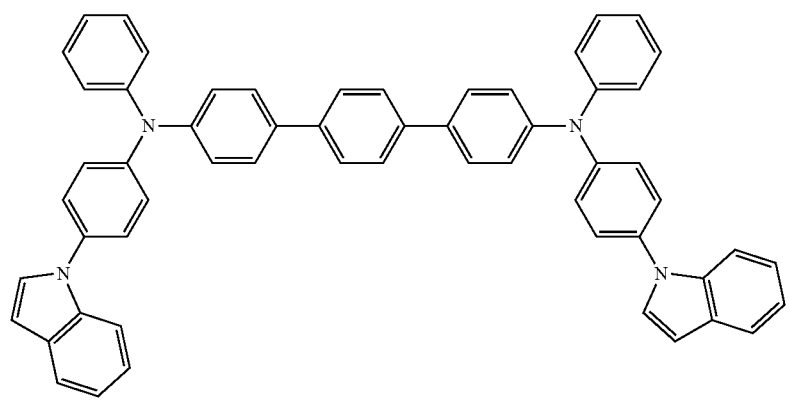
D131
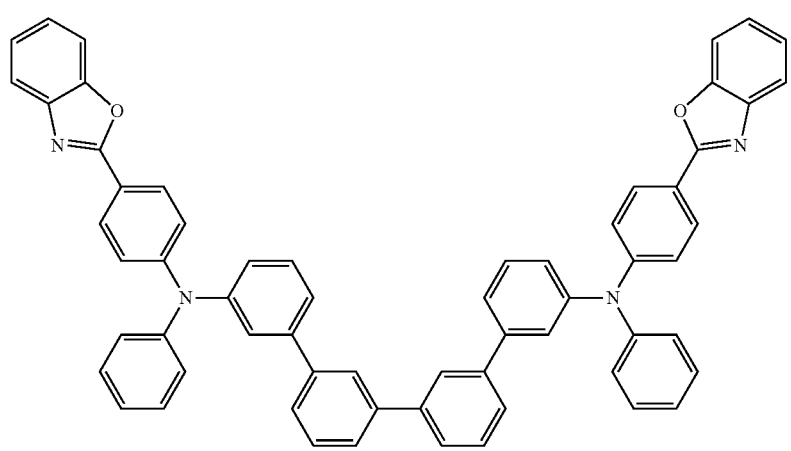
D132

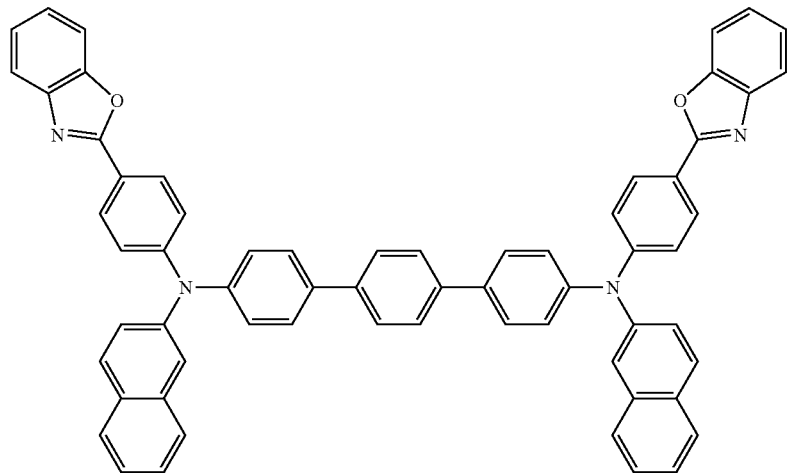
D133
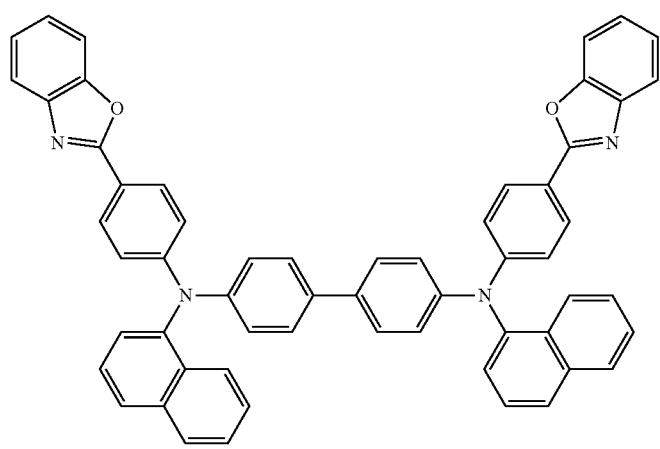
D134
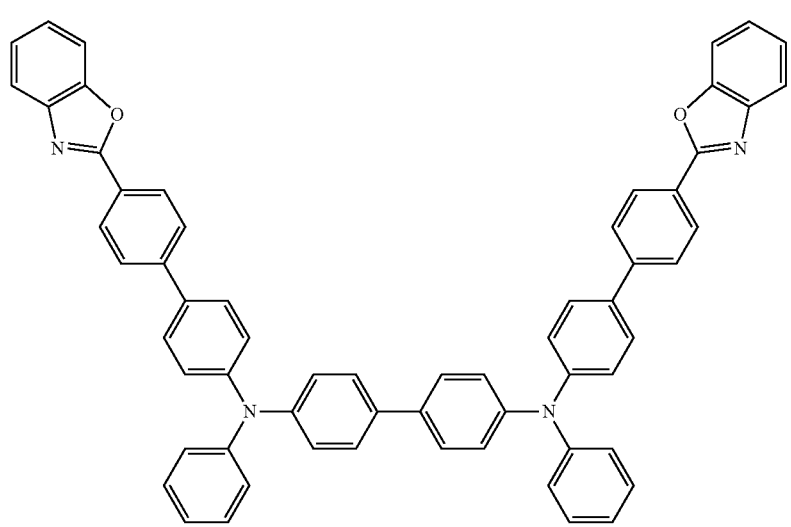
D135

-continued
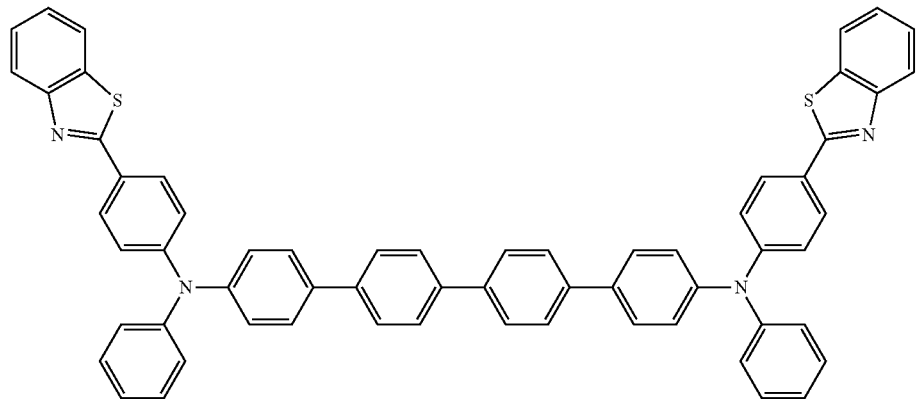
D136
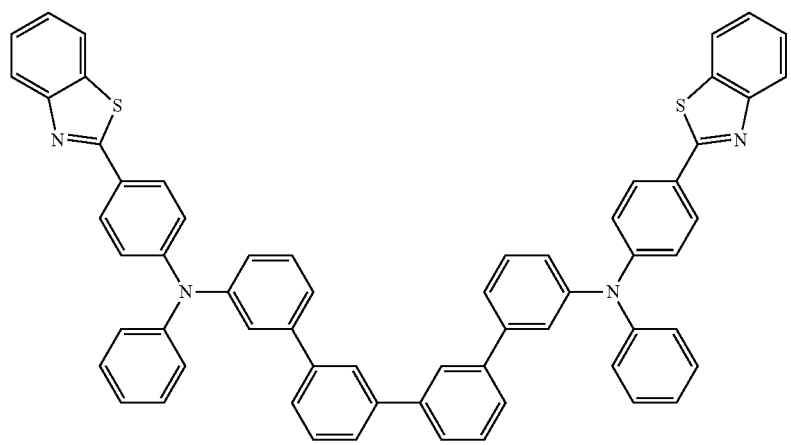
D137
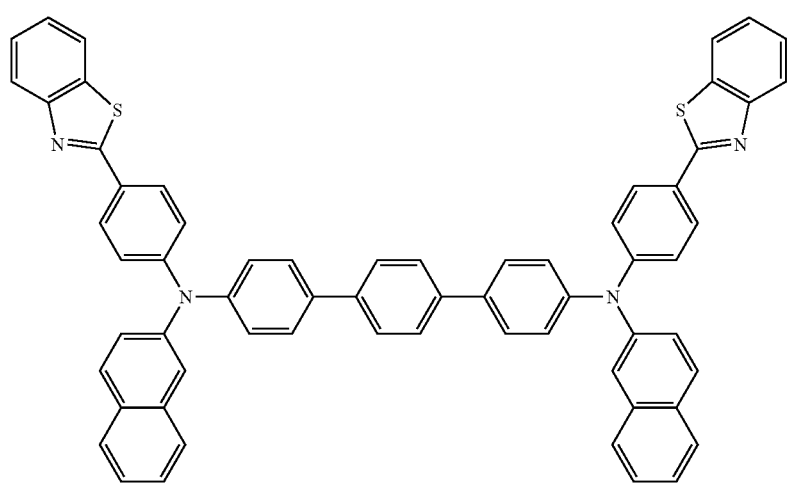
D138

-continued
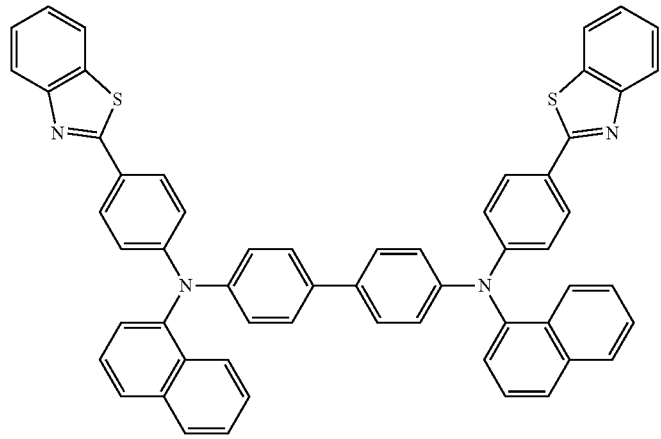
D139
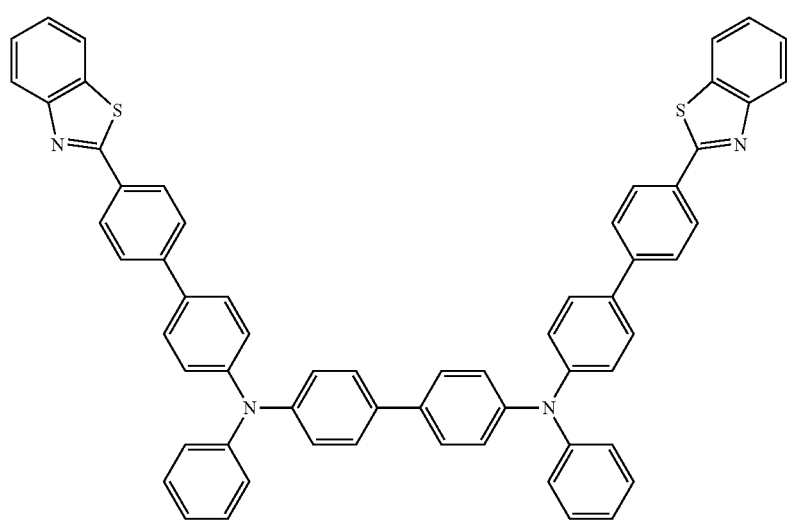
D140
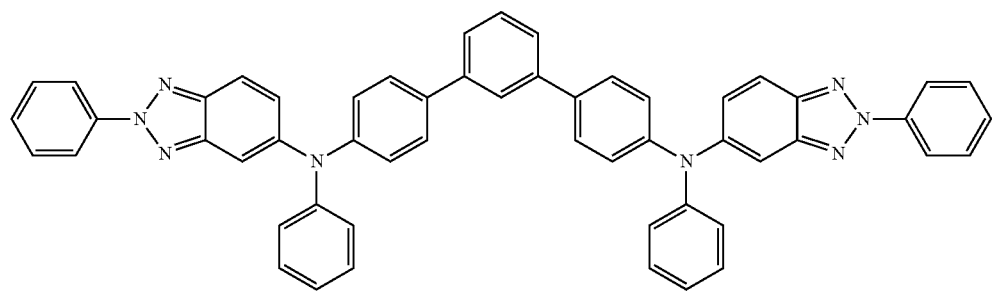
D141
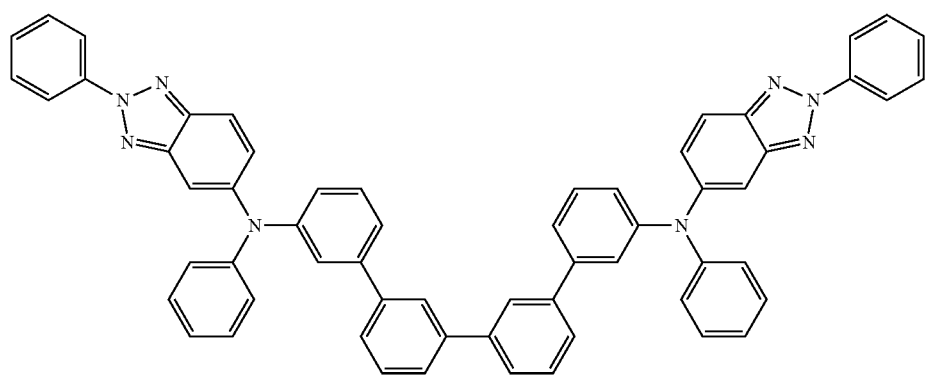
D142

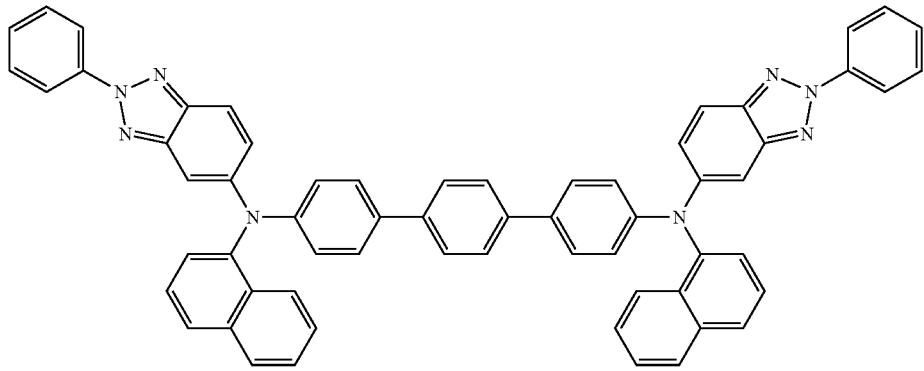

D143

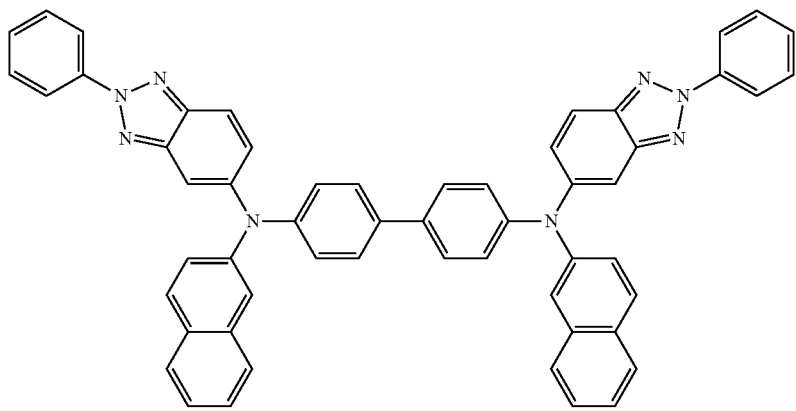

D144

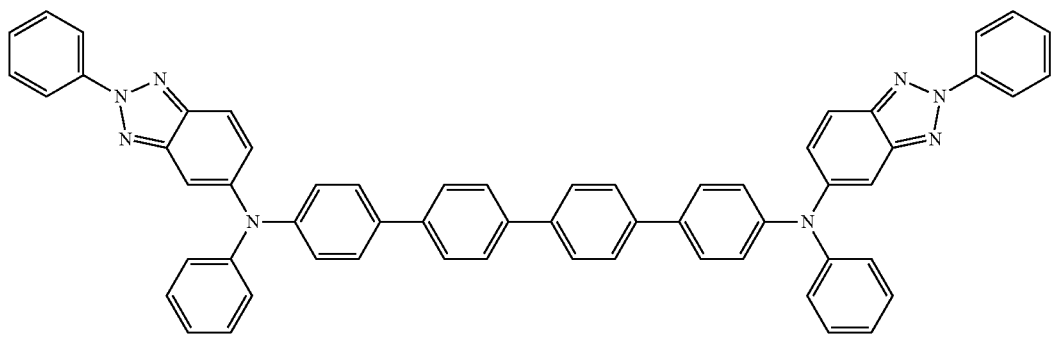

D145

The organic electroluminescent device of the present invention may further include one or more organic layers, for example, a hole transport layer and an electron blocking layer, each of which may include a compound represented by Formula F:

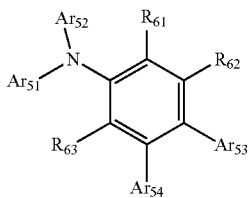

(F)

wherein $R_{61}$ to $R_{63}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

The compound of Formula F employed in the organic electroluminescent device of the present invention may be specifically selected from the compounds of Formulae F1 to F33:
F1
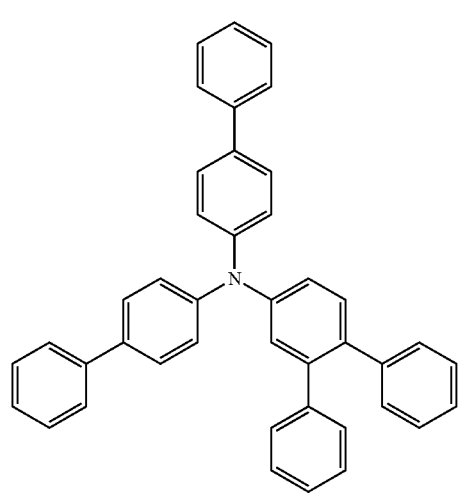
F2
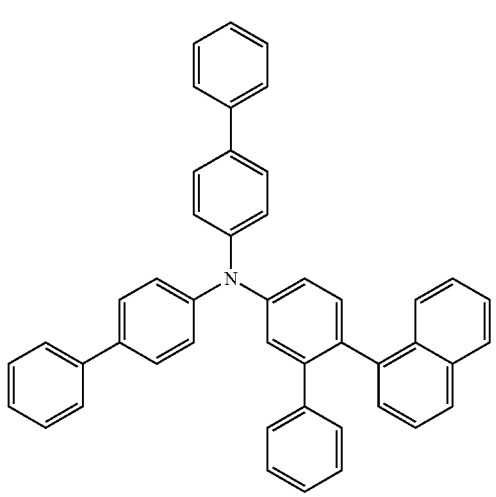
F3
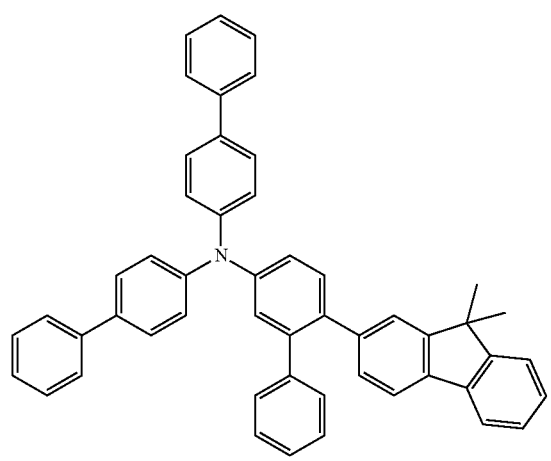
F4
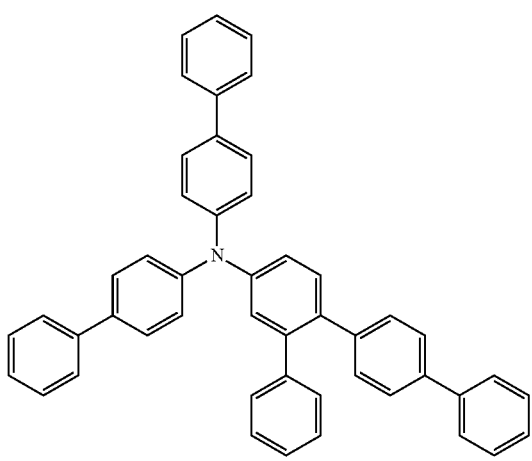
F5
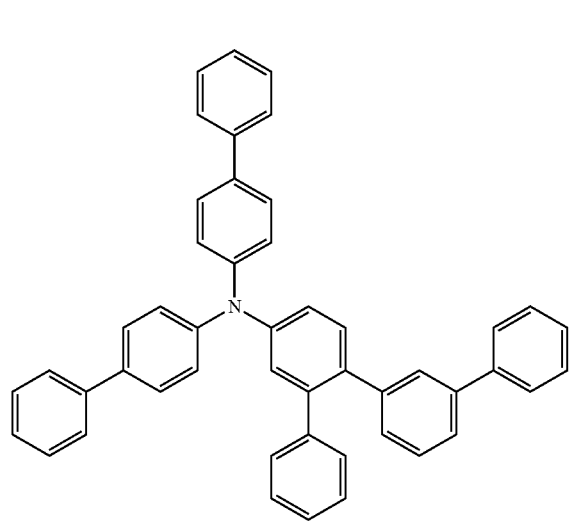
F6
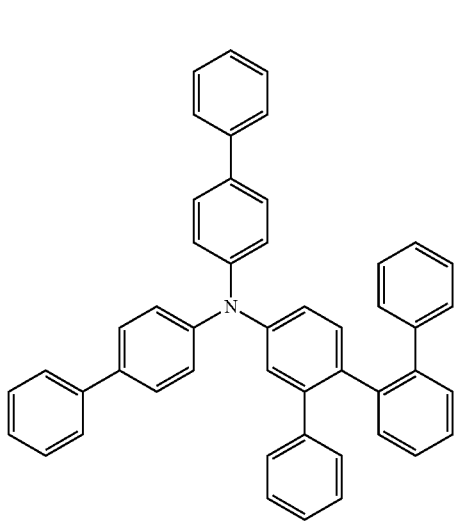

-continued
F7
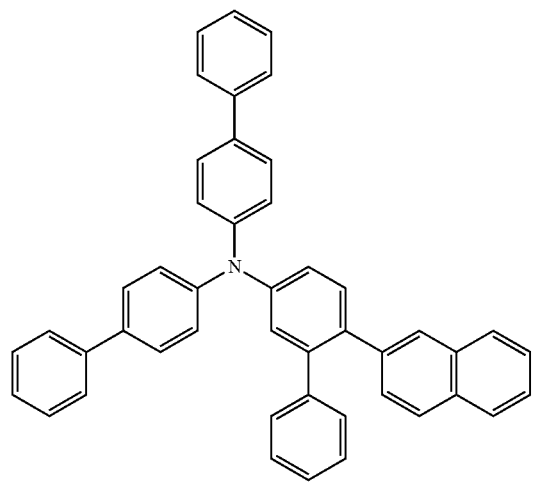
F8
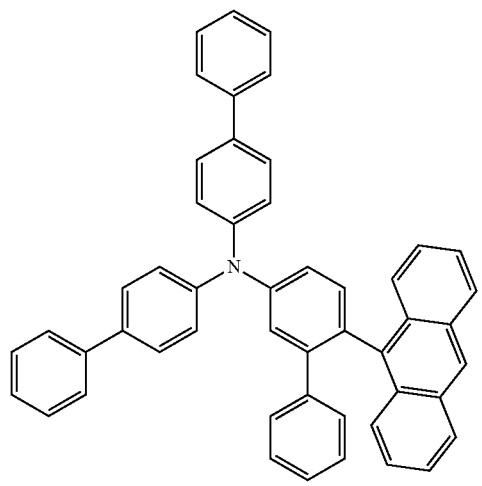
F9
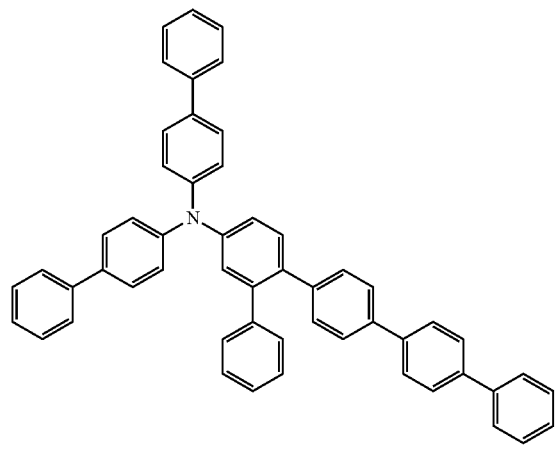
F10
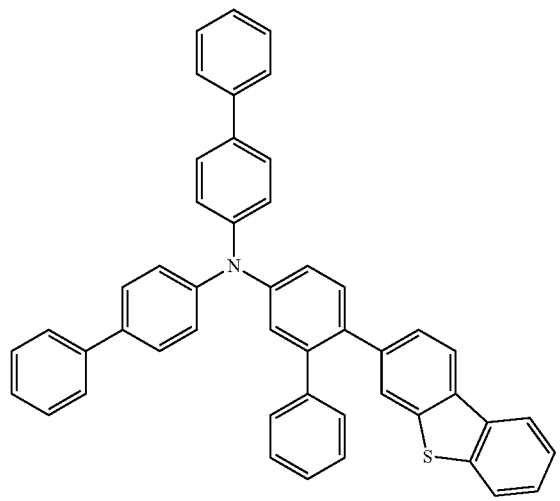
F11
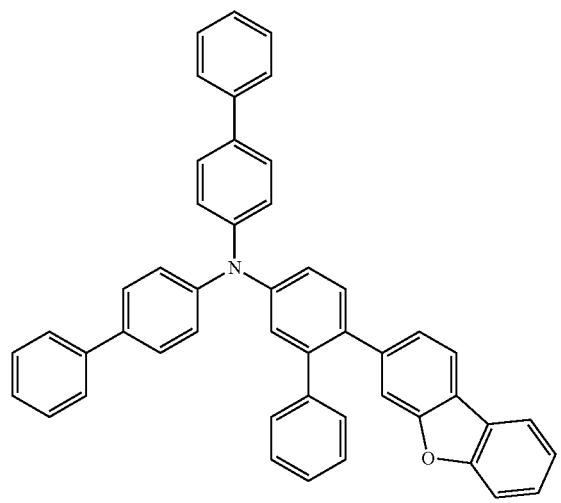
F12
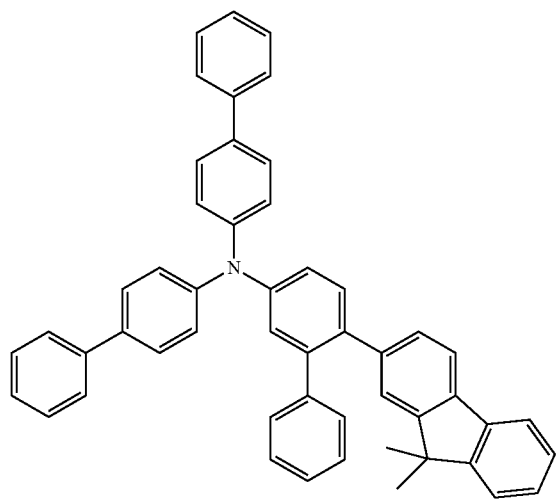

-continued
F13
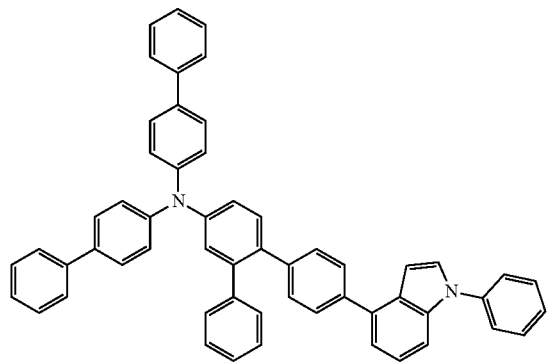
F14
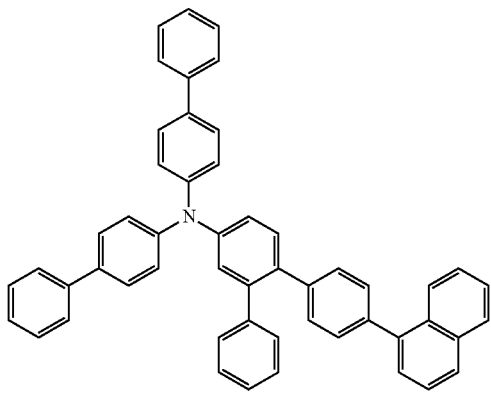
F15
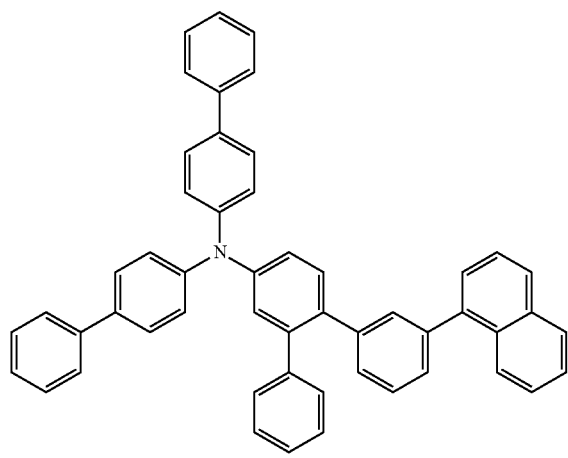
F16
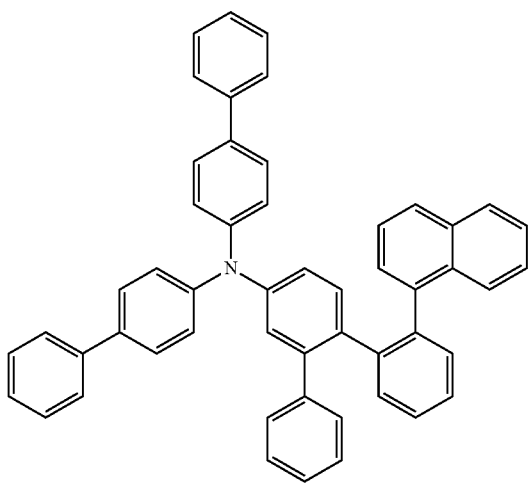
F17
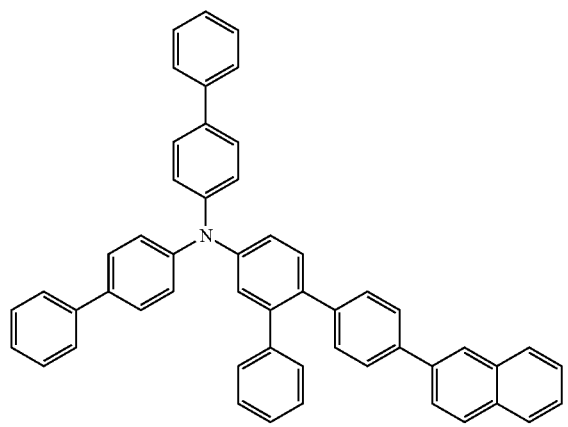
F18
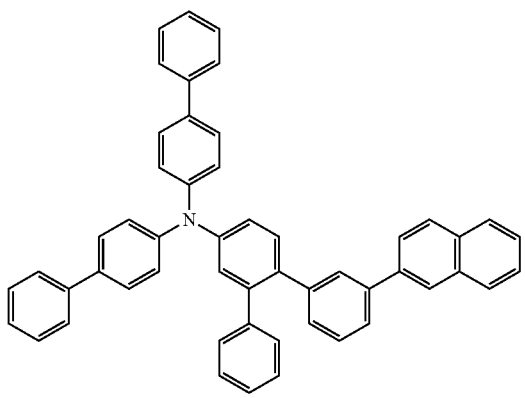

-continued
F19
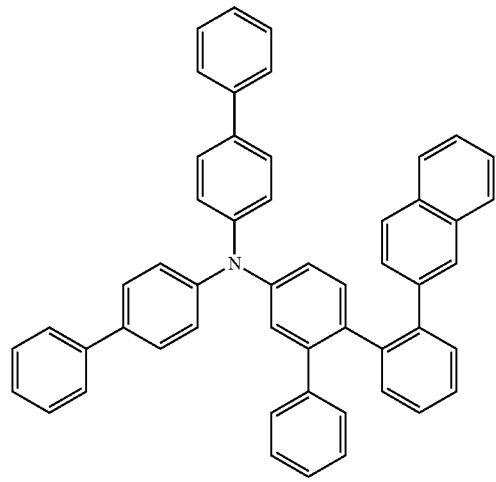
F20
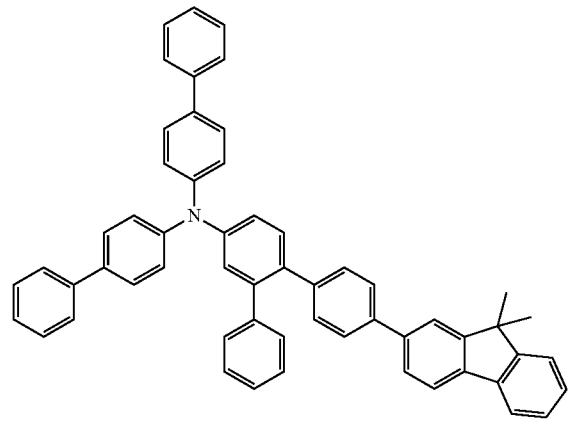
F21
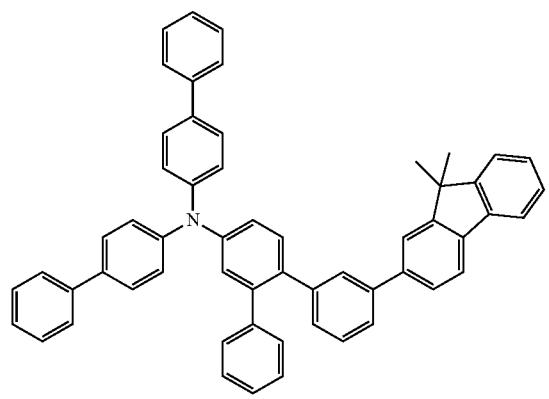
F22
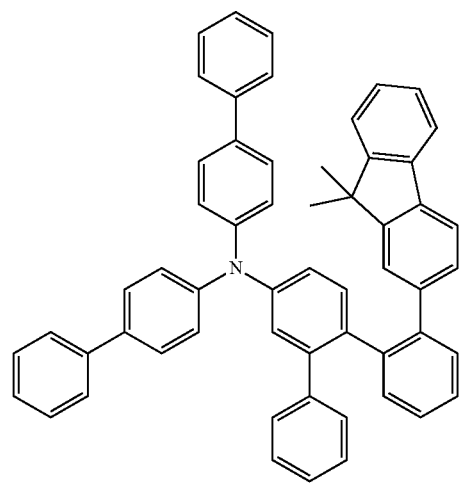
F23
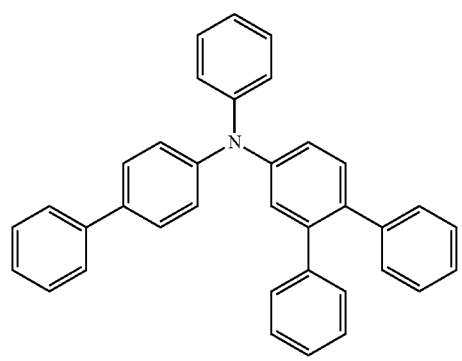
F24
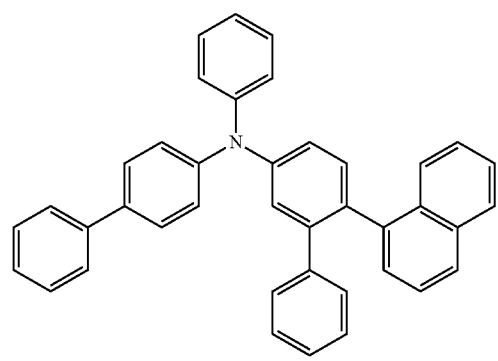

-continued
F25
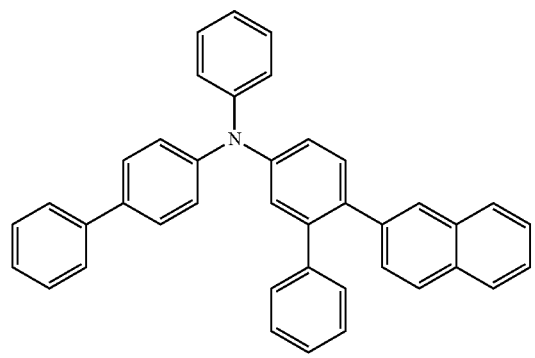
F26
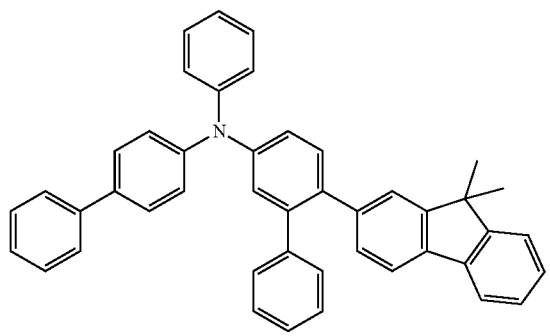
F27
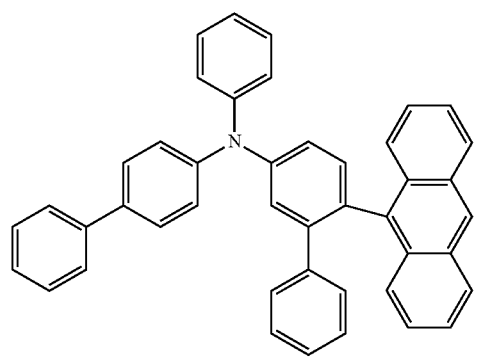
F28
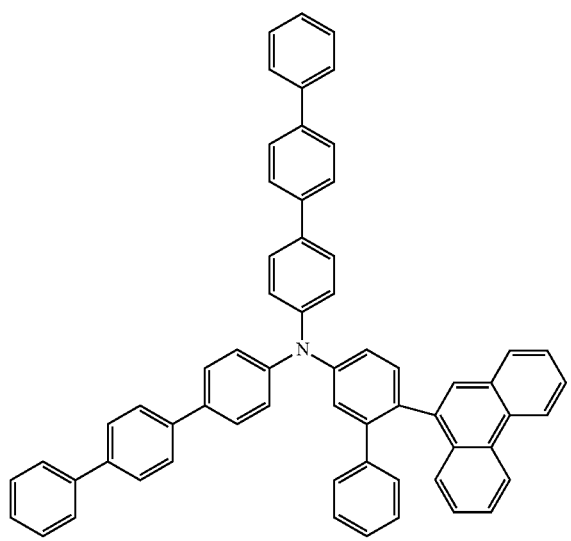
F29
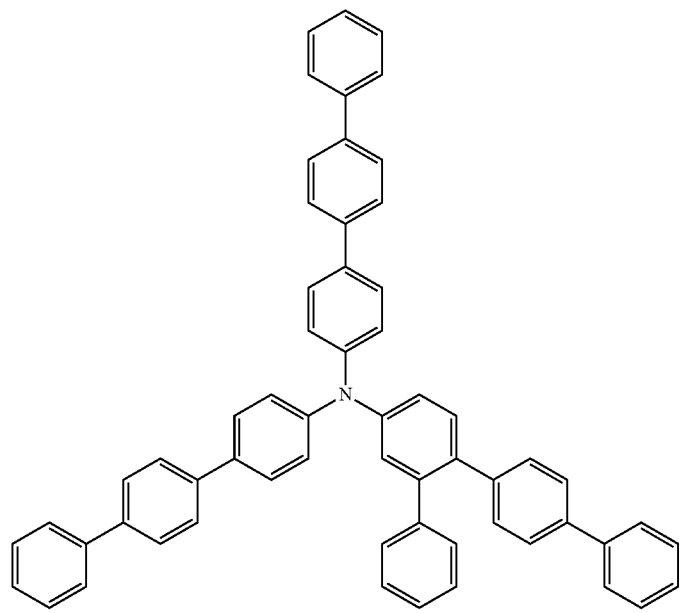

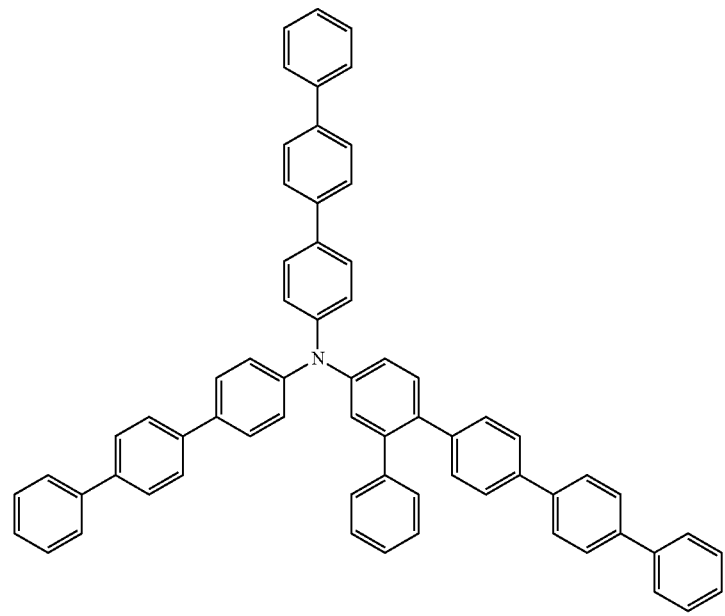
F30
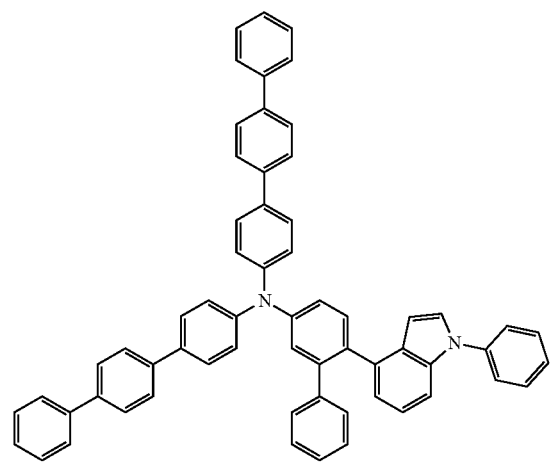
F31
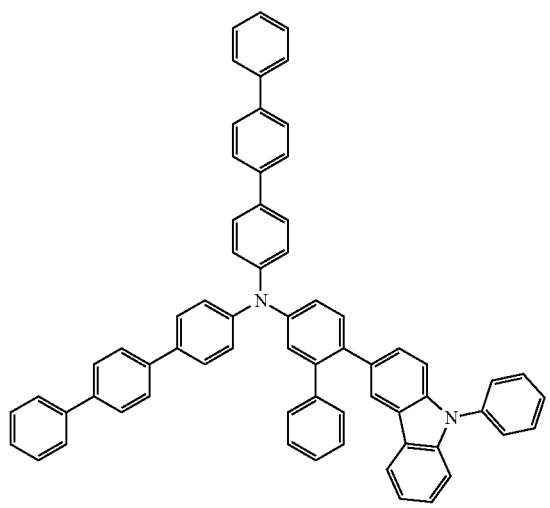
F32

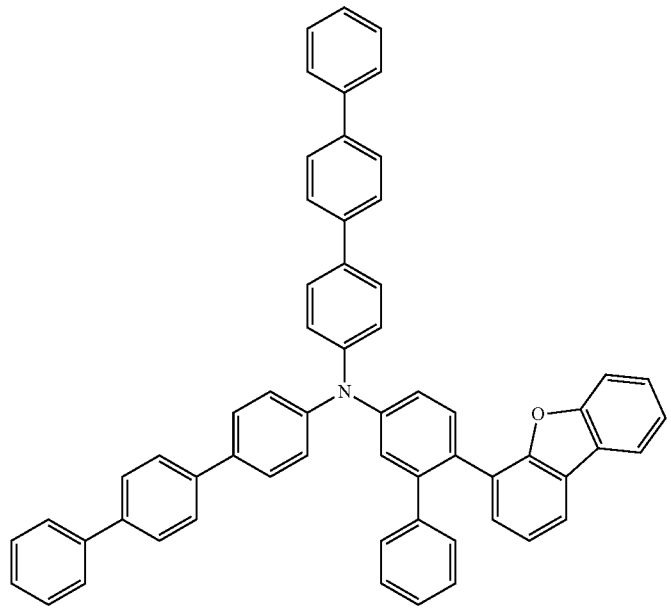

F33

A specific structure of the organic electroluminescent device according to the present invention, a method for fabricating the device, and materials for the organic layers will be described below.

First, a material for the anode is coated on the substrate to form the anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide, such as indium tin oxide (ITO), indium zinc oxide (IZO), tin oxide ($SnO_2$) or zinc oxide (ZnO), is used as the anode material.

A material for the hole injecting layer is coated on the anode by vacuum thermal evaporation or spin coating to form the hole injecting layer. Then, a material for the hole transport layer is coated on the hole injecting layer by vacuum thermal evaporation or spin coating to form the hole transport layer.

The material for the hole injecting layer is not specially limited so long as it is usually used in the art. Specific examples of such materials include 4,4',4"-tris(2-naphthyl (phenyl)amino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), and N,N'-diphenyl-N,N'-bis[4-(phenyl-m-tolylamino)phenyl]biphenyl-4,4'-diamine (DNTPD).

The material for the hole transport layer is not specially limited so long as it is commonly used in the art. Examples of such materials include N,N'-bis(3-methylphenyl)-N,N'-diphenyl-[1,1-biphenyl]-4,4'-diamine (TPD) and N,N'-di (naphthalen-1-yl)-N,N'-diphenylbenzidine (α-NPD).

Subsequently, a hole auxiliary layer and the light emitting layer are sequentially laminated on the hole transport layer. A hole blocking layer may be optionally formed on the organic light emitting layer by vacuum thermal evaporation or spin coating. The hole blocking layer blocks holes from entering the cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it has the ability to transport electrons and a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, and Liq.

The electron transport layer is deposited on the hole blocking layer by vacuum thermal evaporation or spin coating, and the electron injecting layer is formed thereon. A metal for the cathode is deposited on the electron injecting layer by vacuum thermal evaporation to form the cathode, completing the fabrication of the organic electroluminescent device.

As the metal for the formation of the cathode, there may be used, for example, lithium (Li), magnesium (Mg), aluminum (Al), aluminum-lithium (Al—Li), calcium (Ca), magnesium-indium (Mg—In) or magnesium-silver (Mg—Ag). The organic electroluminescent device may be of top emission type. In this case, a transmissive material, such as ITO or IZO, may be used to form the cathode.

The material for the electron transport layer functions to stably transport electrons injected from the cathode. The electron transport material may be any of those known in the art and examples thereof include, but are not limited to, quinoline derivatives, particularly, tris(8-quinolinolate)aluminum (Alq3), TAZ, Balq, beryllium bis(benzoquinolin-10-olate (Bebq2), ADN, and oxadiazole derivatives, such as PBD, BMD, and BND.

Each of the organic layers can be formed by a monomolecular deposition or solution process. According to the monomolecular deposition process, the material for each layer is evaporated under heat and vacuum or reduced pressure to form the layer in the form of a thin film. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

The present invention will be explained in more detail with reference to the following examples. However, it will be obvious to those skilled in the art that these examples are in no way intended to limit the scope of the invention.

Synthesis Example 1: Synthesis of Compound 1

(1) Synthesis Example 1-1. Synthesis of the Compound of Formula 1-a

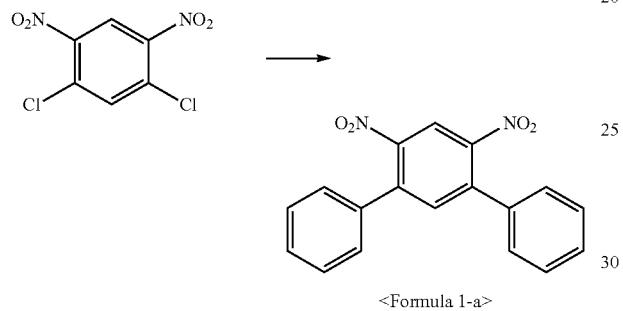

<Formula 1-a>

1,5-Dichloro-2,4-dinitrobenzene (40.0 g, 0.123 mol), phenylboronic acid (44.9 g, 0.368 mol), tetrakis(triphenylphosphine)palladium (2.8 g, 0.0025 mol), potassium carbonate (50.9 g, 0.368 mol), ethanol (120 mL), toluene (200 mL), and water (120 mL) were placed in a 1000 mL round bottom flask. The mixture was refluxed. After completion of the reaction, the reaction mixture was extracted with water and ethyl acetate. The organic layer was dried over anhydrous magnesium sulfate and concentrated under reduced pressure. The concentrate was purified by column chromatography using hexane/ethyl acetate as the eluent to afford the compound of Formula 1-a (27.5 g, yield 70.0%).

(2) Synthesis Example 1-2. Synthesis of the Compound of Formula 1-b

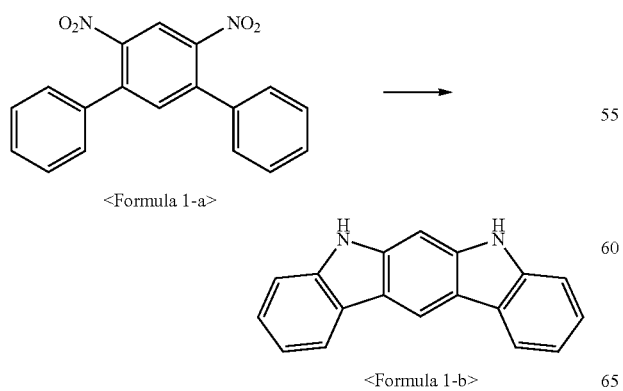

<Formula 1-a>

<Formula 1-b>

The compound of Formula 1-a (27.5 g, 0.086 mmol), triethylphosphite (57.8 g, 0.348 mol), and tert-butylbenzene (550 mL) were placed in a 1000 mL round bottom flask. The mixture was refluxed with stirring. After completion of the reaction, the reaction mixture was recrystallized from dichloromethane and methanol to afford the compound of Formula 1-b (10.8 g, yield 49.0%).

(3) Synthesis Example 1-3. Synthesis of the Compound of Formula 1-c

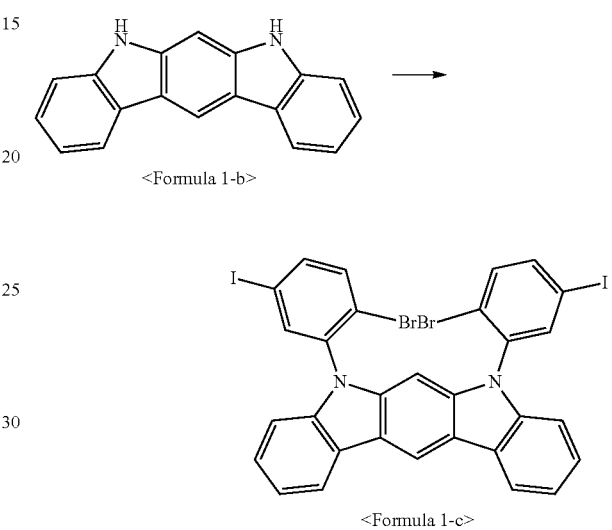

<Formula 1-b>

<Formula 1-c>

The compound of Formula 1-b (12 g, 0.047 mol), 1-bromo-2-fluoro-4-iodobenzene (56.4 g, 0.187 mol), and cesium carbonate (61.0 g, 0.187 mol) were sequentially placed in a 250 mL round bottom flask, and dimethylformamide (300 mL) was added thereto. The mixture was heated to reflux at 153° C. for 1 day. After completion of the reaction, the reaction mixture was extracted with methylene chloride (500 mL) and distilled water (300 mL). The organic layer was concentrated under reduced pressure. The concentrate was purified by column chromatography (methylene chloride/hexane=1/5) to afford the compound of Formula 1-c (32.2 g, yield 84%).

(4) Synthesis Example 1-4. Synthesis of the Compound of Formula 1-d

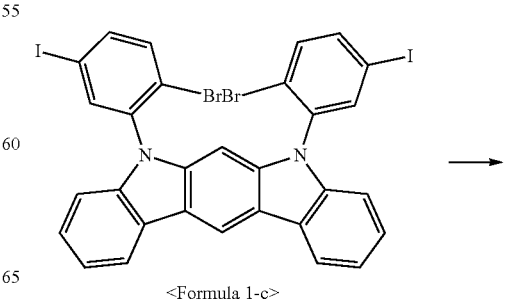

<Formula 1-c>

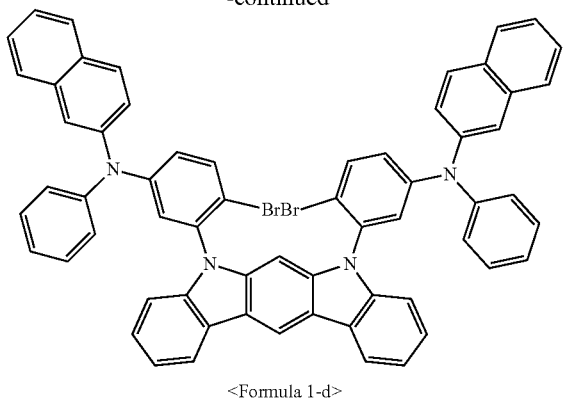

<Formula 1-d>

The compound of Formula 1-c (32.2 g, 0.039 mol), N-phenyl-2-naphthaleneamine (13.3 g, 0.079 mol), tris(dibenzylideneacetone)dipalladium(0) (1.4 g, 0.0016 mol), sodium tert-butoxide (7.6 g, 0.079 mol), and toluene (320 mL) were placed in a 500 mL round bottom flask. The mixture was refluxed. After completion of the reaction, the hot reaction mixture was filtered and concentrated under reduced pressure. The concentrate was purified by column chromatography using methylene chloride/hexane as the eluent to afford the compound of Formula 1-d (21.2 g, yield 60%).

(5) Synthesis Example 1-5. Synthesis of the Compound of Formula 1

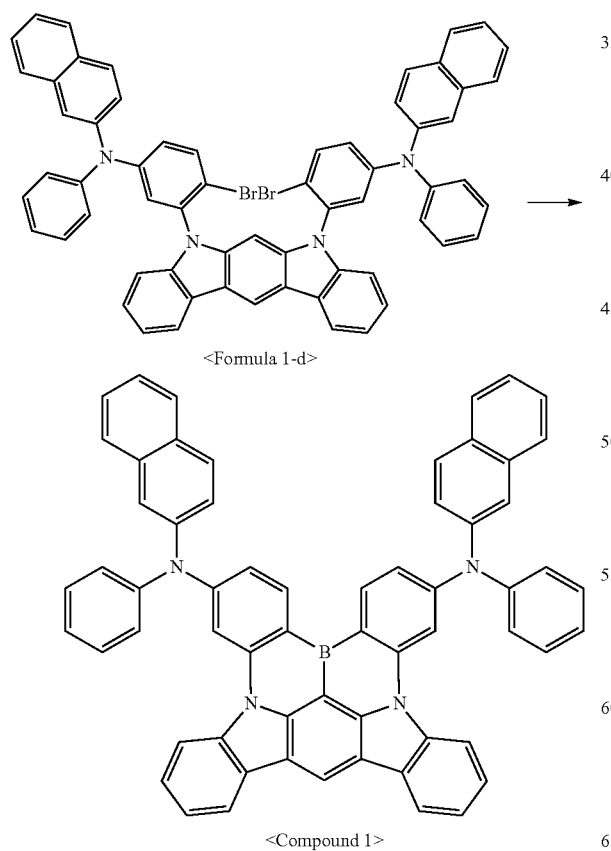

<Formula 1-d>

<Compound 1>

The compound of Formula 1-d (21.3 g, 0.024 mol) and tert-butylbenzene (160 mL) were placed in a 500 mL round bottom flask under a stream of nitrogen gas, cooled to −40° C., and added dropwise with n-butyllithium (44.2 mL). After the dropwise addition was finished, the mixture was heated to 60° C. to remove hexane. The reaction temperature was reduced to −40° C. and boron tribromide (11.8 g, 0.047 mol) was added dropwise to the reaction mixture. After the dropwise addition was finished, the resulting mixture was stirred at room temperature for 30 min. The reaction mixture was again cooled to 0° C. and diisopropylethylamine (6.1 g, 0.047 mol) was added dropwise thereto. After the dropwise addition was finished, the reaction mixture was stirred at 120° C. for 3 h. After completion of the reaction, an aqueous sodium acetate solution (100 mL) was added dropwise to the reaction mixture. The resulting mixture was extracted with ethyl acetate and water. The organic layer was concentrated under reduced pressure and purified by column chromatography using hexane/methylene chloride as the eluent to give Compound 1 (2.3 g, yield 13%).

MS (MALDI-TOF): m/z 851.3 [M$^+$]

Synthesis Example 2: Synthesis of Compound 3

(1) Synthesis Example 2-1. Synthesis of the Compound of Formula 2-a

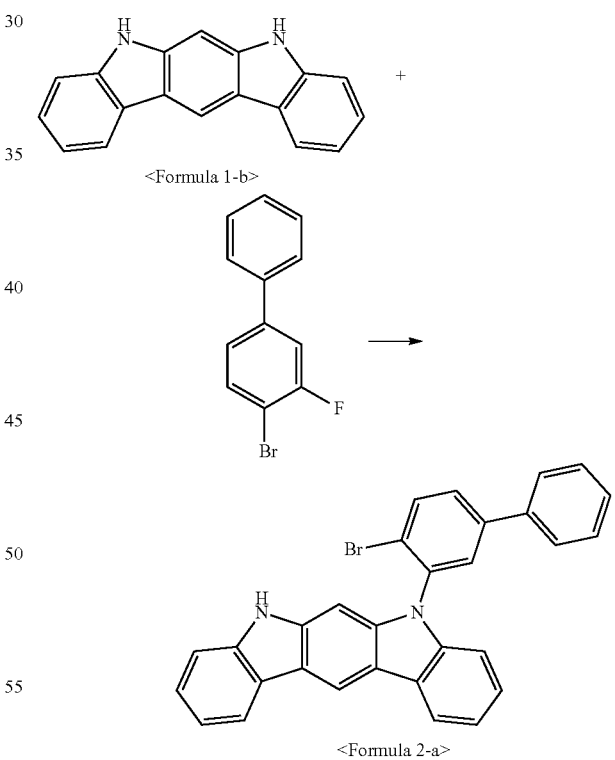

<Formula 1-b>

<Formula 2-a>

The compound of Formula 1-b (7.96 g, 0.031 mol), 4-bromo-3-fluoro-1,1'-biphenyl (7.8 g, 0.031 mol), and cesium carbonate (10.12 g, 0.031 mol) were placed in a 500 mL round bottom flask, and dimethylformamide (159.2 mL) was added thereto. The mixture was heated to reflux at 150° C. for 1 day. After completion of the reaction, the reaction mixture was extracted with methylene chloride and distilled water. The organic layer was concentrated under reduced pressure and purified by column chromatography using methylene chloride/heptane to afford the compound of Formula 2-a (7.28 g, yield 48%).

(2) Synthesis Example 2-2. Synthesis of the Compound of Formula 2-b

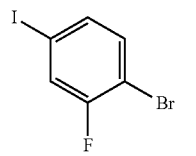

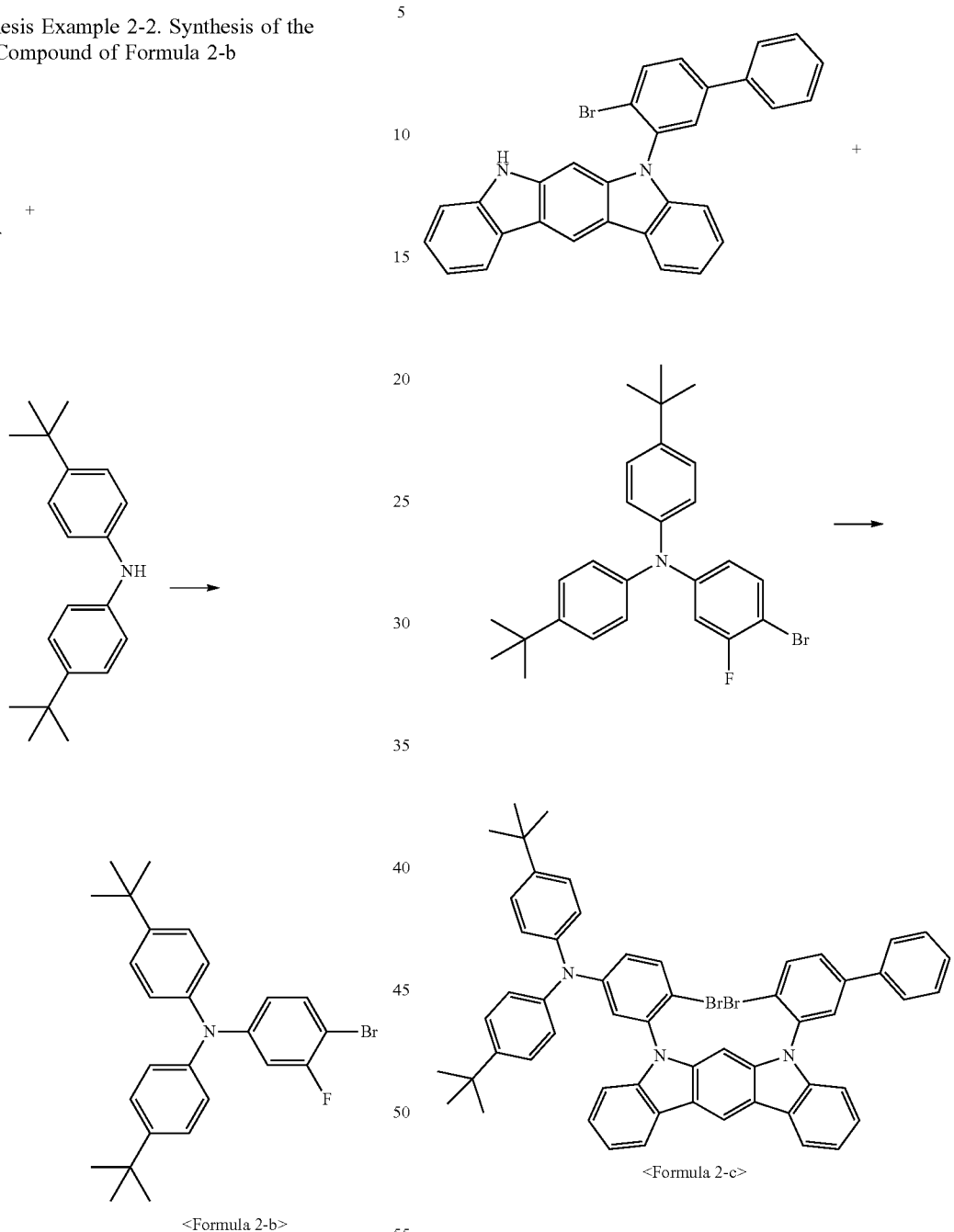

1-Bromo-2-fluoro-4-iodobenzene (30 g, 0.11 mol), bis(4-(tert-butyl)phenyl)amine (25.25 g, 0.090 mol), tris(dibenzylideneacetone)dipalladium(0) (4.57 g, 0.005 mol), sodium tert-butoxide (13.42 g, 0.140 mol), Dppf (5.53 g, 0.010 mol), and toluene (360 mL) were placed in a round bottom flask. The mixture was refluxed. After completion of the reaction, the hot reaction mixture was filtered, concentrated under reduced pressure, and purified by column chromatography using methylene chloride/heptane to afford the compound of Formula 2-b (18.55 g, yield 40.5%).

(3) Synthesis Example 2-3. Synthesis of the Compound of Formula 2-c

The compound of Formula 2-a (7.69 g, 0.0158 mol), the compound of Formula 2-b (10.75 g, 0.024 mol), tris(dibenzylideneacetone)dipalladium(0) (1.4 g, 0.0016 mol), and cesium carbonate (7.71 g, 0.024 mol) were placed in a round bottom flask, and dimethylformamide (153.8 mL) was added thereto. The mixture was heated to reflux at 150° C. for 1 day. After completion of the reaction, the reaction mixture was extracted with ethyl acetate and distilled water. The organic layer was concentrated under reduced pressure and purified by column chromatography using methylene chloride/heptane to afford the compound of Formula 2-c (14.54 g, yield 99%).

(4) Synthesis Example 2-4. Synthesis of Compound 3

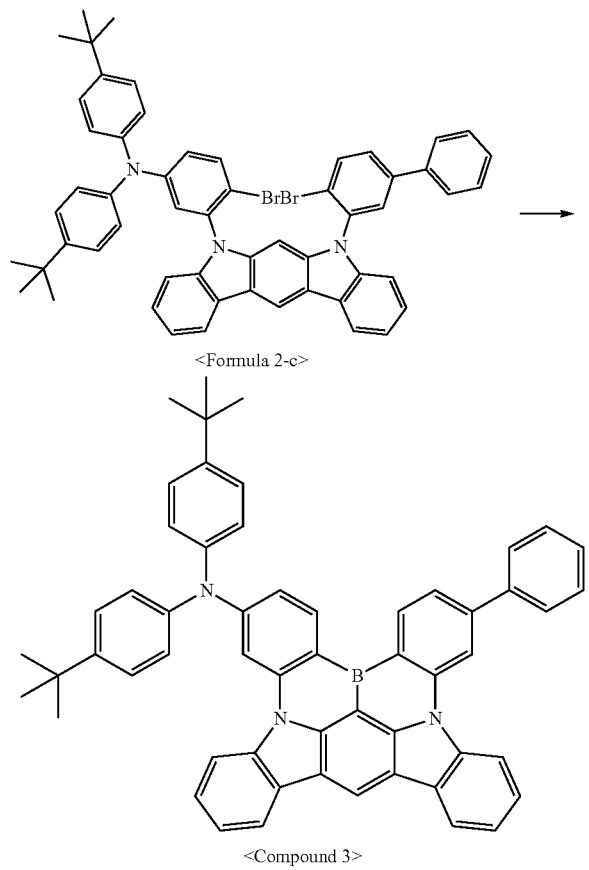

<Formula 2-c>

<Compound 3>

The compound of Formula 2-c (14.54 g, 0.016 mol) and tert-butylbenzene (218 mL) were placed in a round bottom flask under a stream of nitrogen gas, cooled to −40° C., and added dropwise with n-butyllithium (29.58 mL). After the dropwise addition was finished, the mixture was heated to 60° C. to remove hexane. The reaction temperature was reduced to −40° C. and boron tribromide (7.9 g, 0.032 mol) was added dropwise to the reaction mixture. After the dropwise addition was finished, the resulting mixture was stirred at room temperature for 1 h. The reaction mixture was again cooled to 0° C. and diisopropylethylamine (4.08 g, 0.032 mol) was added dropwise thereto. After the dropwise addition was finished, the reaction mixture was stirred at 120° C. for 3 h. After completion of the reaction, an aqueous sodium acetate solution was added dropwise to the reaction mixture. The resulting mixture was extracted with ethyl acetate and water. The organic layer was concentrated under reduced pressure and purified by column chromatography using hexane/methylene chloride to give Compound 3 (1 g, yield 8.2%).

MS (MALDI-TOF): m/z 772.5 [M+]

Synthesis Example 3: Synthesis of Compound 5

Compound 5 was prepared (4.5 g, yield 17%) in the same manner as in Synthesis Example 1, except that B-[3-(diphenylamino)phenylboronic acid and B-[3-(diphenylboryl)phenylboronic acid were used instead of phenylboronic acid in Synthesis Example 1-1 and 1-bromo-2-fluorobenzene and 2-bromo-3-fluoronaphthalene were used instead of 1-bromo-2-fluoro-4-iodobenzene in Synthesis Example 1-3.

MS (MALDI-TOF): m/z 798.3 [M+]

Synthesis Example 4: Synthesis of Compound 7

Compound 7 was prepared (3.4 g, yield 26%) in the same manner as in Synthesis Example 1, except that phenylboronic acid and 1-naphthylboronic acid were used instead of phenylboronic acid in Synthesis Example 1-1 and carbazole was used instead of N-phenyl-2-naphthaleneamine in Synthesis Example 1-4.

MS (MALDI-TOF): m/z 797.3 [M+]

Synthesis Example 5: Synthesis of Compound 8

Compound 8 was prepared (2.9 g, yield 25%) in the same manner as in Synthesis Example 1, except that N-phenyl-2-dibenzofuranamine was used instead of N-phenyl-2-naphthaleneamine in Synthesis Example 1-4.

MS (MALDI-TOF): m/z 1083.4 [M+]

Synthesis Example 6: Synthesis of Compound of Formula 9

Compound 9 was prepared (2.7 g, yield 21%) in the same manner as in Synthesis Example 1, except that 4-(1-naphthalenyl)-N-[4-(2-naphthalenyl)phenyl]benzenamine was used instead of N-phenyl-2-naphthaleneamine in Synthesis Example 1-4.

MS (MALDI-TOF): m/z 1255.6 [M+]

Examples 1-6: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to 1×10⁻⁶ torr. DNTPD (700 Å) and the compound of Formula H (250 Å) were deposited in this order on the ITO glass. A mixture of BH1 as a host and each of Compound 1, 3, 5, 6, 7, and 9 (3 wt %) was used to form a 250 Å thick light emitting layer. Thereafter, the compound of Formula E-1 and the compound of Formula E-2 in a ratio of 1:1 were used to form a 300 Å thick electron transport layer on the light emitting layer. The compound of Formula E-1 was used to form a 5 Å thick electron injecting layer on the electron transport layer. Al was deposited on the electron injecting layer to form a 1000 Å thick Al electrode, completing the fabrication of an organic electroluminescent device. The luminescent properties of the organic electroluminescent device were measured at 0.4 mA.

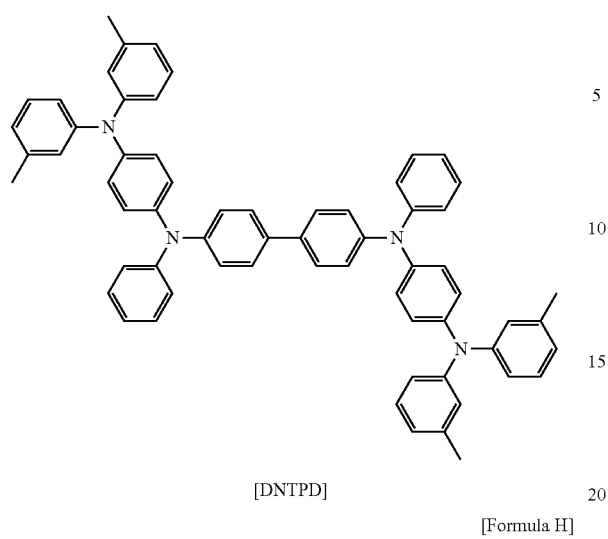
[DNTPD]
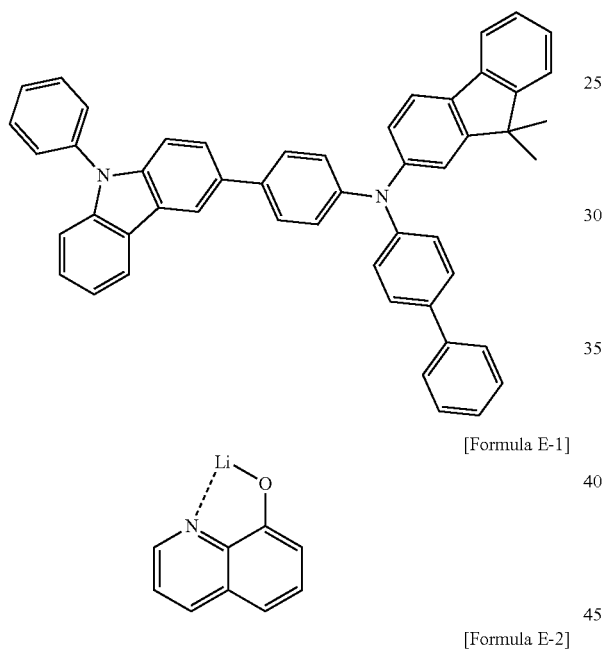
[Formula E-1]
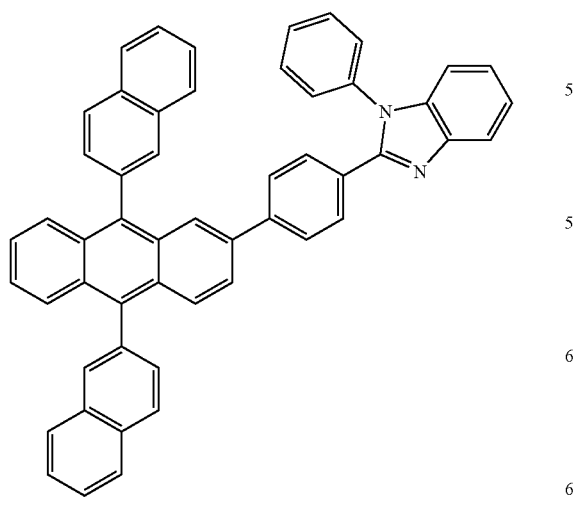
[Formula H]
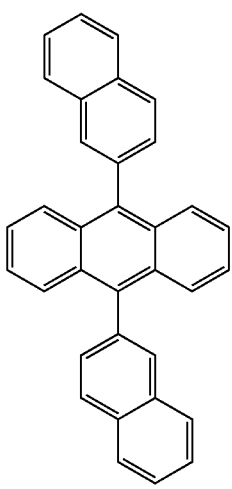
[Formula E-2]
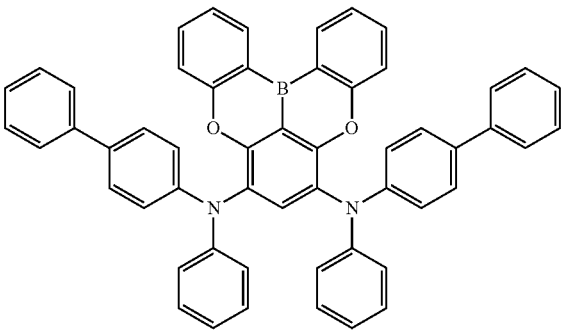
[BH1]
Comparative Examples 1-3
Organic electroluminescent devices were fabricated in the same manner as in Example 1, except that BD1, BD1, and BD3 were used instead of Compound 1.
[BD1]
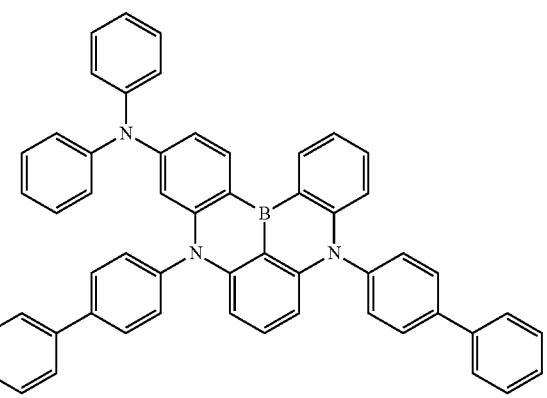
[BD2]

-continued

[BD3]

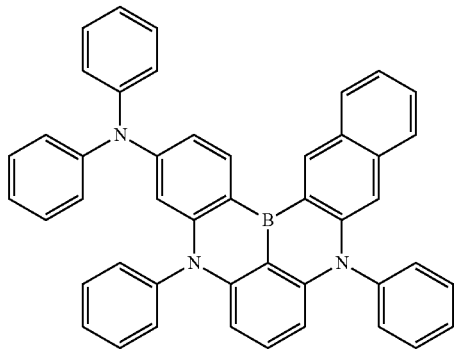

The organic electroluminescent devices of Examples 1-6 and Comparative Examples 1-3 were measured for voltage, current, luminance, color coordinates, and lifetime. The results are shown in Table 1.

TABLE 1

| Example No. | Dopant | Current density | External quantum efficiency (%) | T90 (hr) |
|---|---|---|---|---|
| Example 1 | Compound 1 | 10 | 7.9 | 141 |
| Example 2 | Compound 3 | 10 | 8.1 | 150 |
| Example 3 | Compound 5 | 10 | 8.2 | 139 |
| Example 4 | Compound 6 | 10 | 8.2 | 157 |
| Example 5 | Compound 7 | 10 | 8.5 | 162 |
| Example 6 | Compound 9 | 10 | 8.1 | 165 |
| Comparative Example 1 | BD1 | 10 | 4.9 | 63 |
| Comparative Example 2 | BD2 | 10 | 5.3 | 83 |
| Comparative Example 3 | BD3 | 10 | 5.2 | 77 |

What is claimed is:

1. An organic electroluminescent compound represented by Formula A:

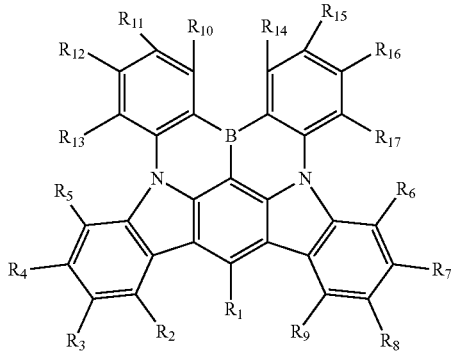

(A)

wherein $R_1$ to $R_{17}$ are each independently selected from the group consisting of hydrogen, deuterium, substituted or unsubstituted $C_1$-$C_{20}$ alkyl, substituted or unsubstituted $C_2$-$C_{20}$ alkenyl, substituted or unsubstituted $C_3$-$C_{20}$ cycloalkyl, substituted or unsubstituted $C_5$-$C_{20}$ cycloalkenyl, substituted or unsubstituted $C_1$-$C_{20}$ alkoxy, substituted or unsubstituted $C_6$-$C_{30}$ aryloxy, substituted or unsubstituted $C_1$-$C_{20}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_6$-$C_{50}$ aryl, substituted or unsubstituted $C_3$-$C_{50}$ heteroaryl, substituted or unsubstituted germanium, substituted or unsubstituted boron, substituted or unsubstituted aluminum, carbonyl, phosphoryl, amino, nitrile, hydroxyl, nitro, halogen, selenium, tellurium, amide, and ester, with the proviso that $R_{10}$ and $R_{14}$ optionally forms a fused aliphatic, aromatic, heteroaliphatic or heteroaromatic ring.

2. The organic electroluminescent compound according to claim 1, wherein the organic electroluminescent compound represented by Formula A is selected from the following compounds:

1

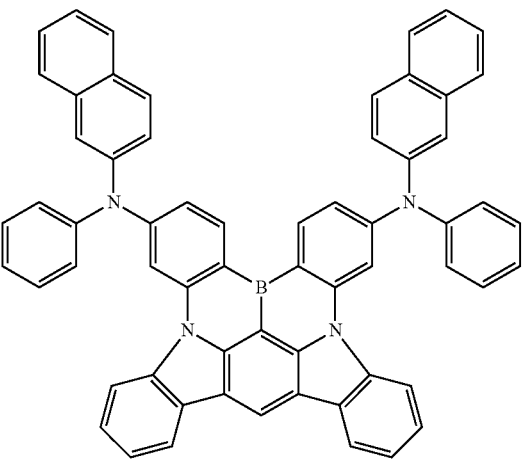

2

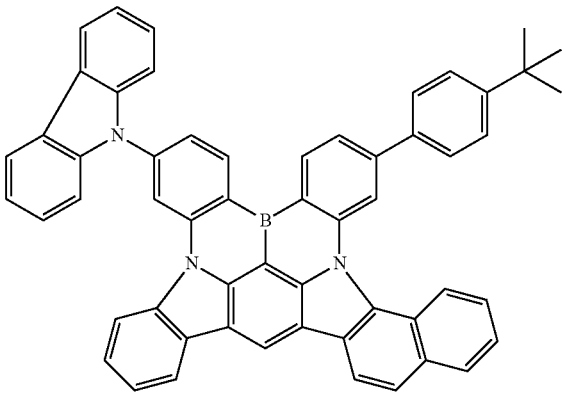

-continued
3
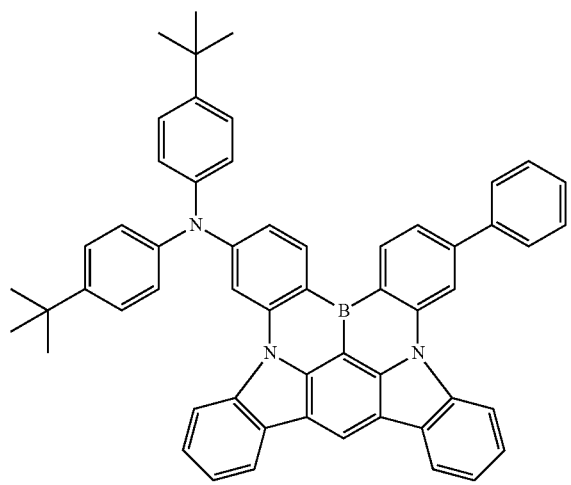
4
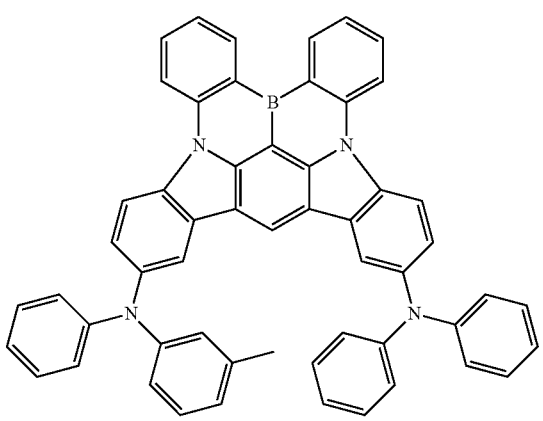
5
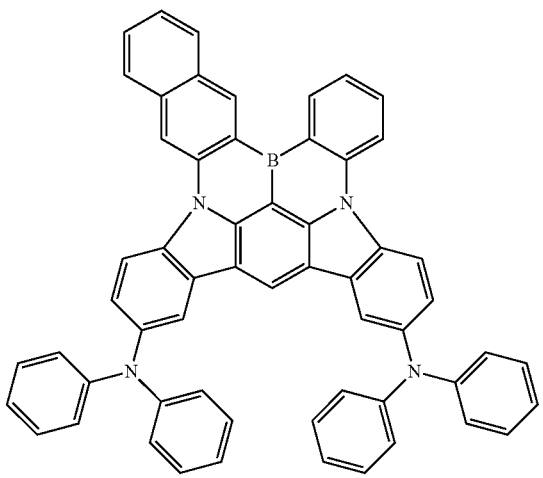
-continued
6
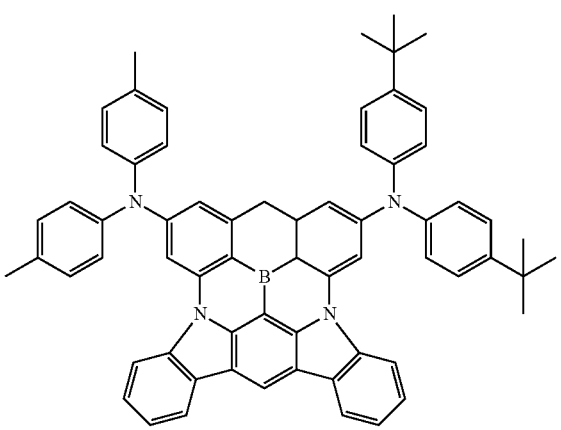
7
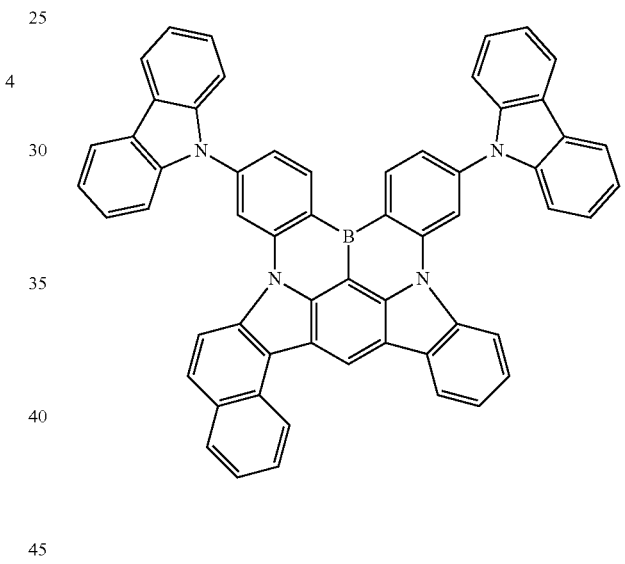
8
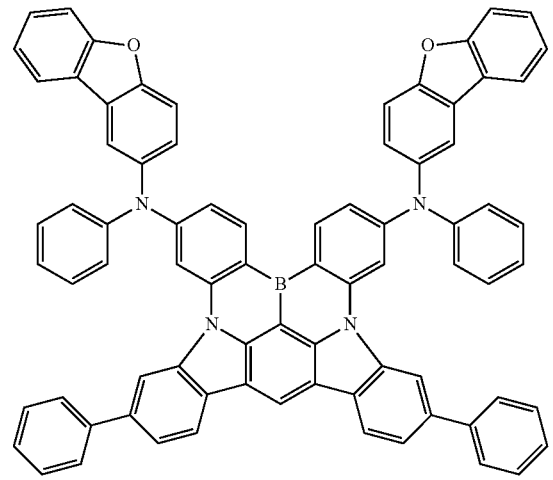

9
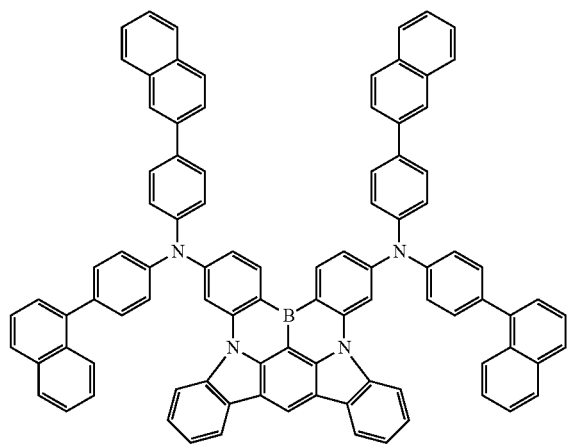
12
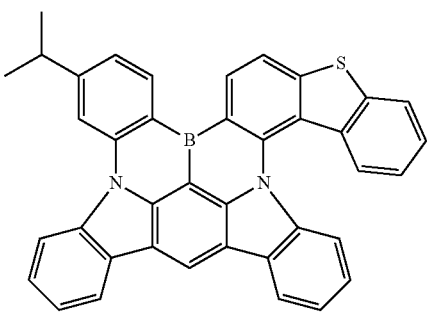
10
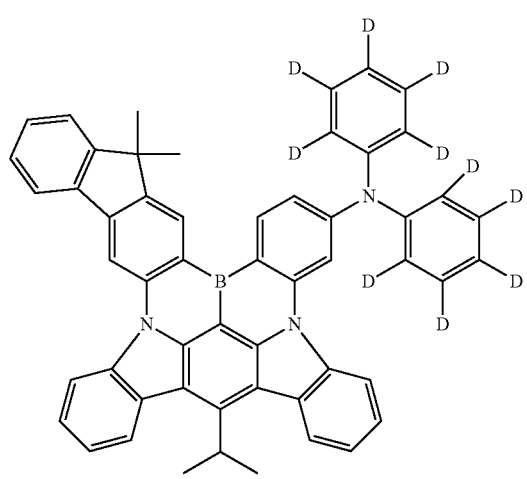
13
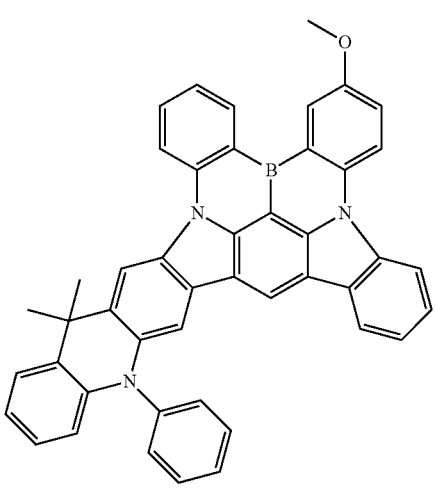
11
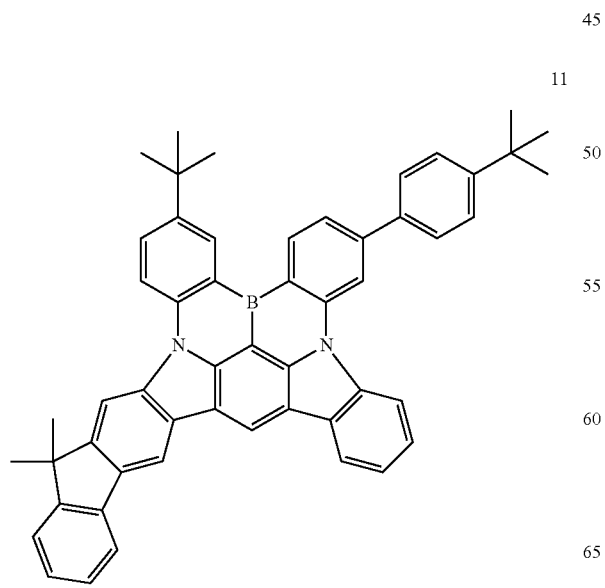
14
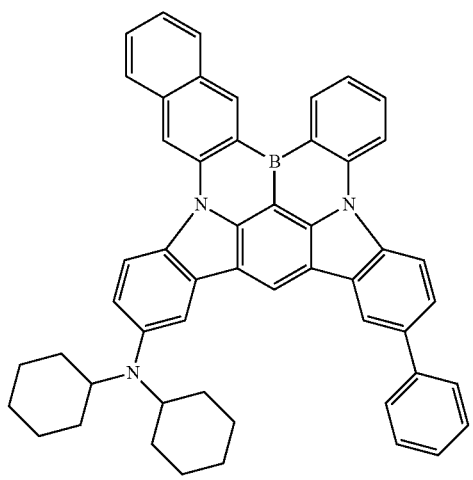

-continued
16
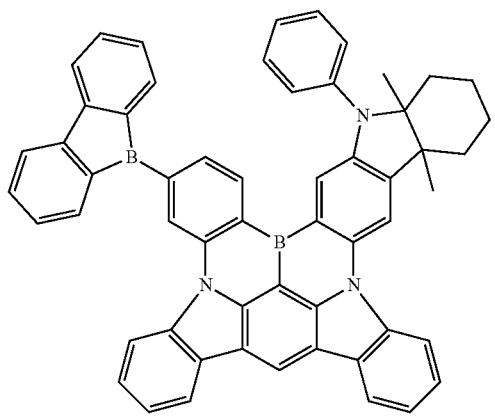
17
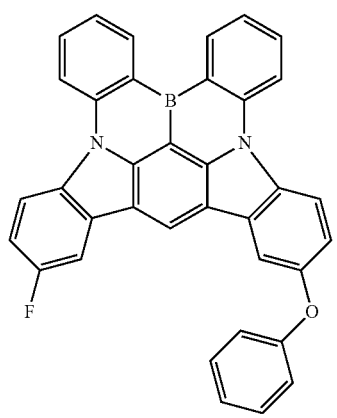
18
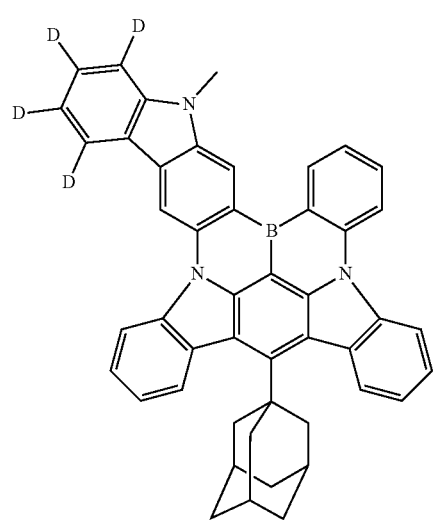
-continued
19
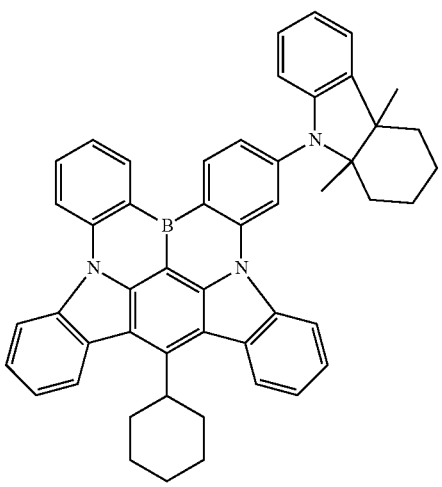
20
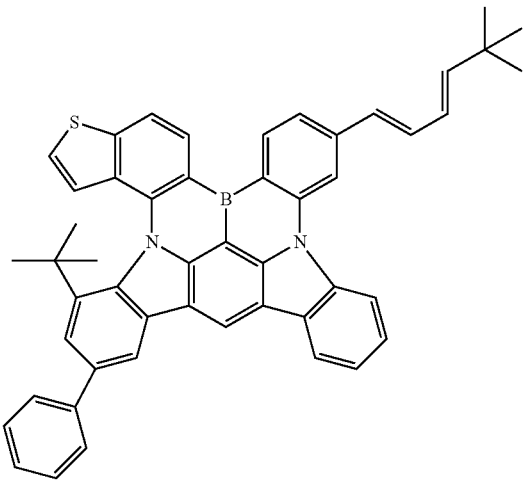
22
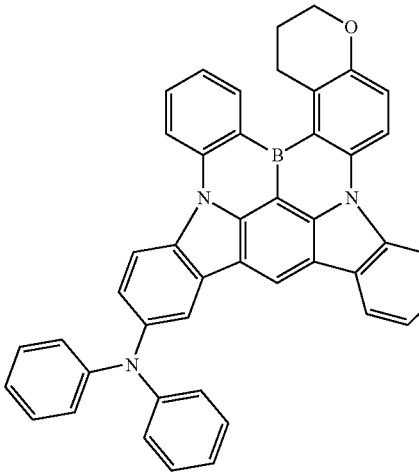

23

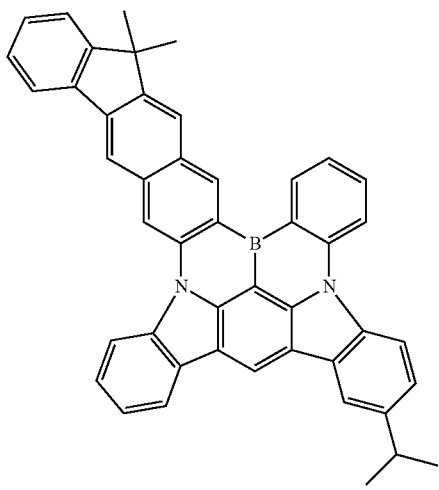

25

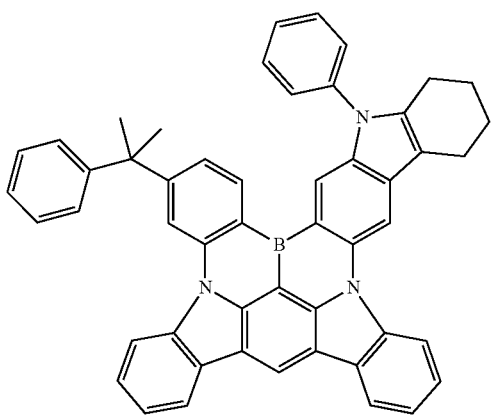

26

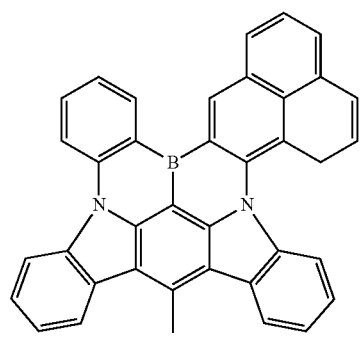

27

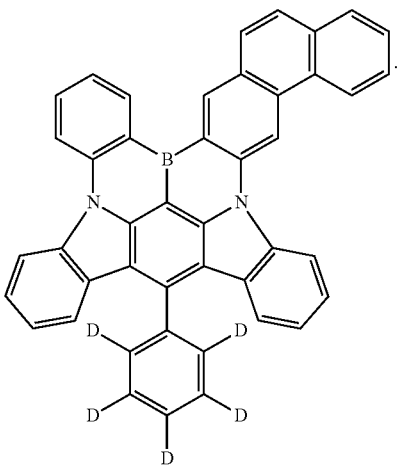

3. An organic electroluminescent device comprising a first electrode, a second electrode opposite to the first electrode, and one or more organic layers interposed between the first and second electrodes wherein at least one of the organic layers comprises the organic electroluminescent compound represented by Formula A according to claim 1 and optionally another organic electroluminescent compound represented by Formula A.

4. The organic electroluminescent device according to claim 3, wherein the organic layers comprise an electron injecting layer, an electron transport layer, a hole injecting layer, a hole transport layer, an electron blocking layer, a hole blocking layer, and a light emitting layer, and at least one of the organic layers comprises the organic electroluminescent compound represented by Formula A.

5. The organic electroluminescent device according to claim 4, wherein the light emitting layer comprises, as a host compound, an anthracene derivative represented by Formula C:

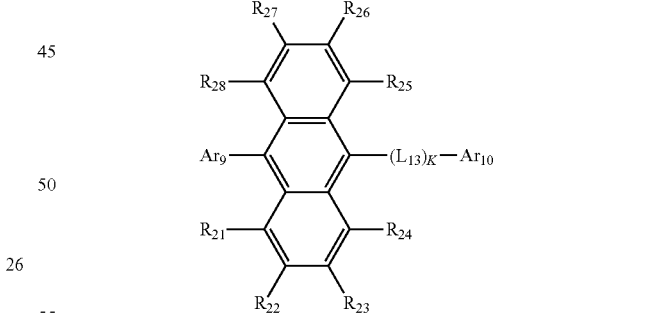

(C)

wherein $R_{21}$ to $R_{28}$ are identical to or different from each other and are as defined for $R_1$ to $R_{17}$ in Formula A representing the organic electroluminescent compound according to claim 1, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, and k is an integer from 1 to 3, provided that when k is 2 or more, the linkers $L_{13}$ are identical to or different from each other.

6. The organic electroluminescent device according to claim 5, wherein $Ar_9$ in Formula C is represented by Formula C-1:

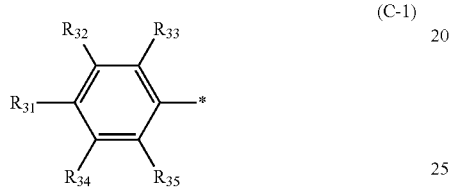

(C-1)

wherein $R_{31}$ to $R_{35}$ are identical to or different from each other and are as defined for $R_1$ to $R_{17}$ in Formula A representing the organic electroluminescent compound according to claim 1 and each of $R_{31}$ to $R_{35}$ is optionally bonded to an adjacent substituent to form a saturated or unsaturated ring.

7. The organic electroluminescent device according to claim 6, wherein the compound of Formula C is selected from the compounds of Formulae C1 to C48:

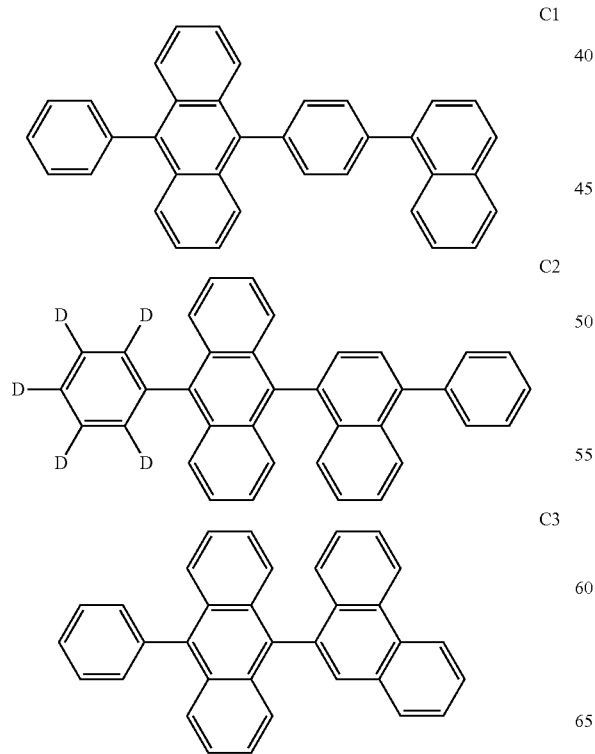

C1

C2

C3

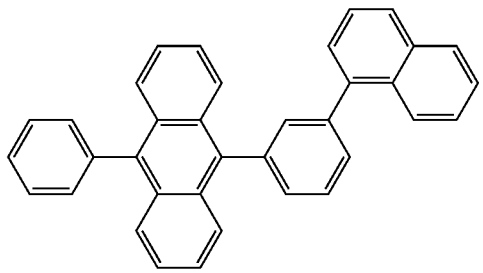

C4

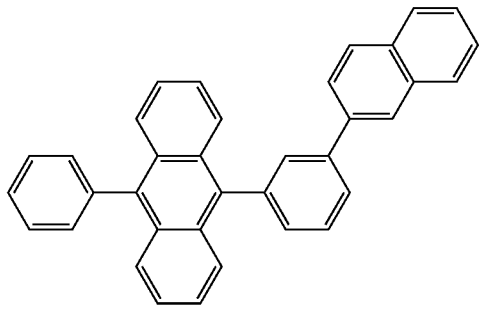

C5

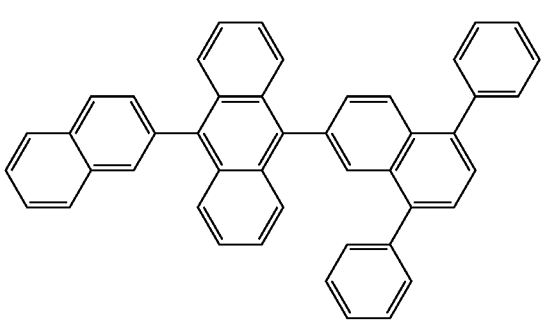

C6

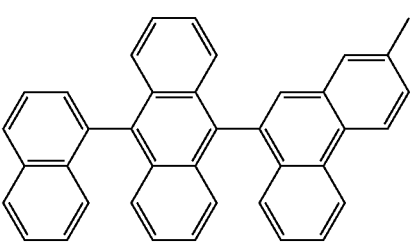

C7

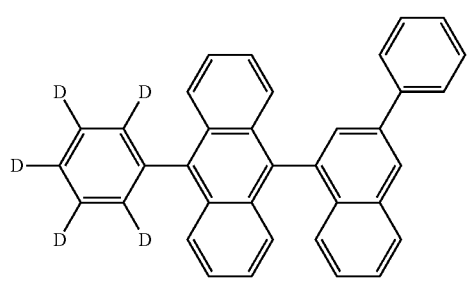

C8

-continued
C9
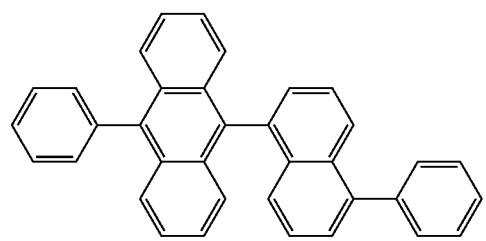
C10
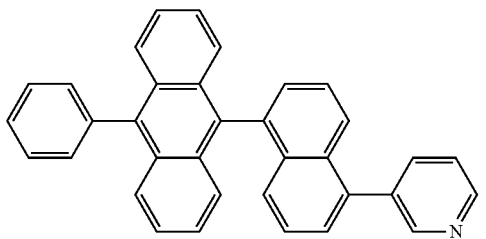
C11
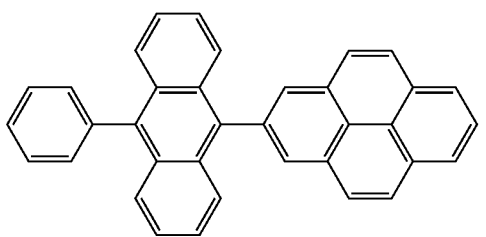
C12
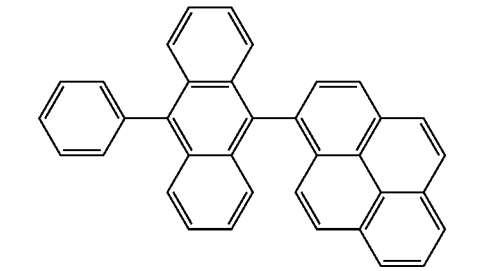
C13
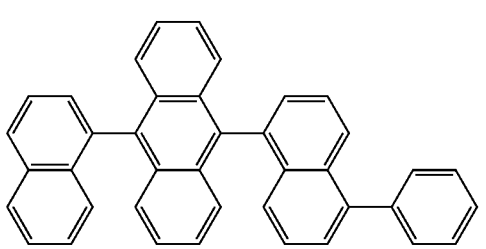
C14
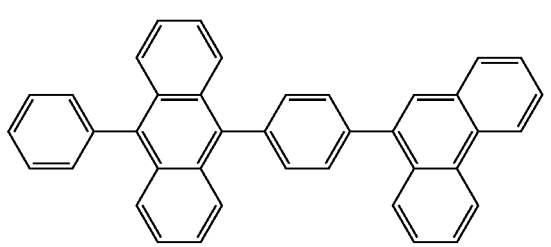
-continued
C15
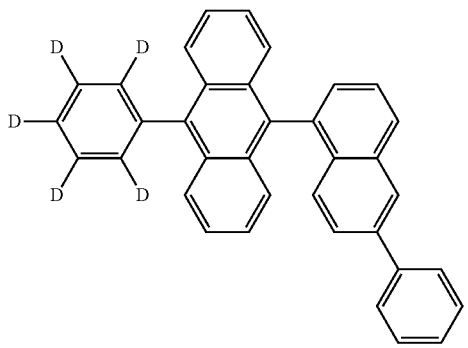
C16
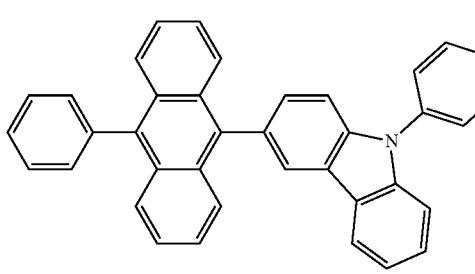
C17
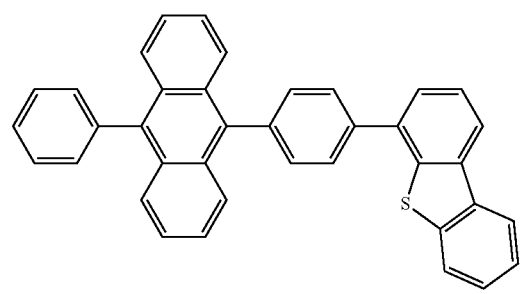
C18
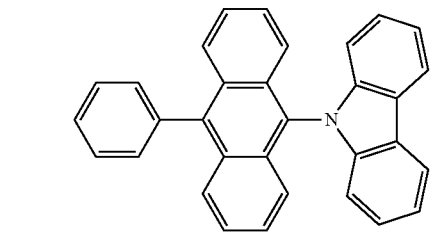
C19
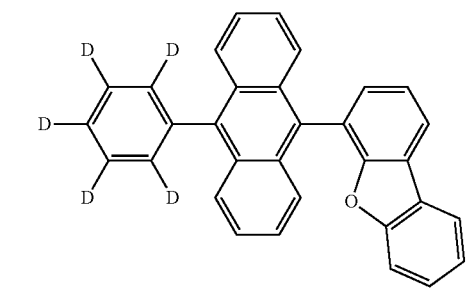

C20
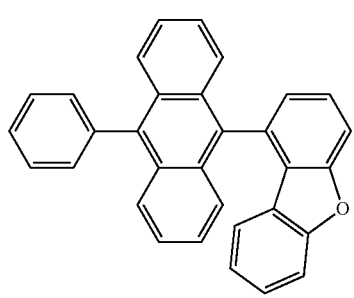
C21
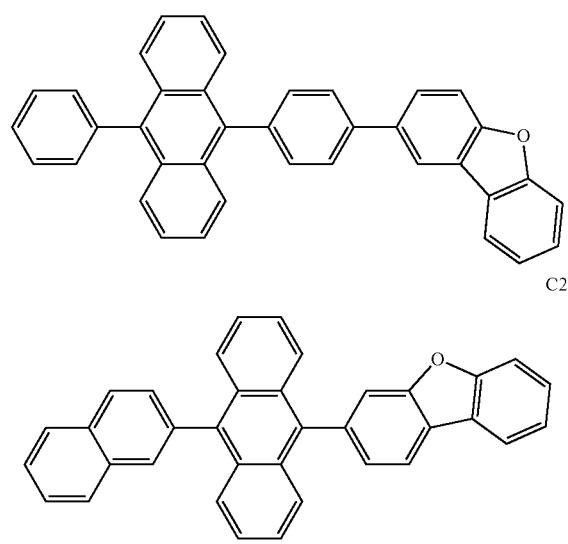
C22
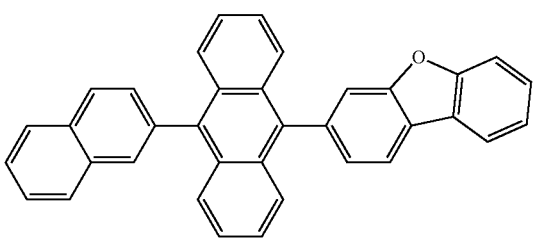
C23
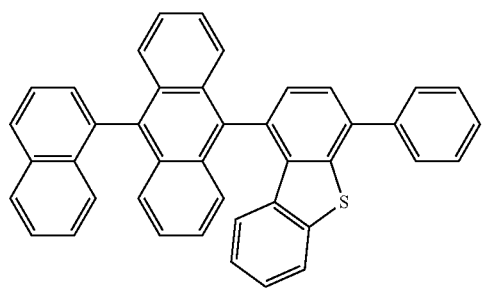
C24
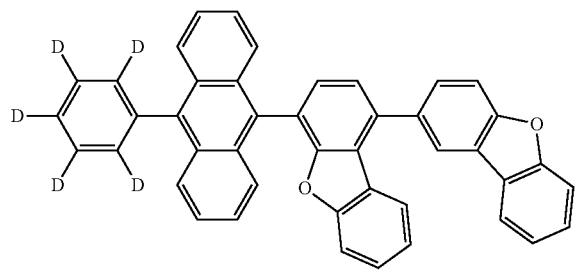
C25
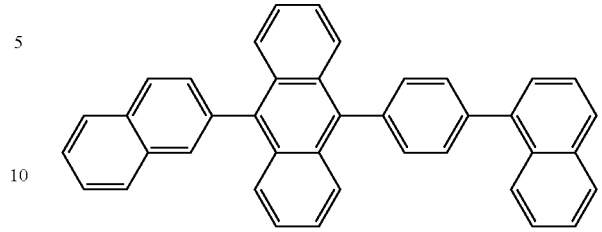
C26
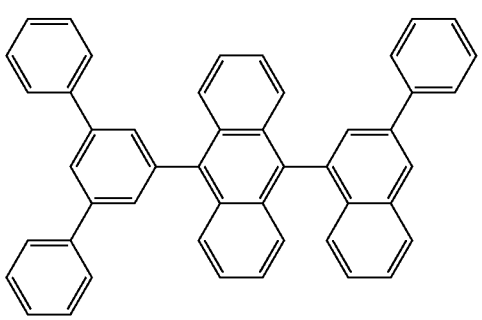
C27
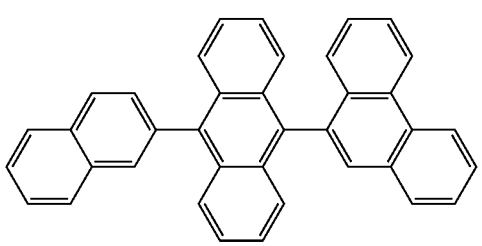
C28
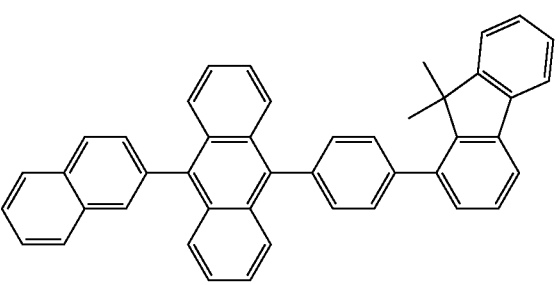
C29
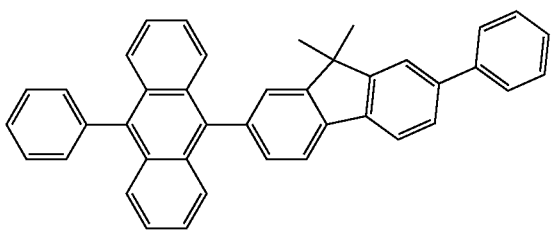

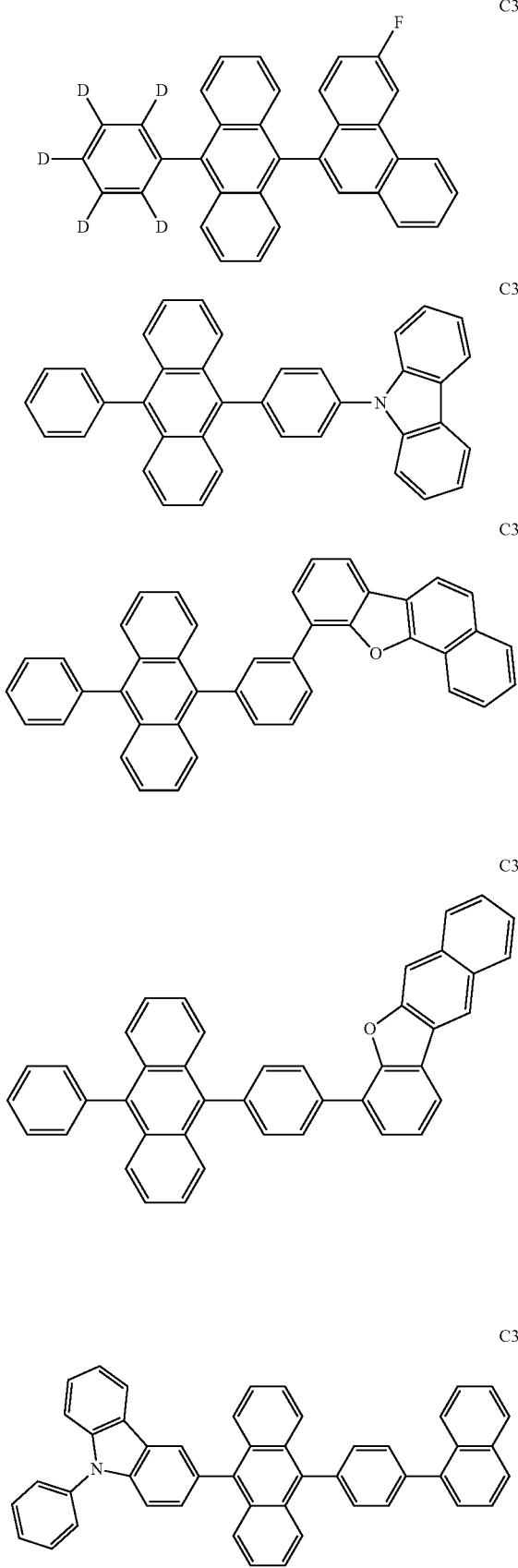
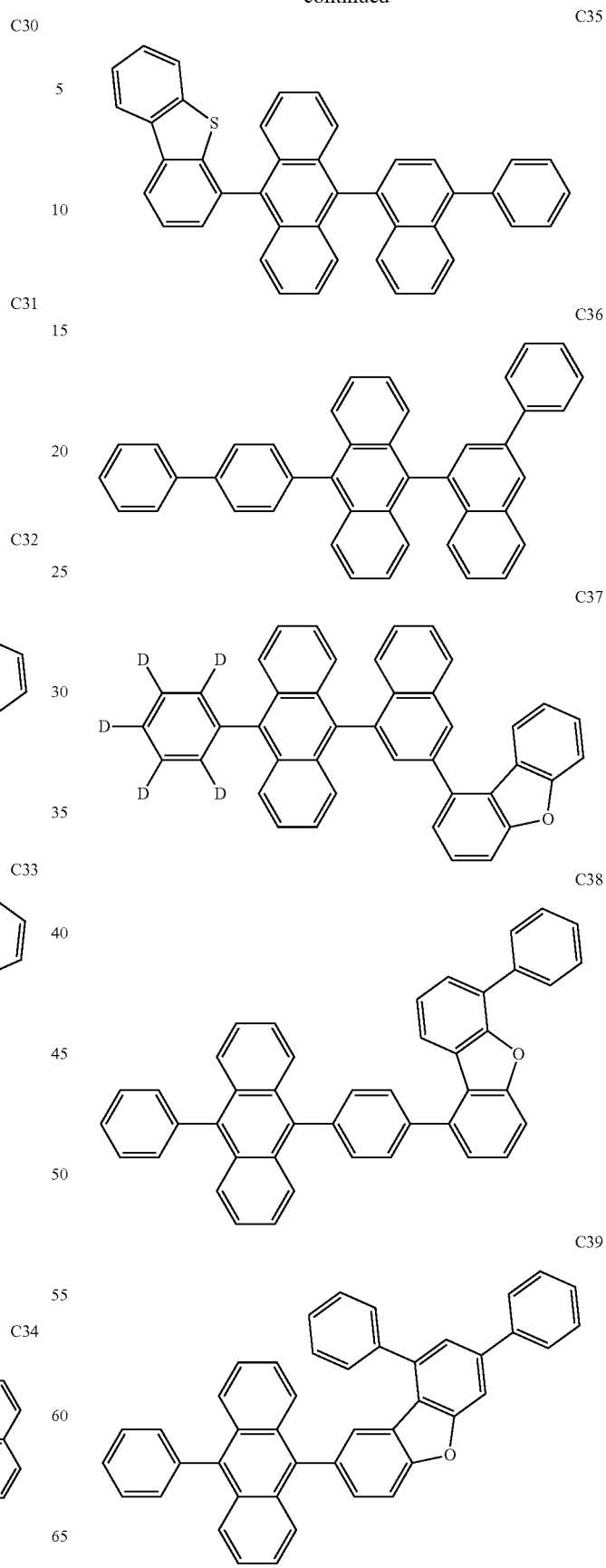

-continued
C40
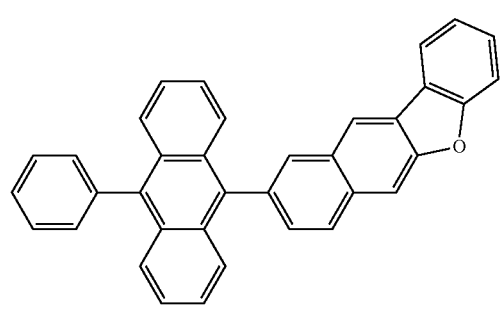
C41
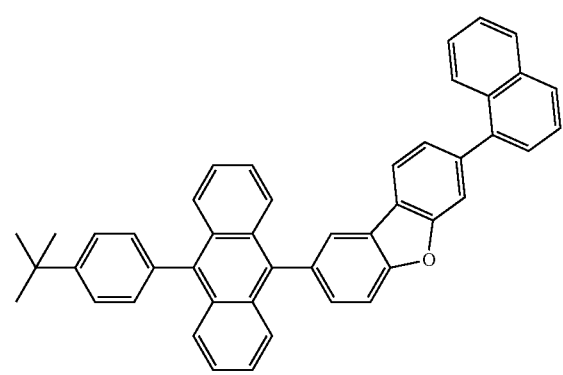
C42
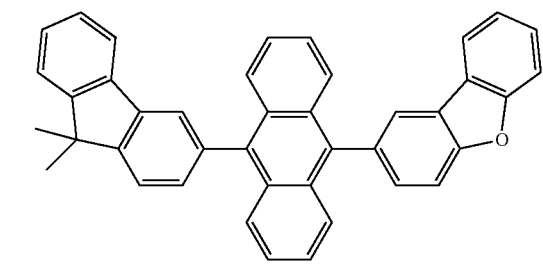
C43
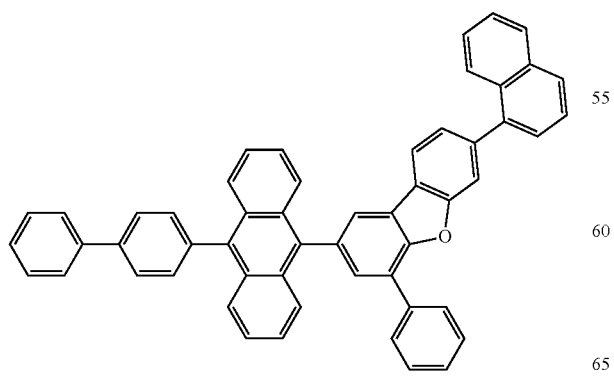
-continued
C44
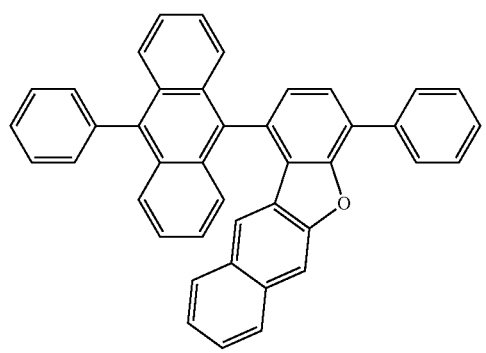
C45
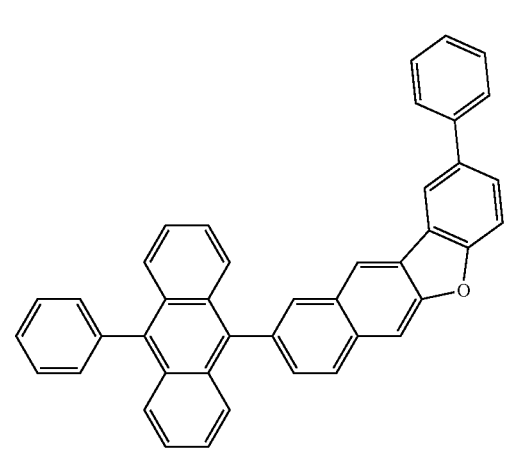
C46
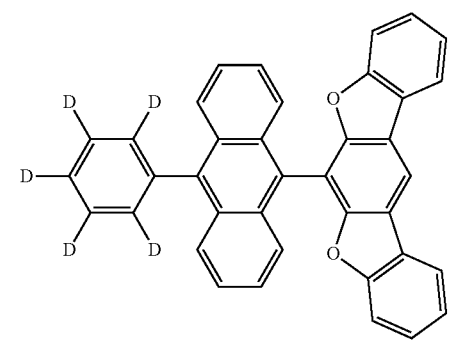
C47
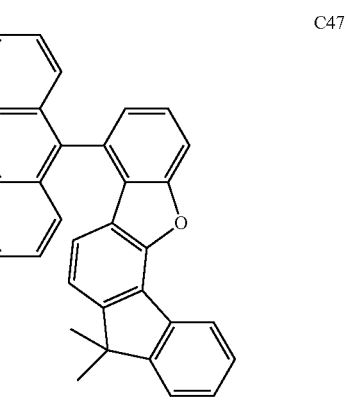

-continued

C48

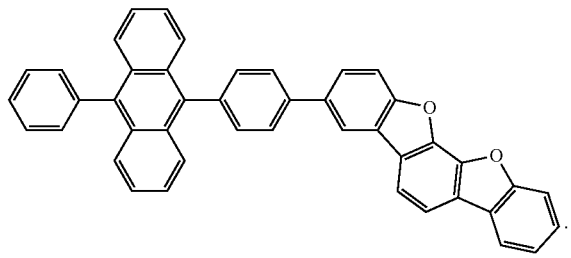

8. An organic electroluminescent device comprising a first electrode, a second electrode opposite to the first electrode, and one or more organic layers interposed between the first and second electrodes,
   wherein at least one of the organic layers comprises the organic electroluminescent compound represented by Formula A, and optionally another organic electroluminescent compound represented by Formula A:

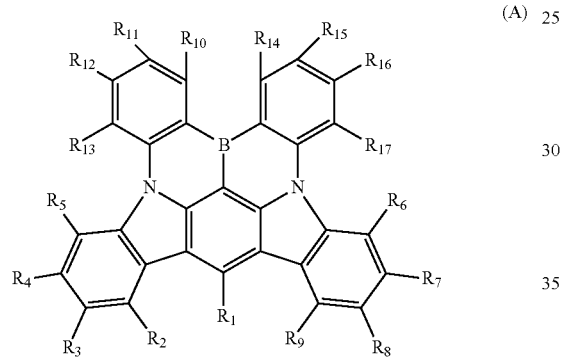

(A)

wherein $R_1$ to $R_{17}$ are each independently selected from the group consisting of hydrogen, deuterium, substituted or unsubstituted $C_1$-$C_{20}$ alkyl, substituted or unsubstituted $C_2$-$C_{20}$ alkenyl, substituted or unsubstituted $C_3$-$C_{20}$ cycloalkyl, substituted or unsubstituted $C_5$-$C_{20}$ cycloalkenyl, substituted or unsubstituted $C_1$-$C_{20}$ alkoxy, substituted or unsubstituted $C_6$-$C_{30}$ aryloxy, substituted or unsubstituted $C_1$-$C_{20}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_6$-$C_{50}$ aryl, substituted or unsubstituted $C_3$-$C_{50}$ heteroaryl, substituted or unsubstituted silyl, substituted or unsubstituted germanium, substituted or unsubstituted boron, substituted or unsubstituted aluminum, carbonyl, phosphoryl, amino, nitrile, hydroxyl, nitro, halogen, selenium, tellurium, amide, and ester, with the proviso that $R_{10}$ and $R_{14}$ optionally forms a fused aliphatic, aromatic, heteroaliphatic or heteroaromatic ring,
   wherein the organic electroluminescent device further comprises a capping layer formed on at least one of a lower surface of the first electrode and an upper surface of the second electrode opposite to the one or more organic layers, and
   wherein the capping layer comprises the compound represented by Formula A.

9. The organic electroluminescent device according to claim 8, wherein the capping layer is formed under the first electrode or on the second electrode.

10. The organic electroluminescent device according to claim 8, wherein each of the hole transport layer, the electron blocking layer, and the capping layer comprises a compound represented by Formula D:

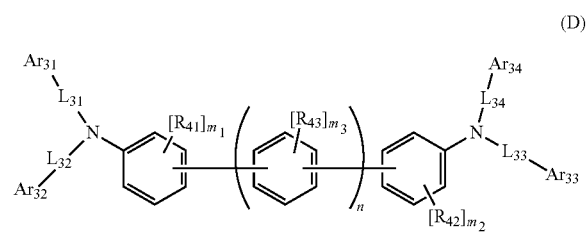

(D)

wherein $R_{41}$ to $R_{43}$ are identical to or different from each other and are each independently selected from hydrogen, deuterium, substituted or unsubstituted $C_1$-$C_{20}$ alkyl, substituted or unsubstituted $C_6$-$C_{50}$ aryl, substituted or unsubstituted $C_7$-$C_{50}$ arylalkyl, substituted or unsubstituted $C_3$-$C_{30}$ cycloalkyl, substituted or unsubstituted $C_1$-$C_{30}$ alkylsilyl, substituted or unsubstituted $C_6$-$C_{30}$ arylsilyl, and halogen, $L_{31}$ to $L_{34}$ are identical to or different from each other and are each independently single bonds or selected from substituted or unsubstituted $C_6$-$C_{50}$ arylene and substituted or unsubstituted $C_2$-$C_{50}$ heteroarylene, $Ar_{31}$ to $Ar_{34}$ are identical to or different from each other and are each independently selected from substituted or unsubstituted $C_6$-$C_{50}$ aryl and substituted or unsubstituted $C_2$-$C_{50}$ heteroaryl, n is an integer from 0 to 4, provided that when n is 2 or greater, the aromatic rings containing $R_{43}$ are identical to or different from each other, $m_1$ to $m_3$ are integers from 0 to 4, provided that when both $m_1$ and $m_3$ are 2 or more, the $R_{41}$, $R_{42}$, and $R_{43}$ groups are identical to or different from each other, and hydrogen or deuterium atoms are bonded to the carbon atoms of the aromatic rings to which $R_{41}$ to $R_{43}$ are not attached.

11. The organic electroluminescent device according to claim 10, wherein at least one of $Ar_{31}$ to $Ar_{34}$ in Formula D is represented by Formula E:

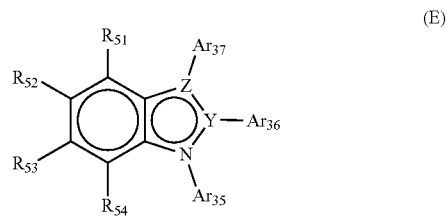

(E)

wherein $R_{51}$ to $R_{54}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, and $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $L_{31}$ to $L_{34}$ in Formula D.

12. The organic electroluminescent device according to claim 10, wherein the compound of Formula D is selected from the compounds of Formulae D1 to D79:

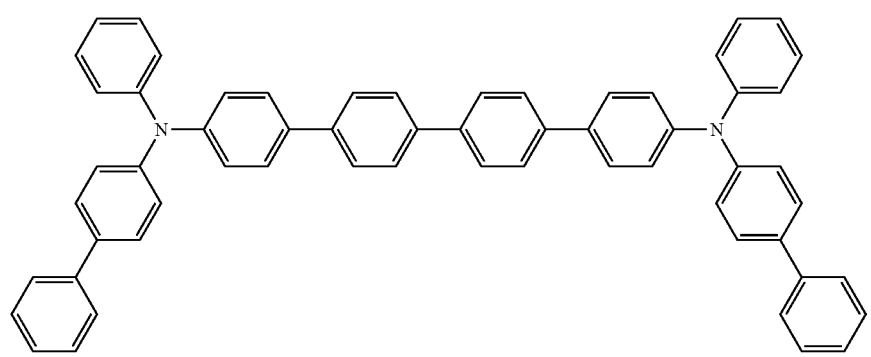

D1

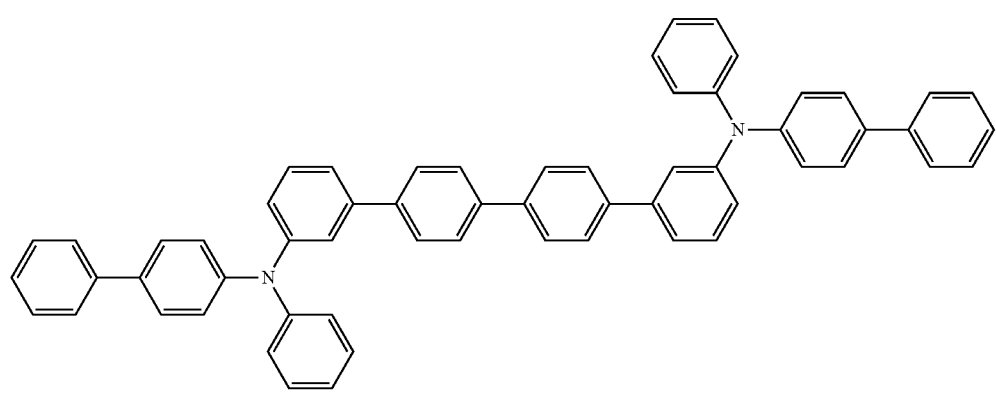

D2

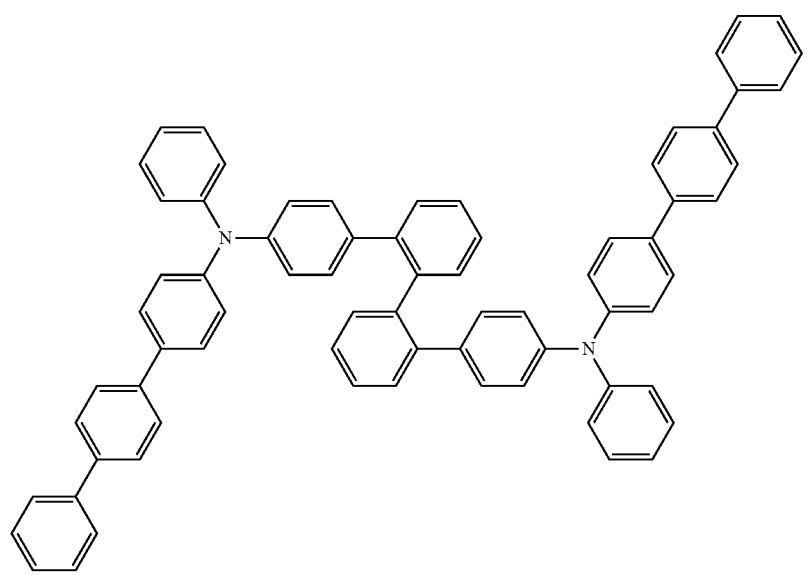

D3

-continued
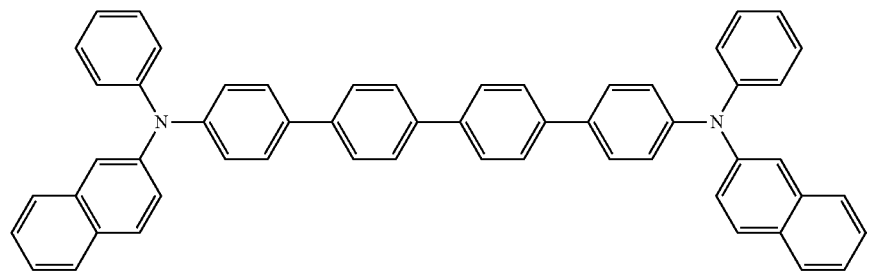
D4
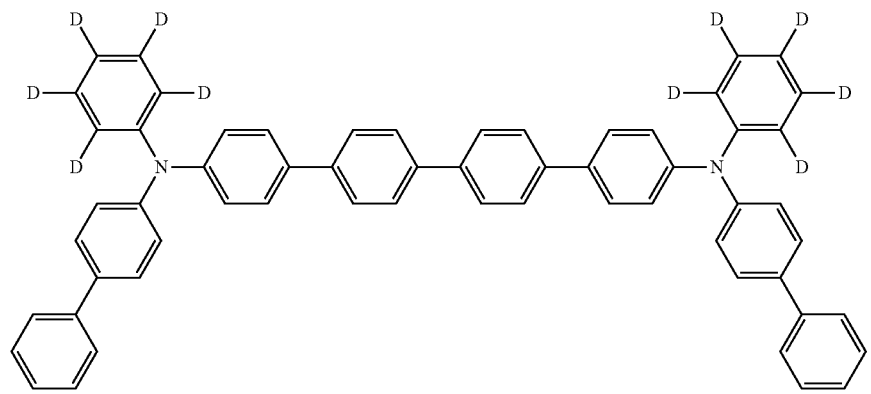
D5
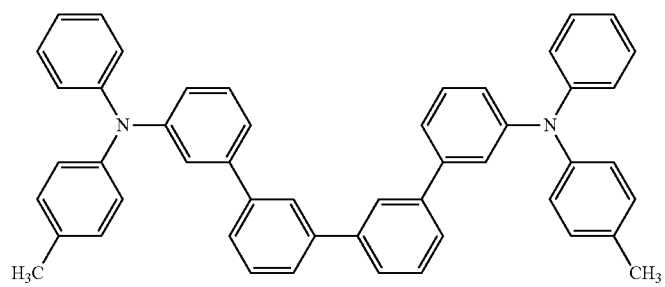
D6
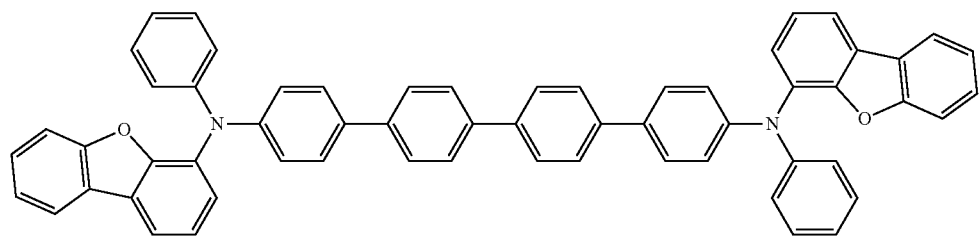
D7
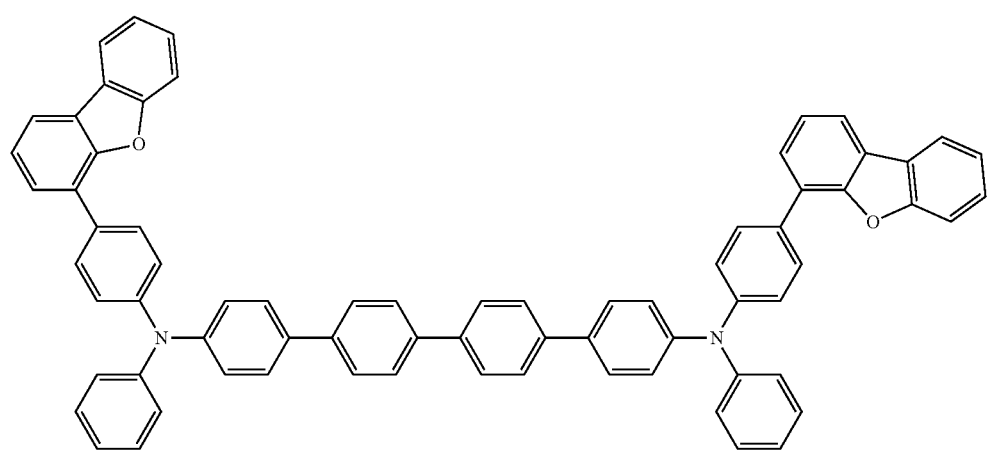
D8

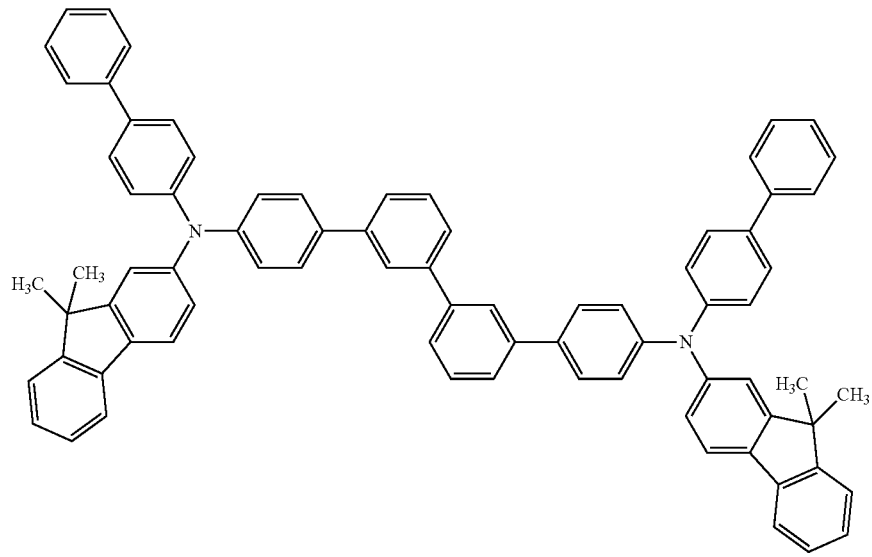
D9
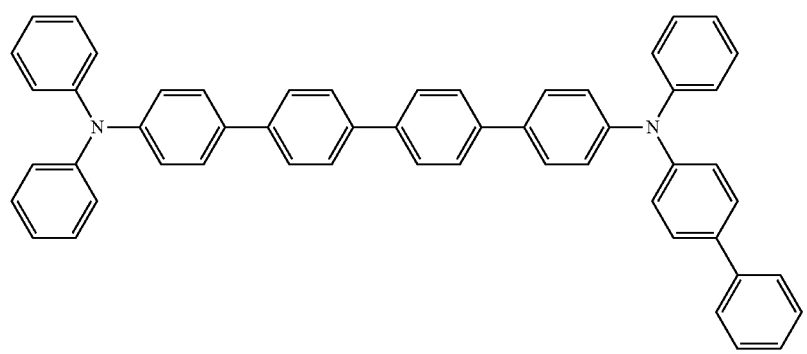
D10
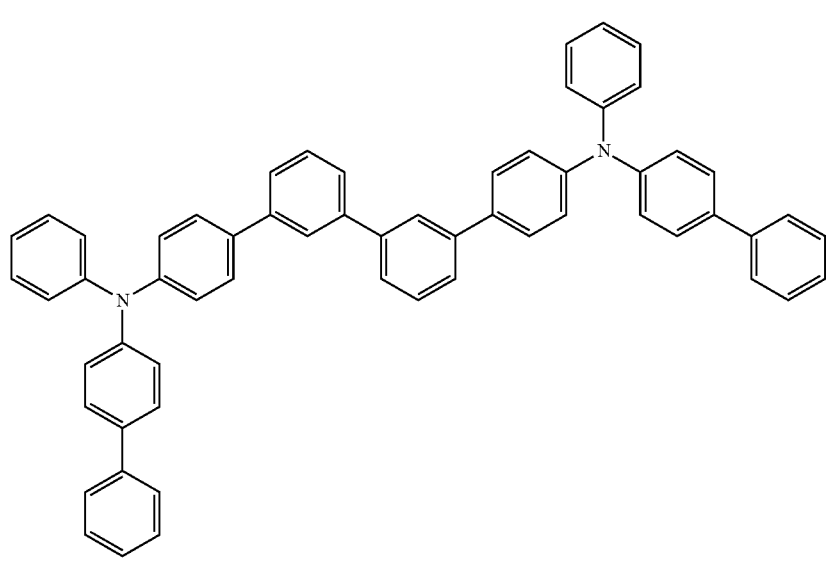
D11

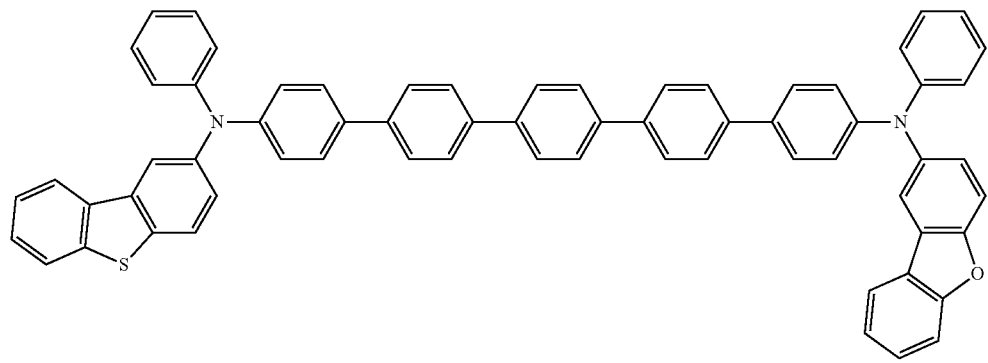
D12
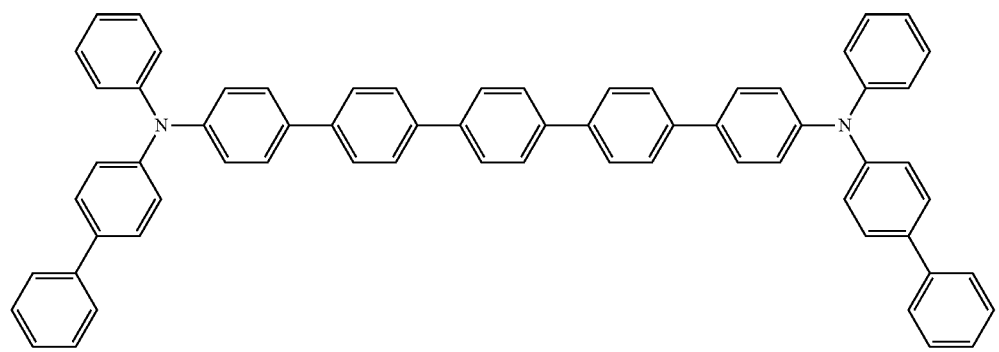
D13
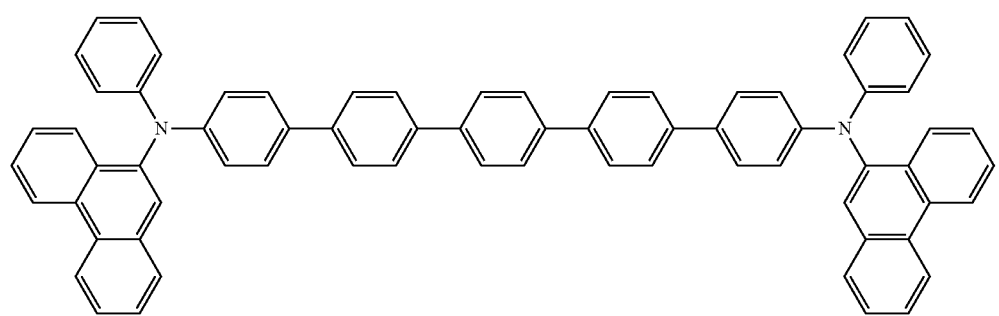
D14
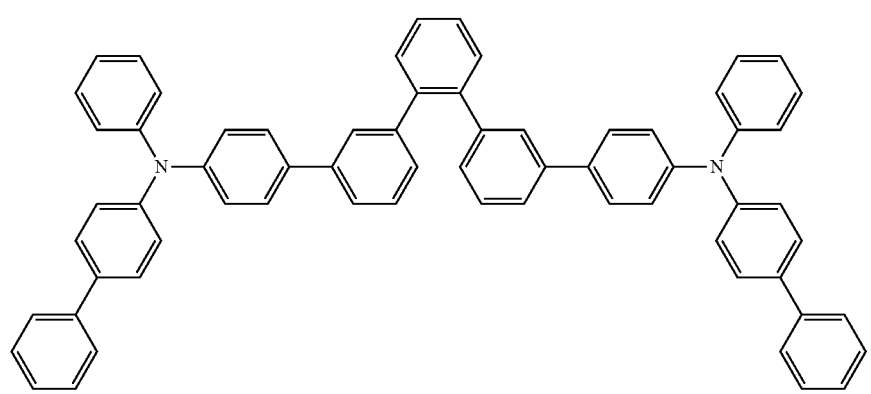
D15

D16
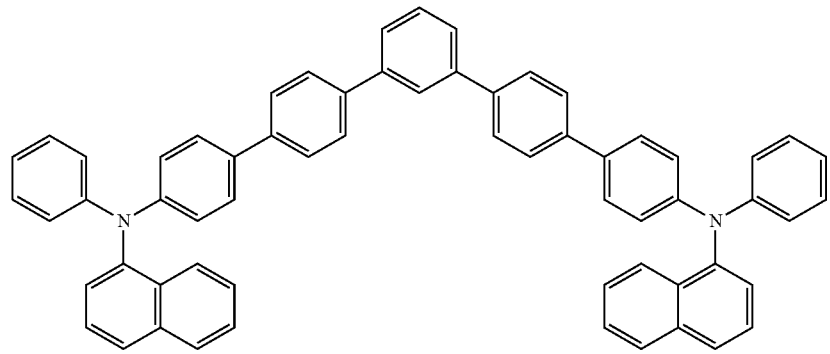
D17
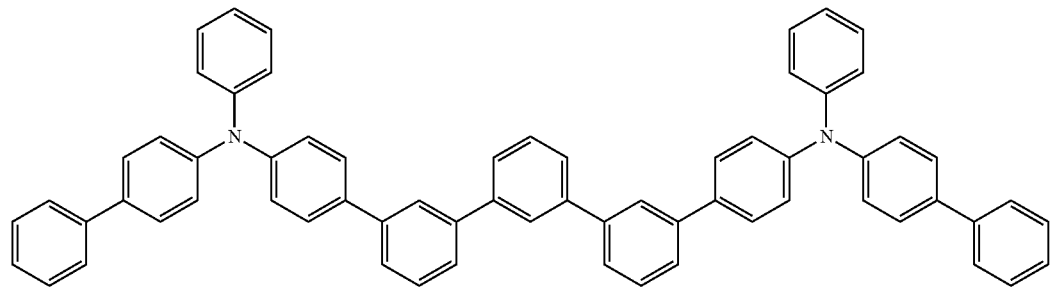
D18
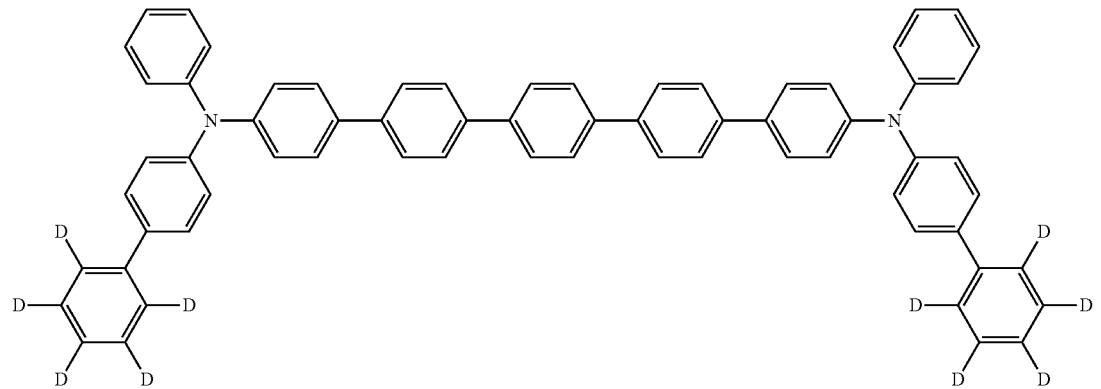
D19
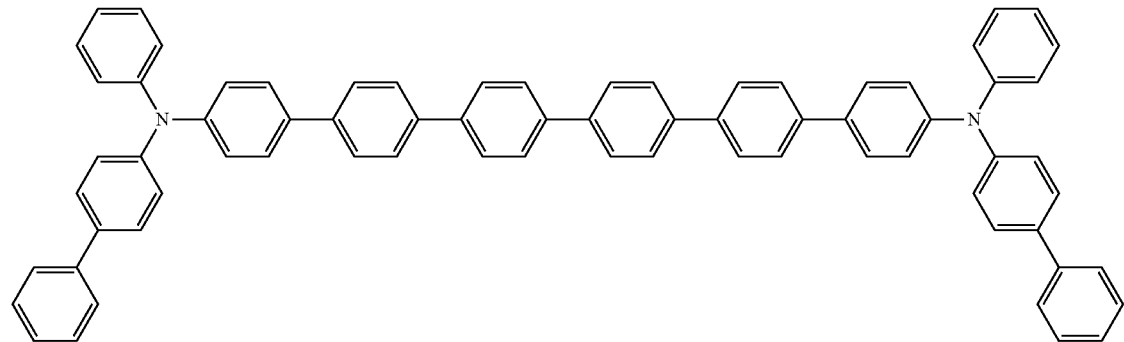

-continued
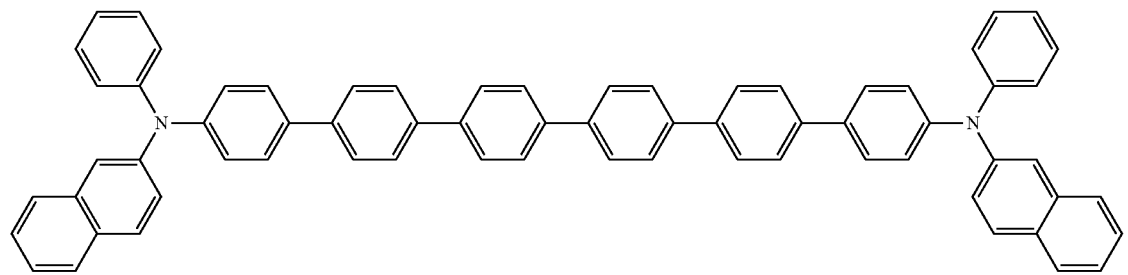
D20
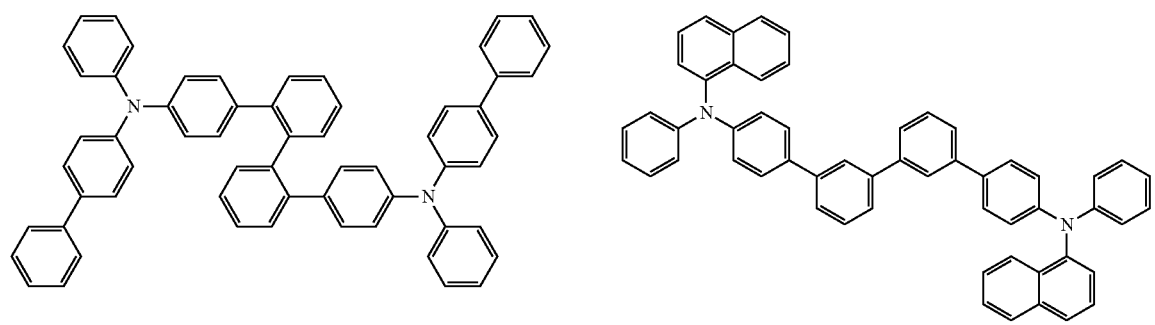
D21        D22
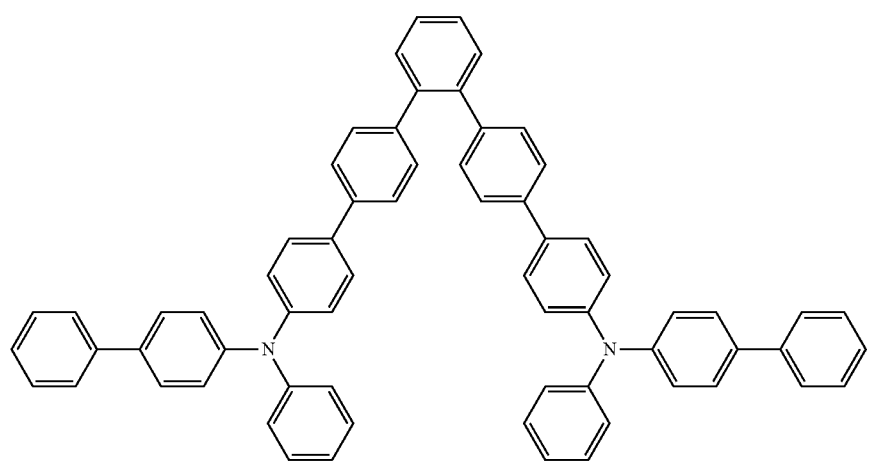
D23
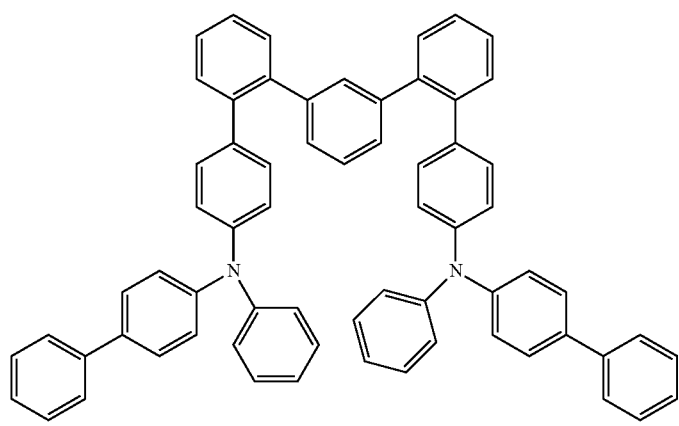
D24

D25
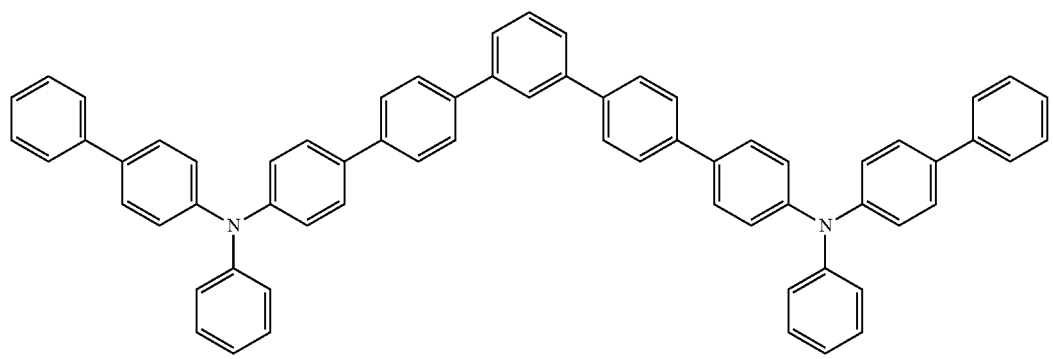
D26
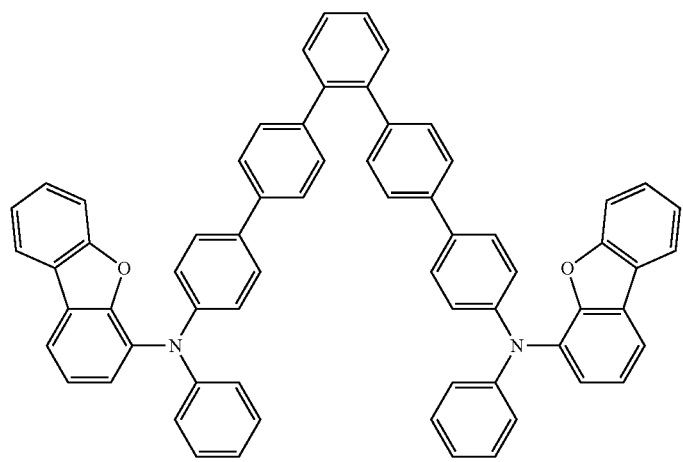
D27
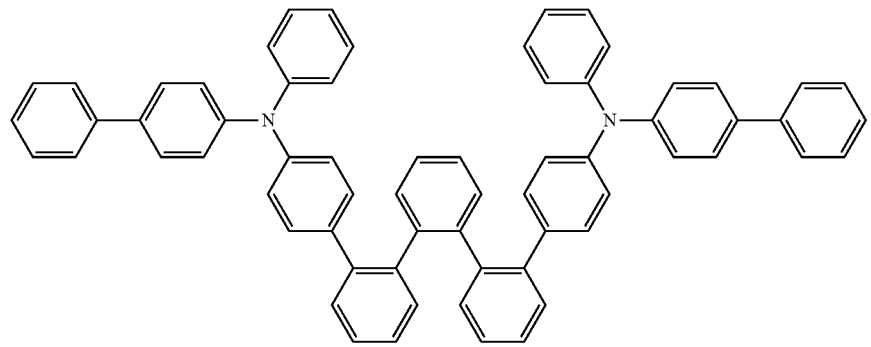
D28
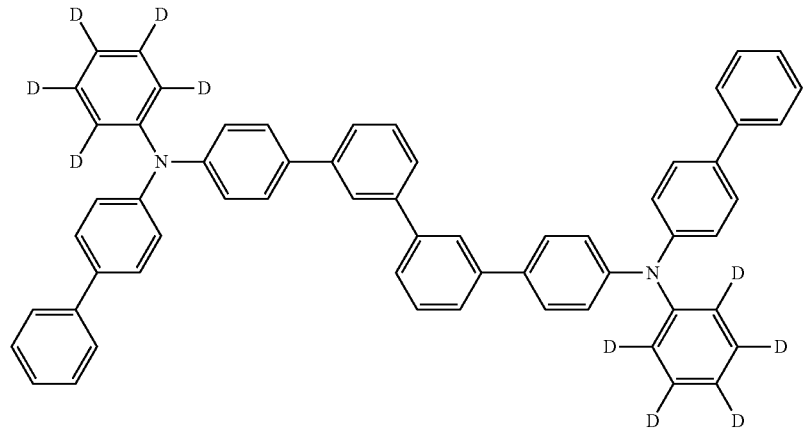

-continued
D29
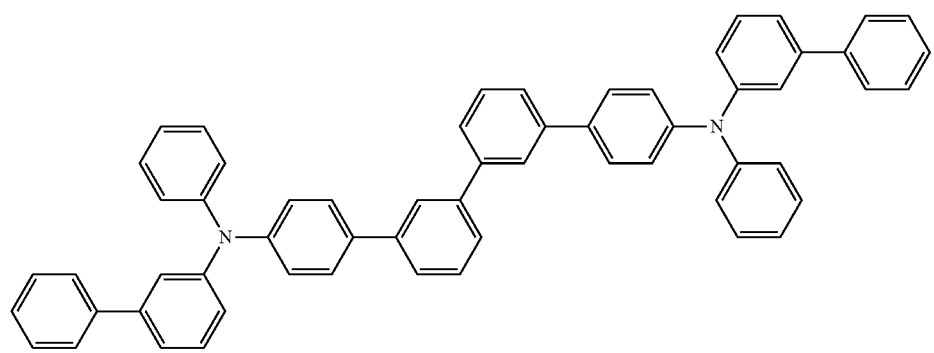
D30
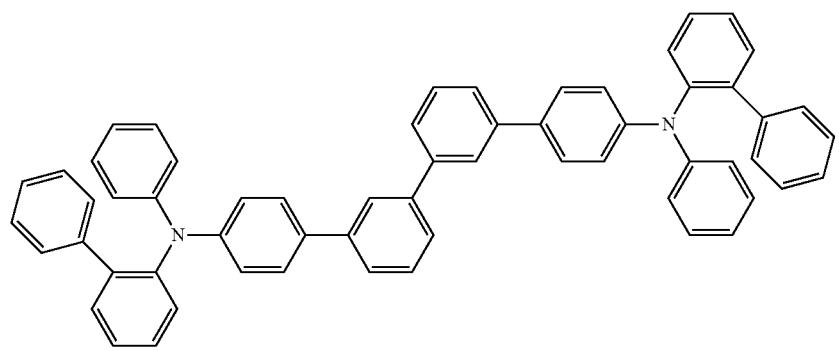
D31
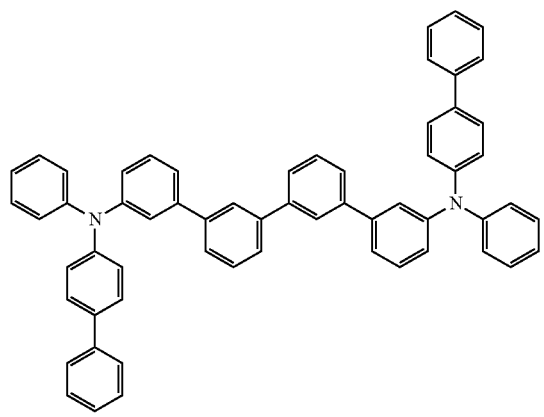
D32
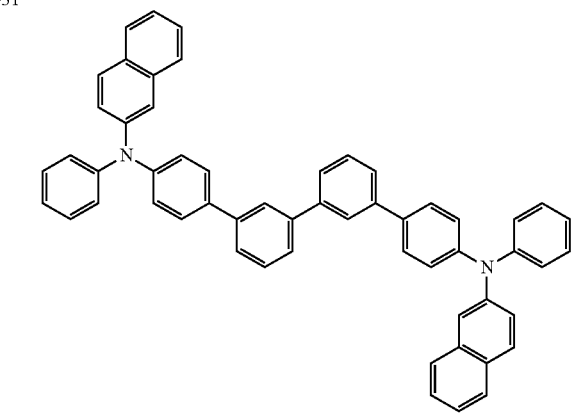
D33
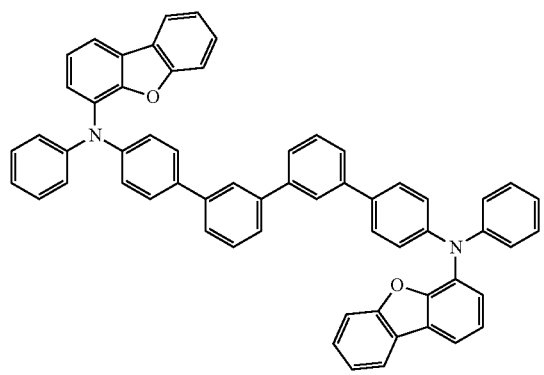
D34
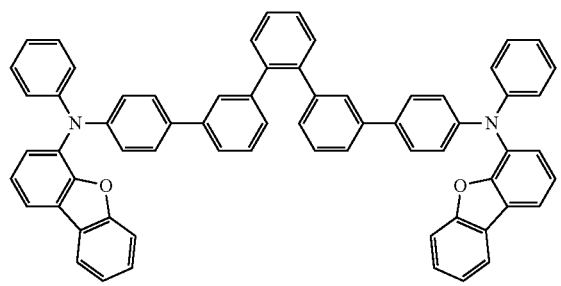

-continued
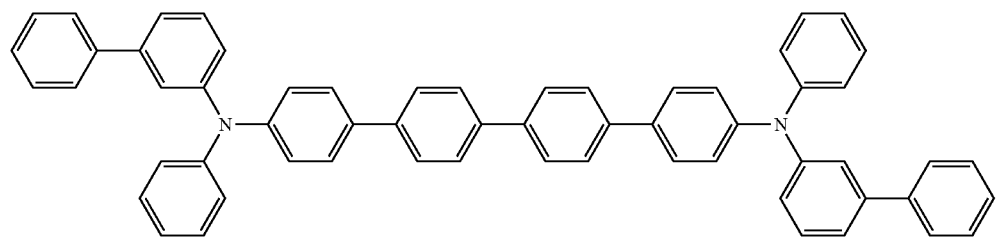
D35
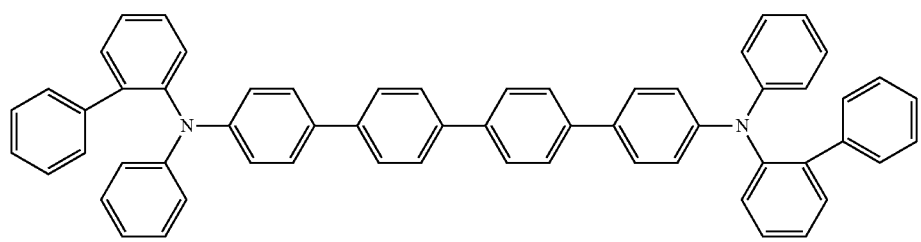
D36
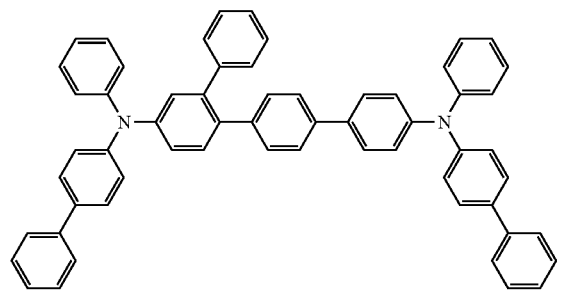
D37
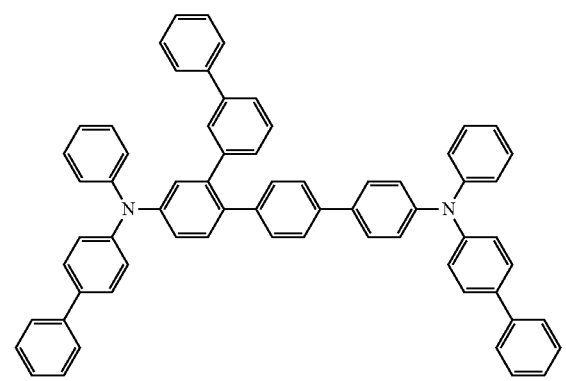
D38
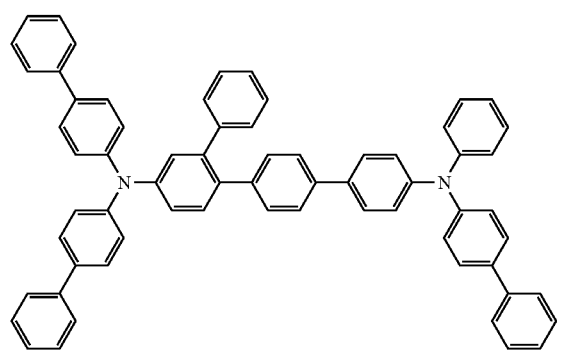
D39
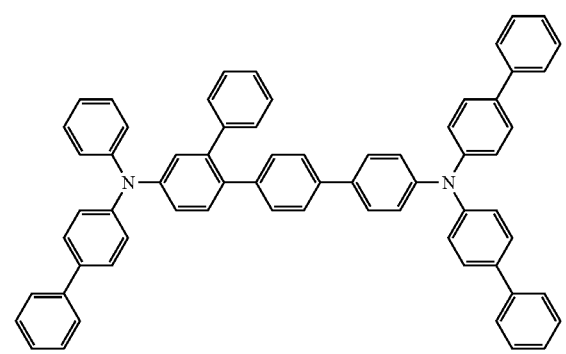
D40
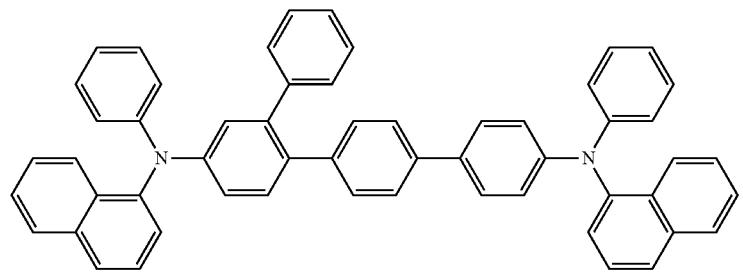
D41

-continued
D42
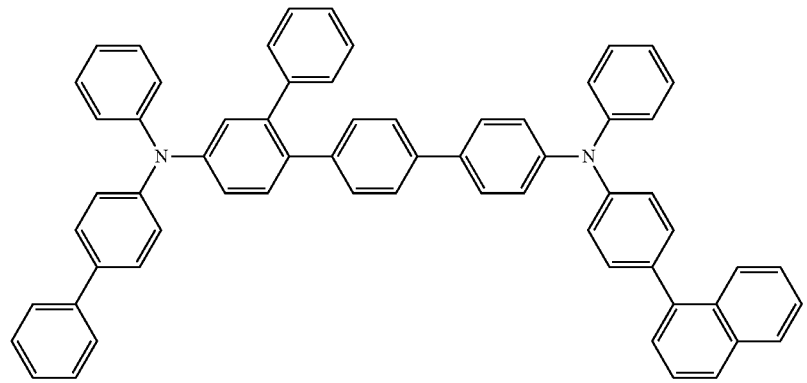
D43
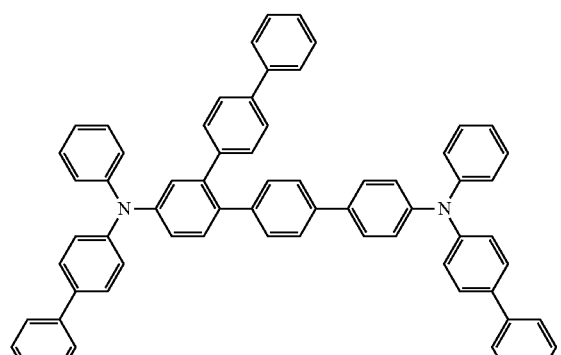
D44
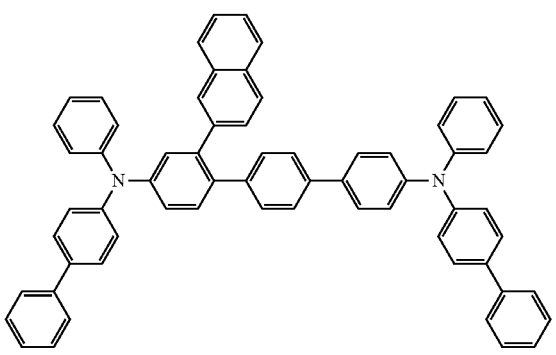
D45
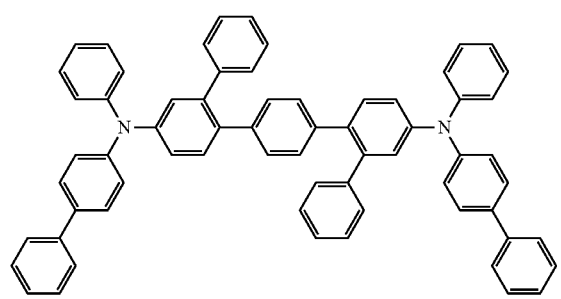
D46
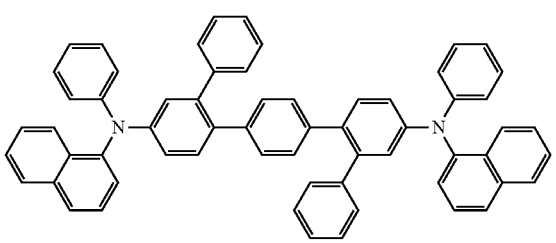
D47
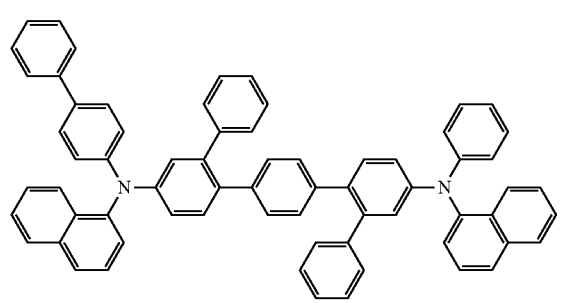
D48
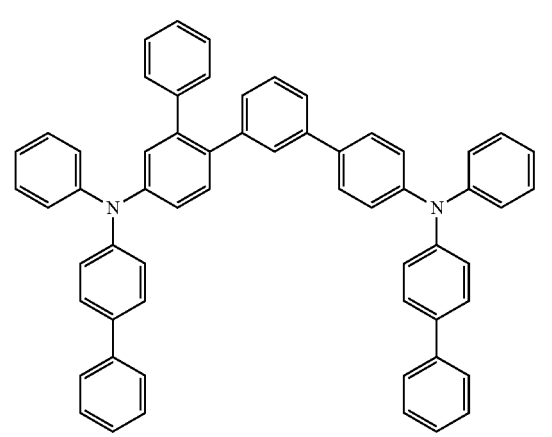

-continued
D49
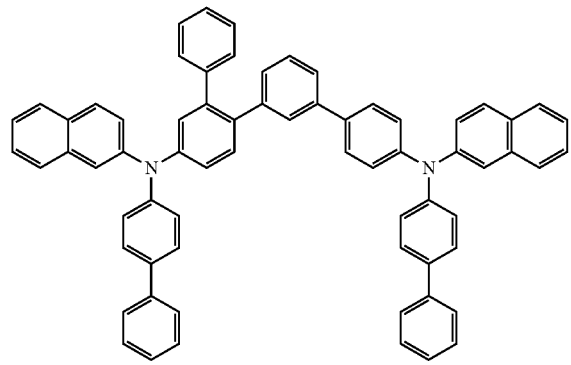
D50
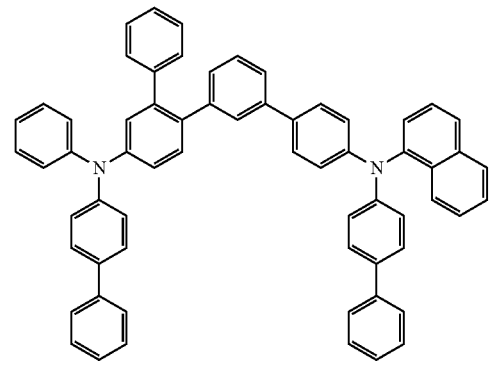
D51
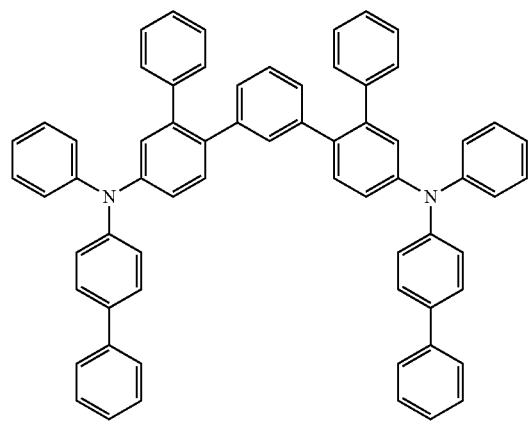
D52
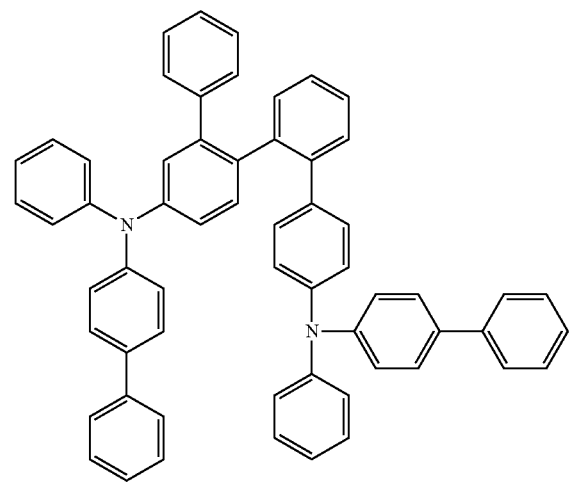
D53
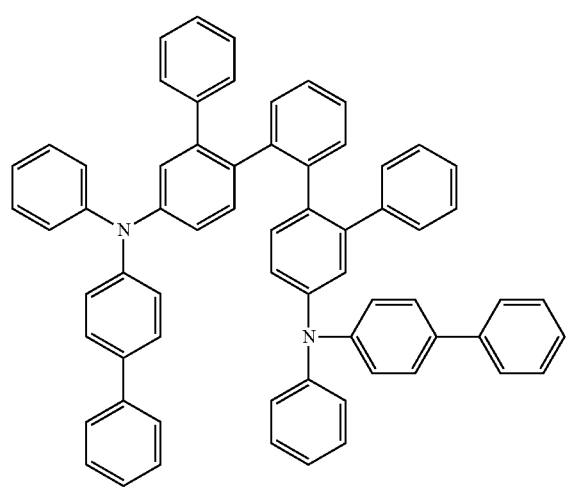

-continued
D54
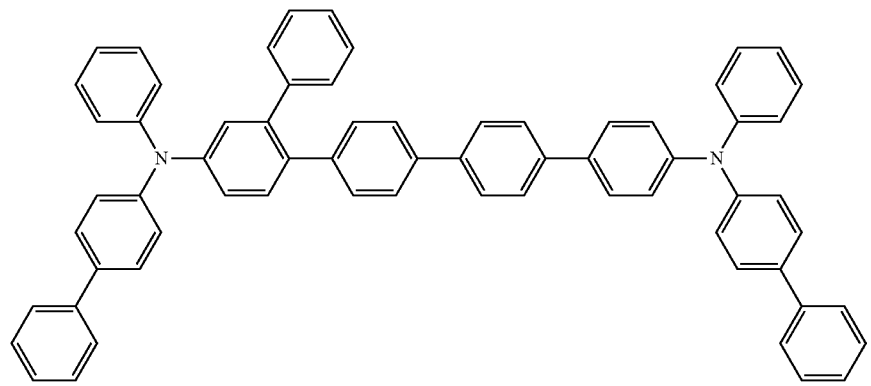
D55
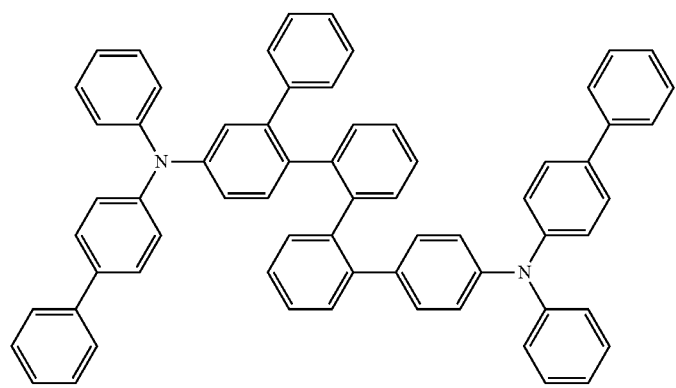
D56
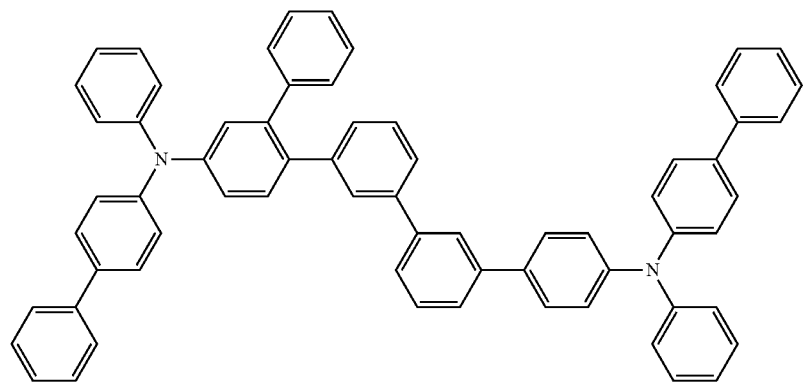
D57
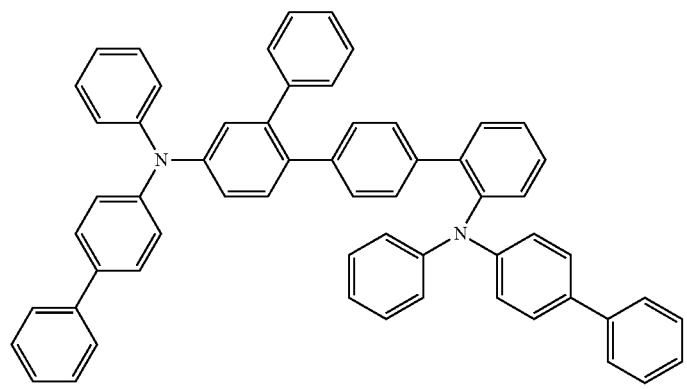

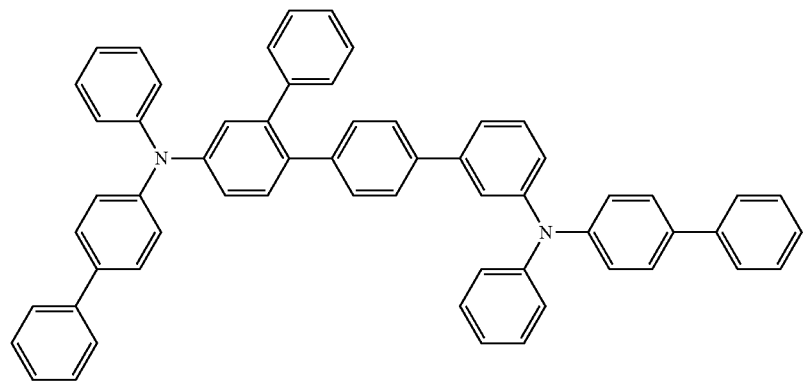
D58
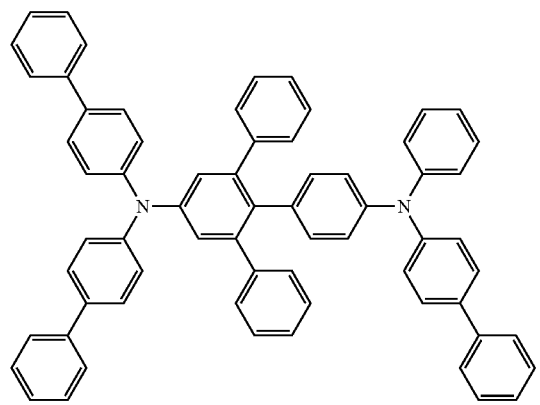
D59
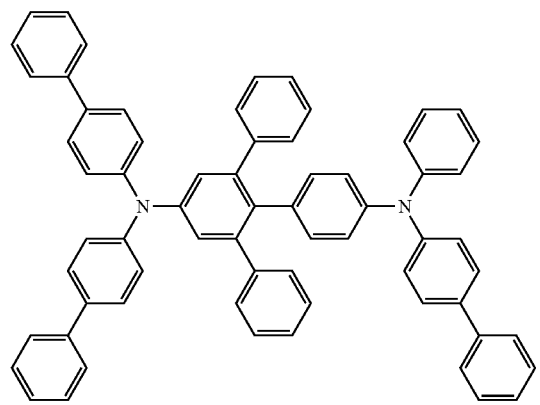
D60
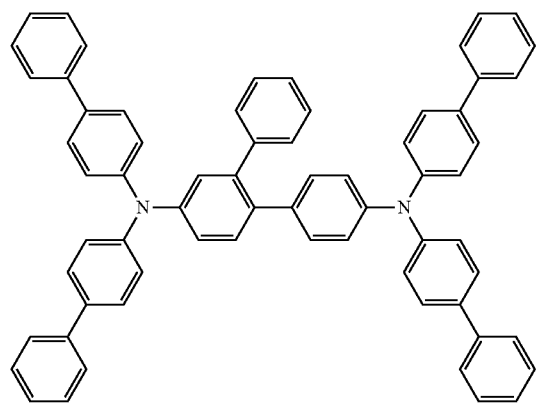
D61
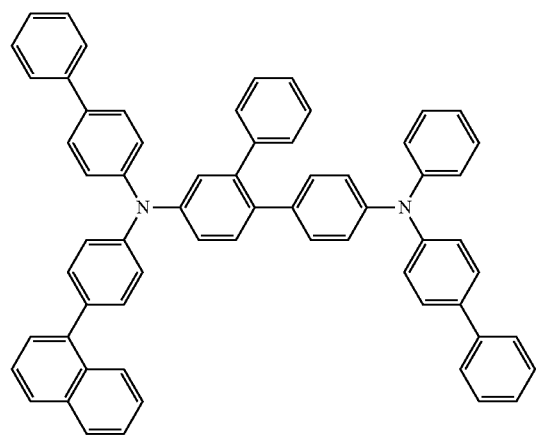
D62

-continued
D63
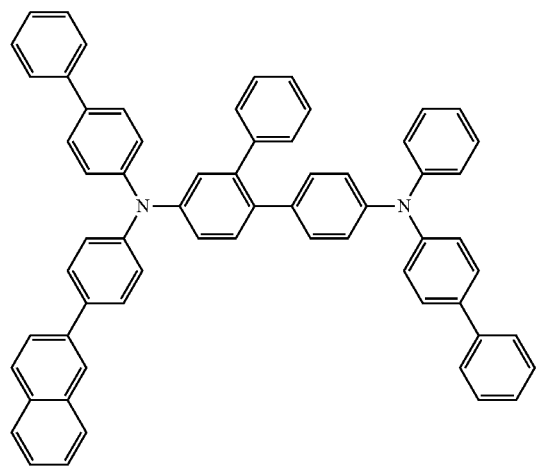
D64
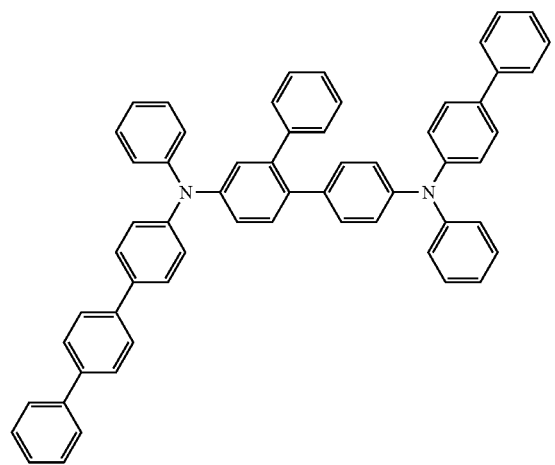
D65
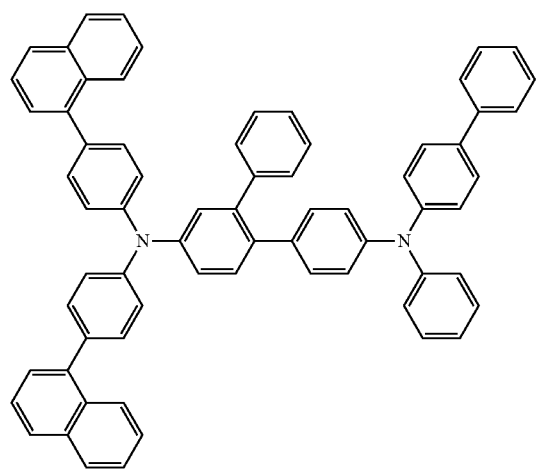
D66
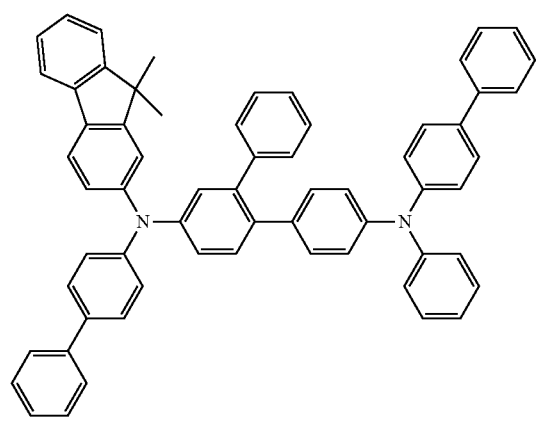
D67
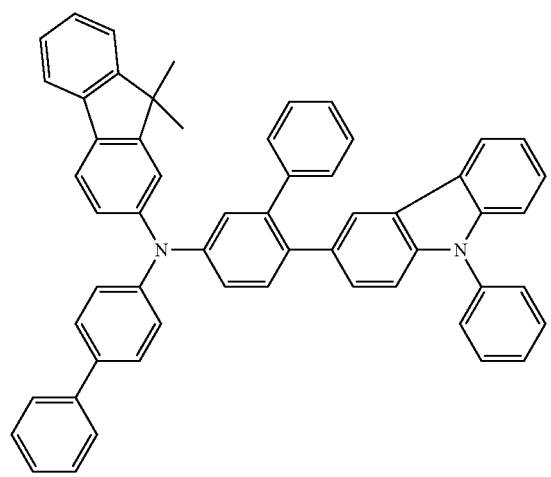
D68
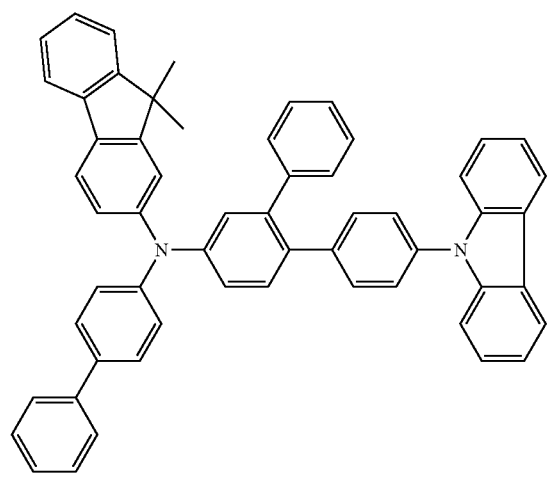

-continued
D69
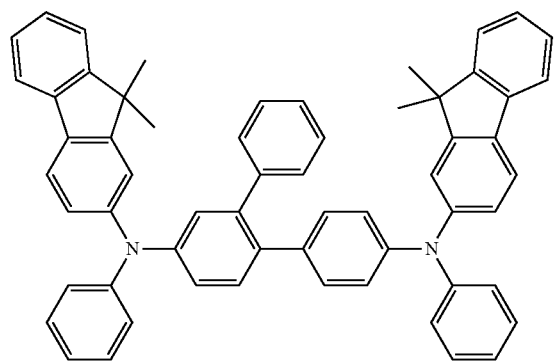
D70
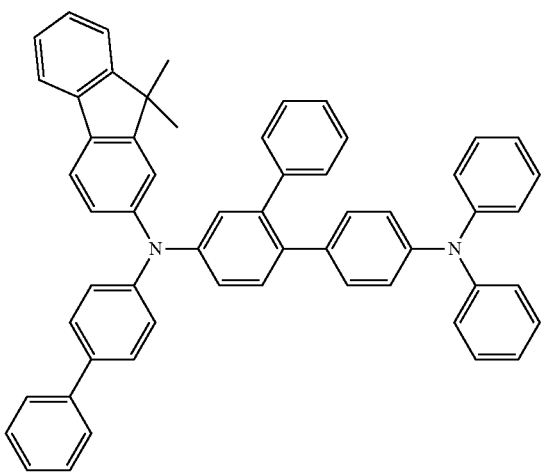
D71
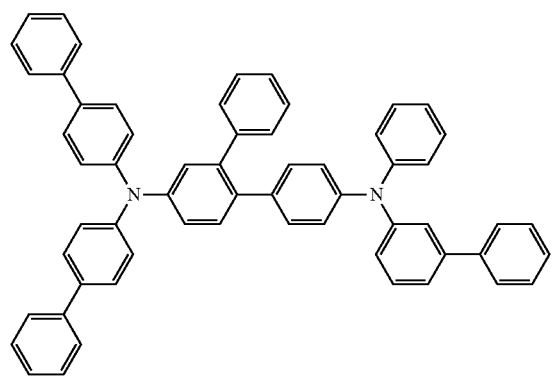
D72
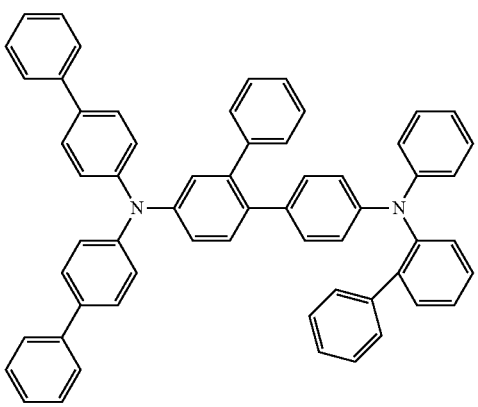
D73
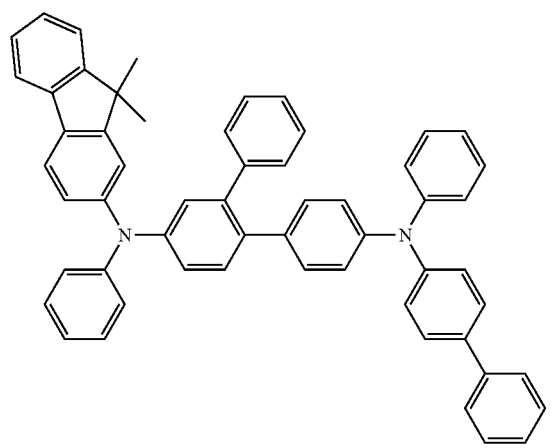
D74
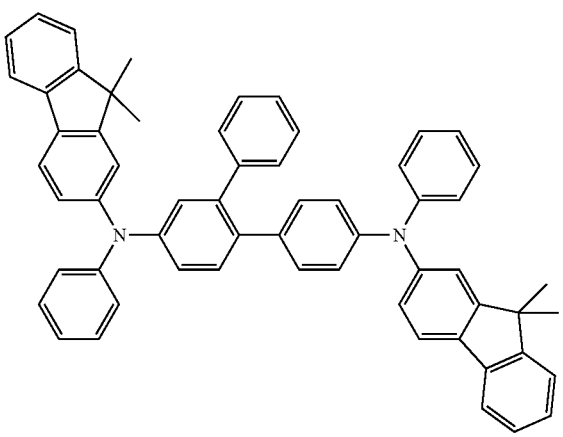

-continued
D75 D76
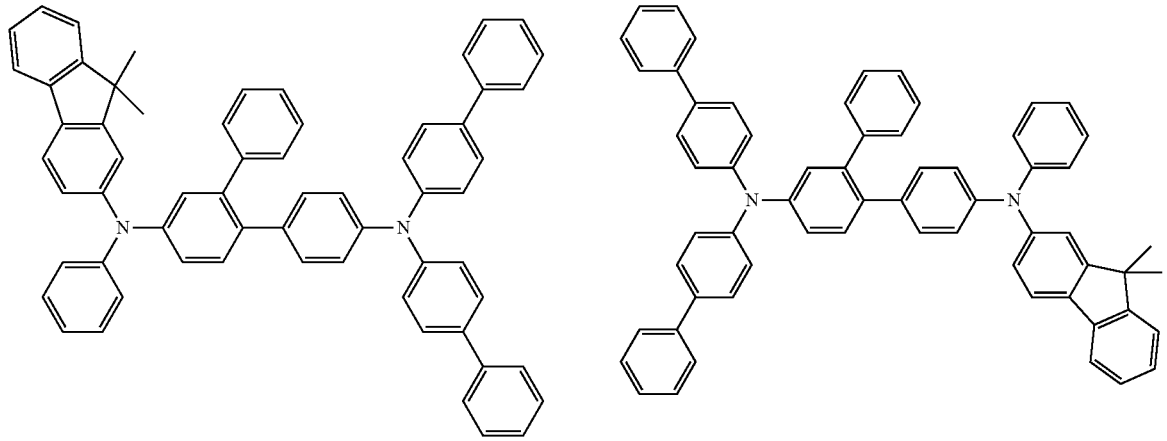
D77 D78
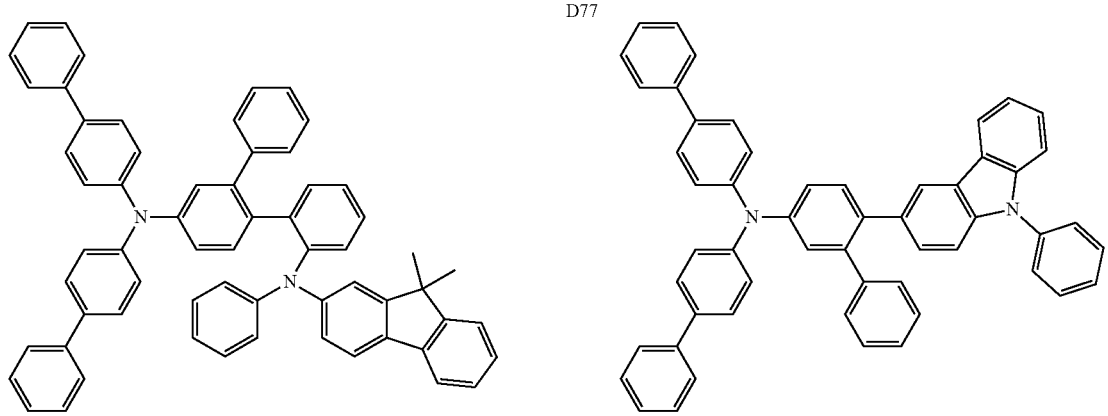
D79
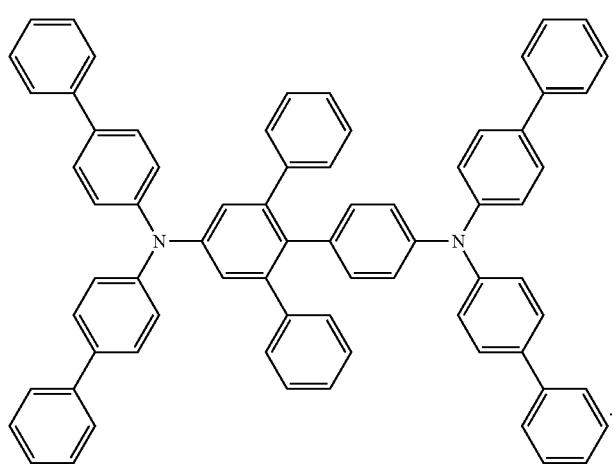

13. The organic electroluminescent device according to claim 10, wherein the compound of Formula D is selected from the compounds of Formulae D101 to D145:
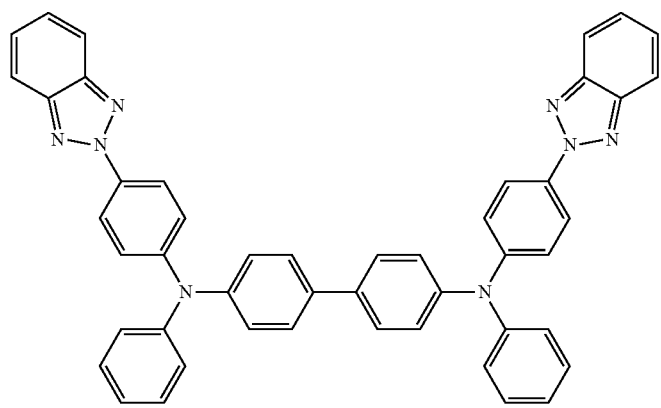
D101
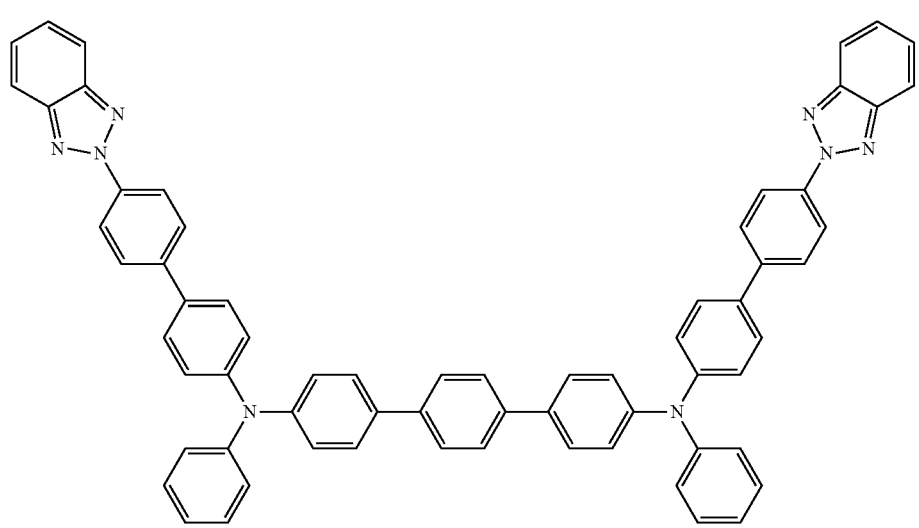
D102
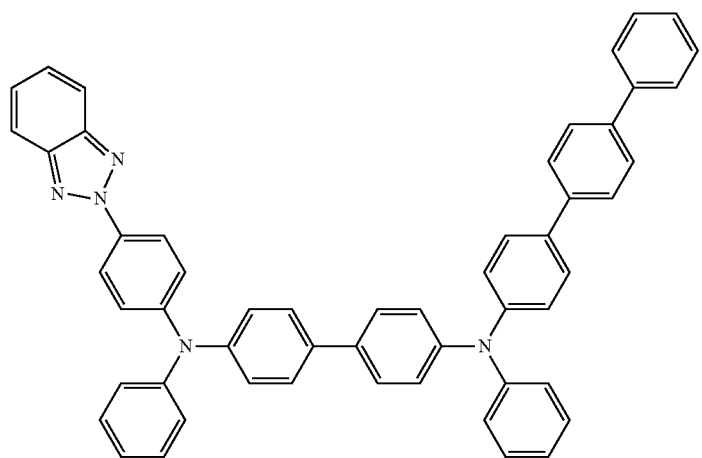
D103

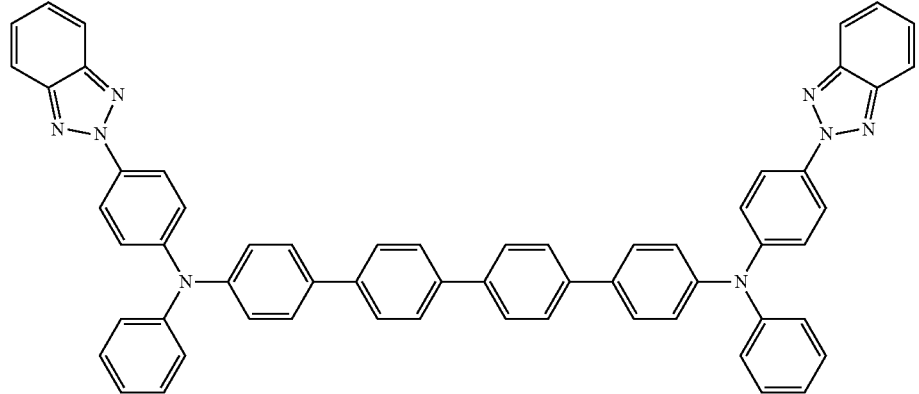
D104
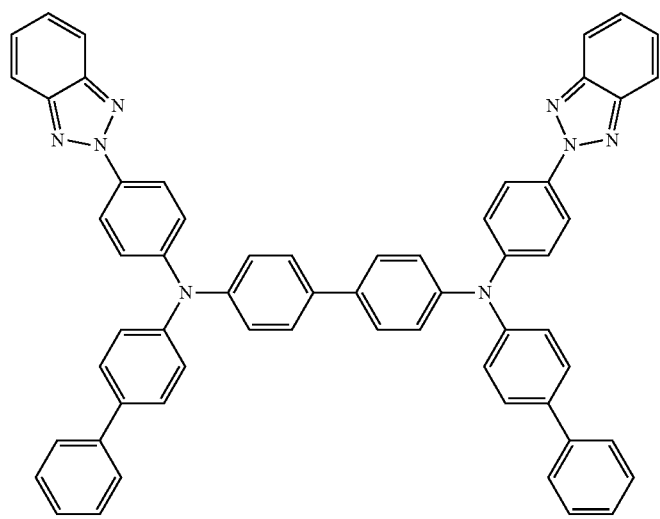
D105
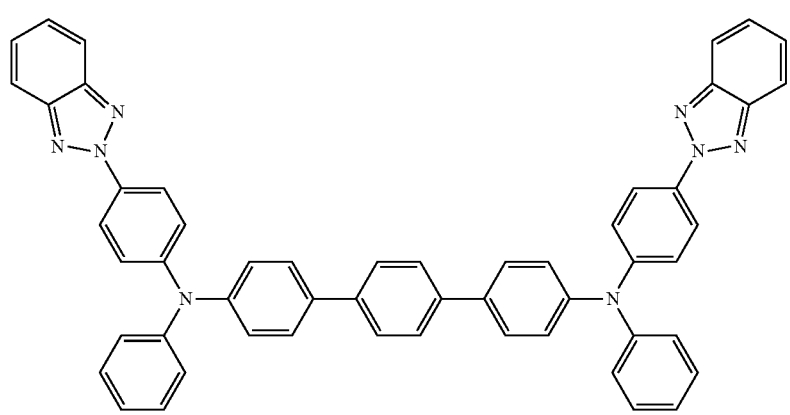
D106

-continued
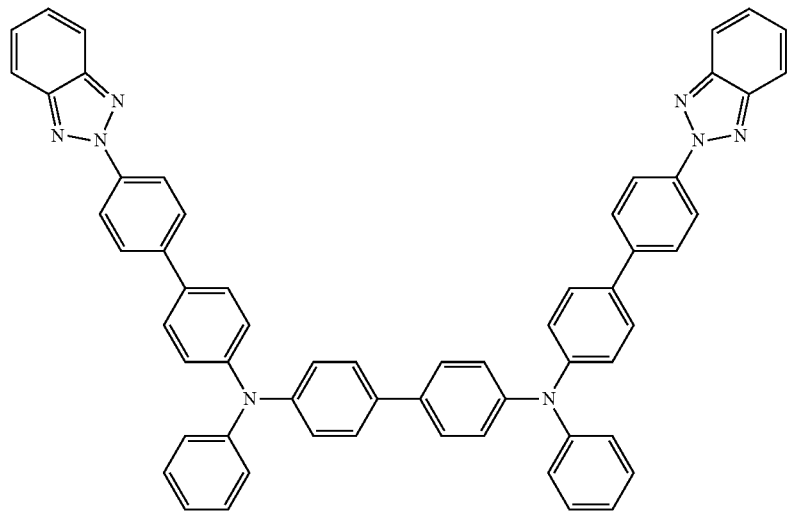
D107
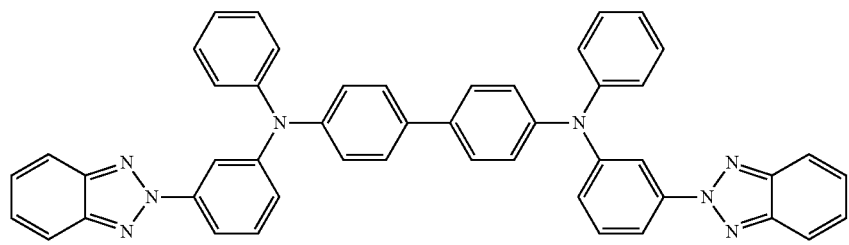
D108
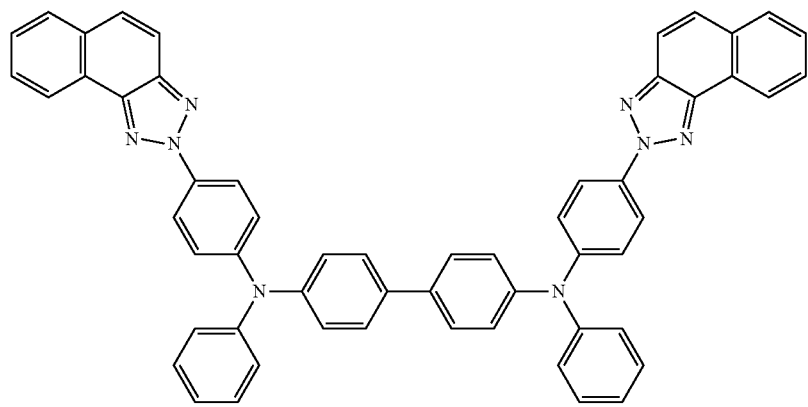
D109
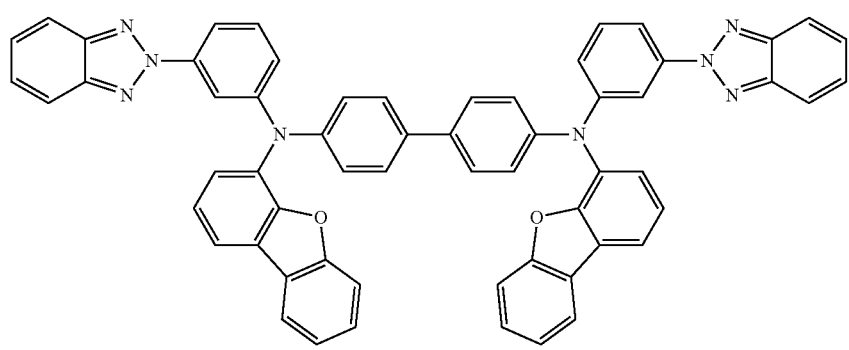
D110

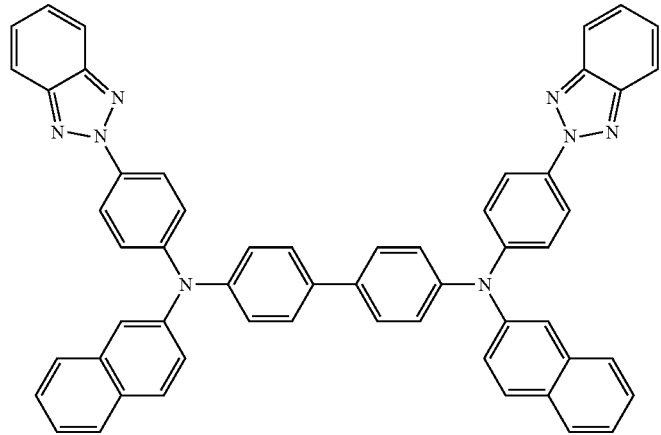
D111
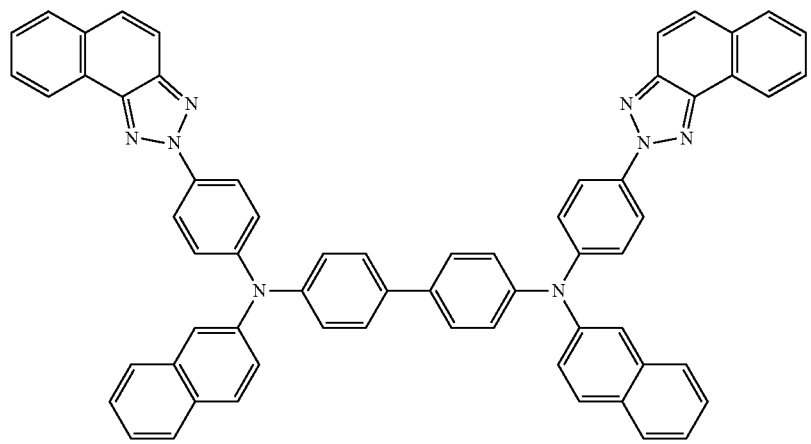
D112
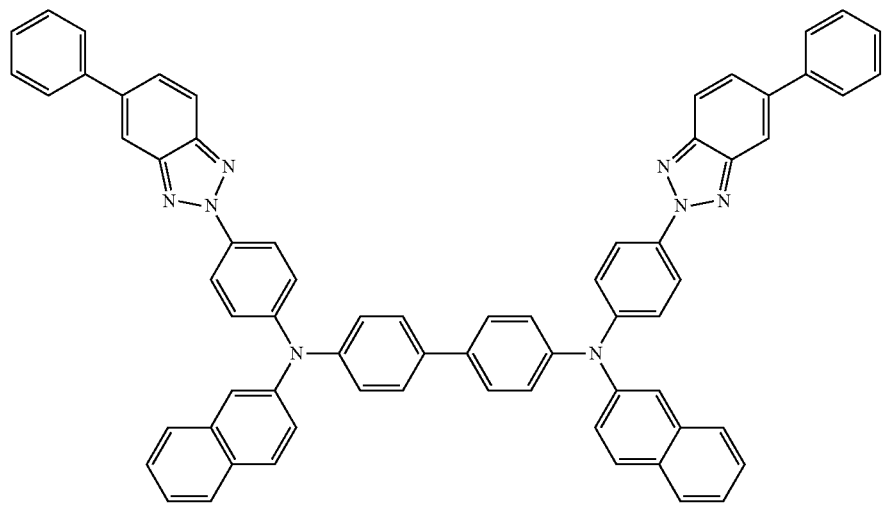
D113

-continued
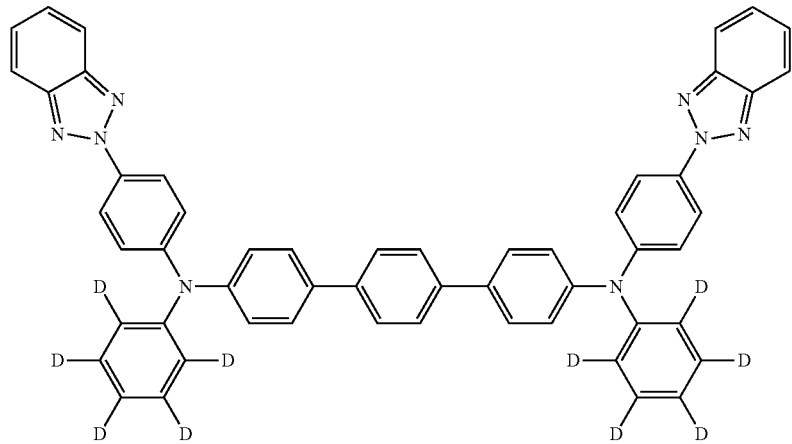
D114
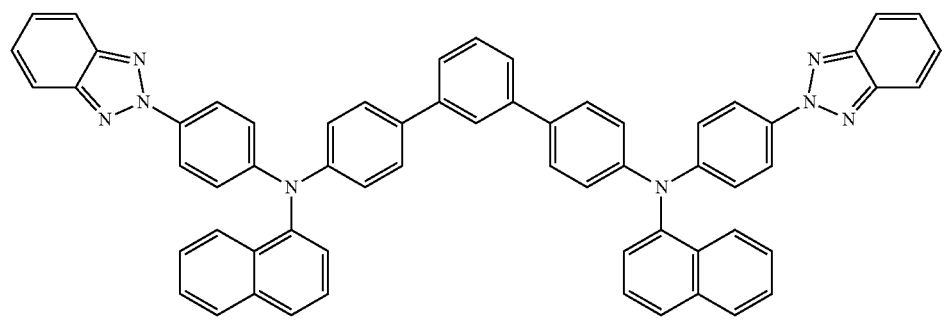
D115
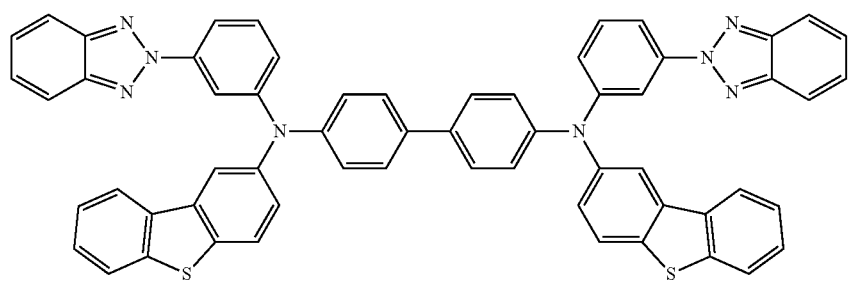
D116
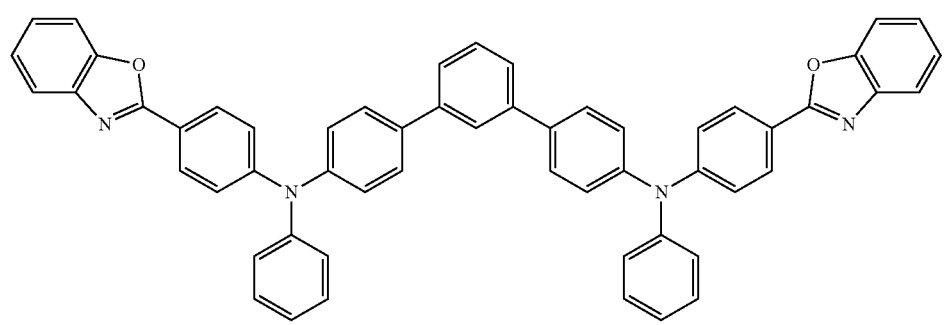
D117

-continued
D118
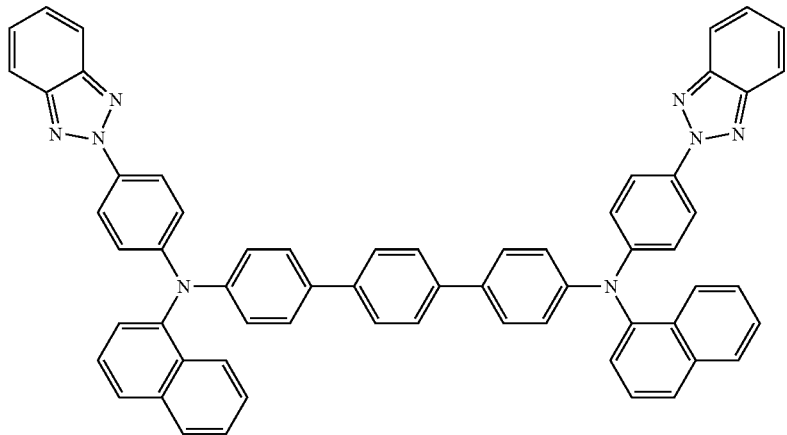
D119
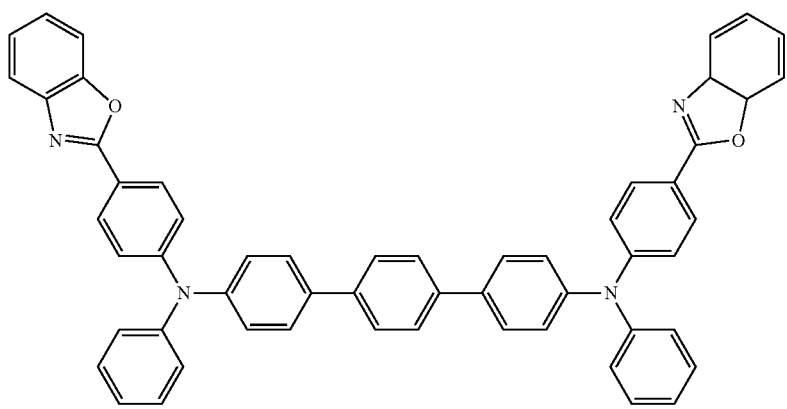
D120
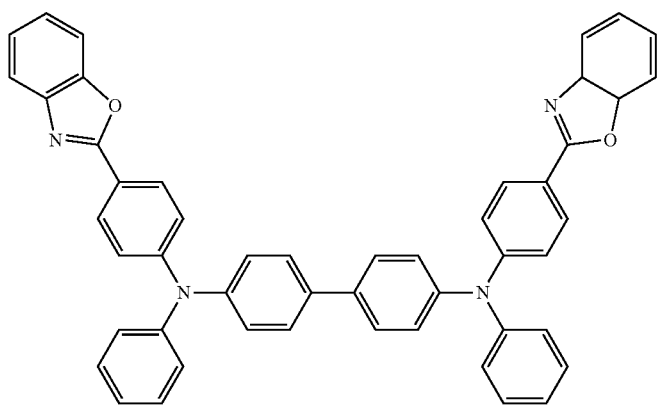

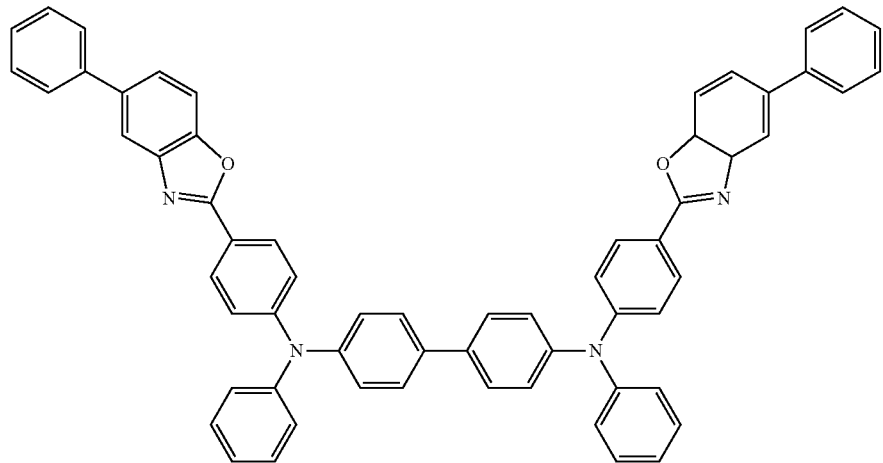
D121
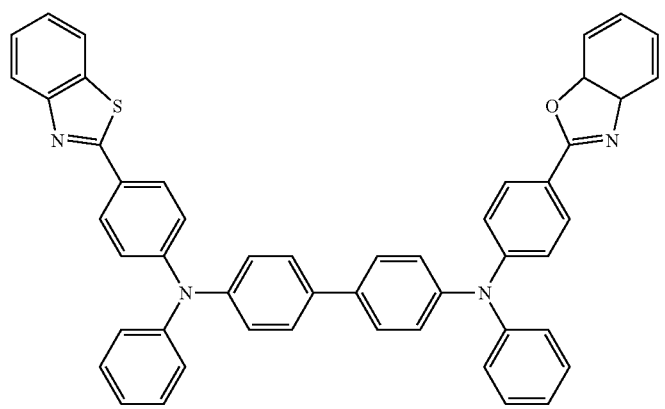
D122
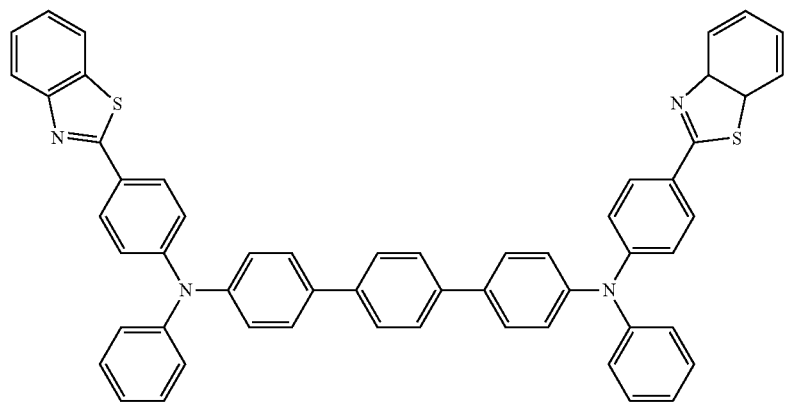
D123

D124
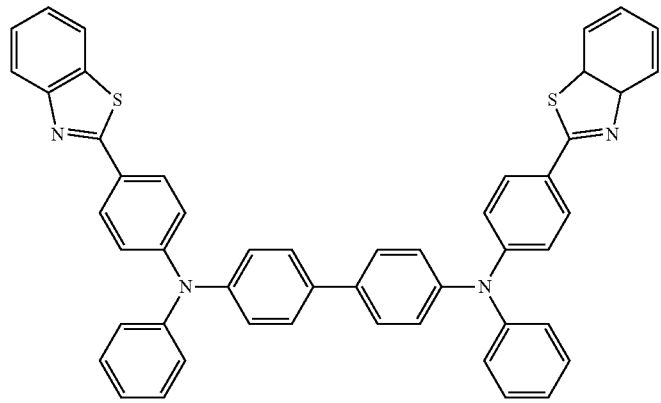
D125
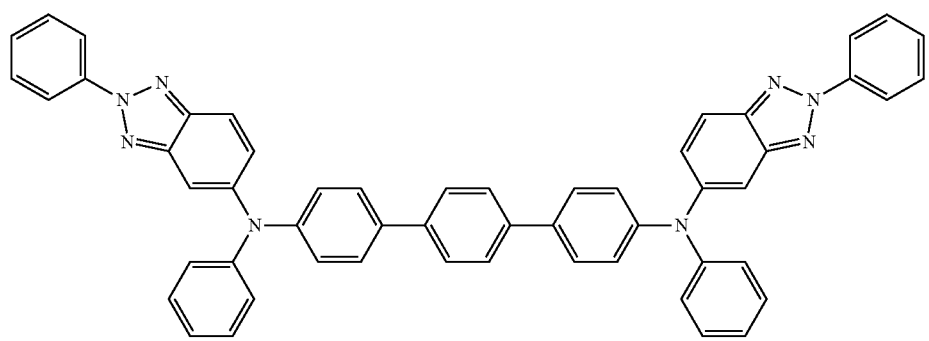
D126
D127
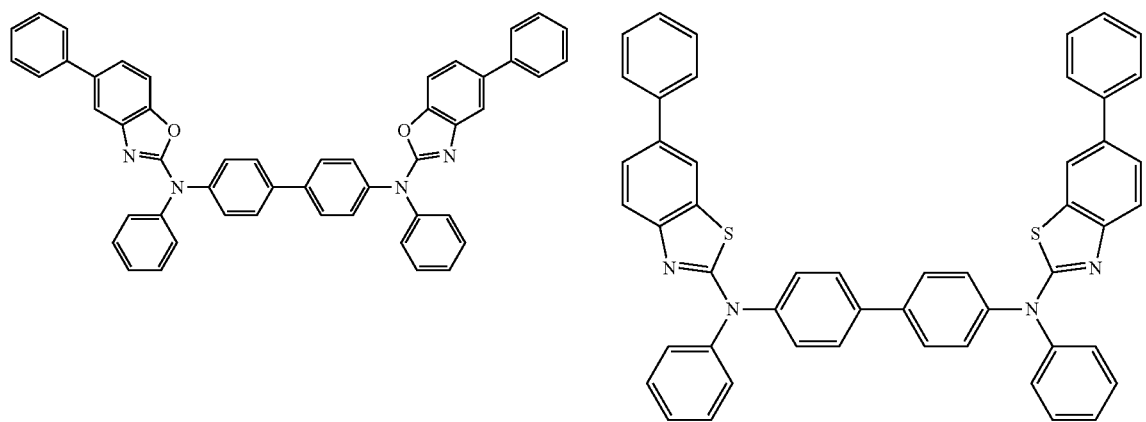
D128
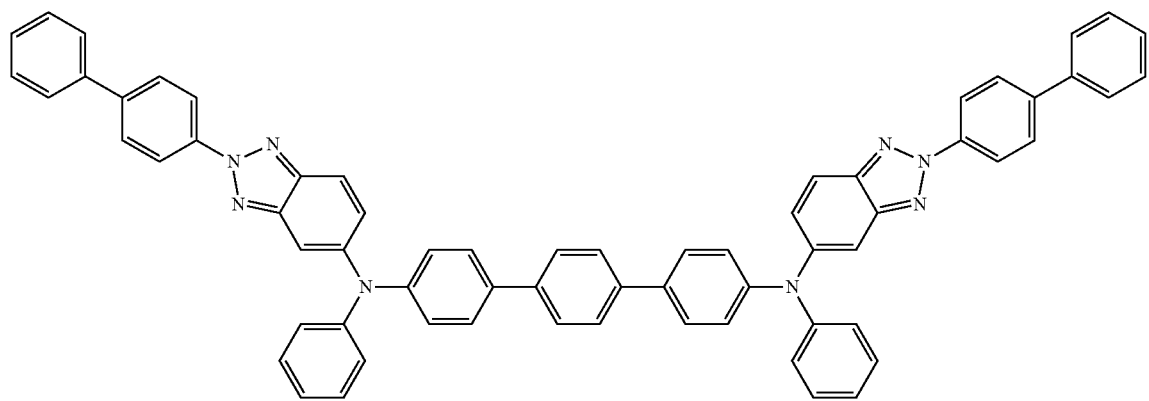

-continued
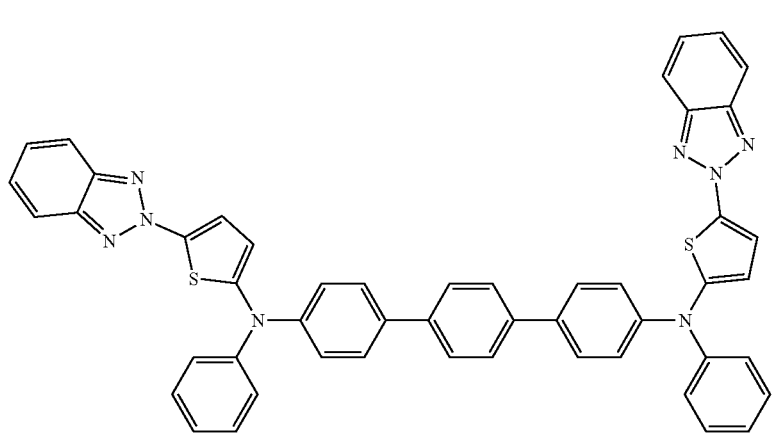
D129
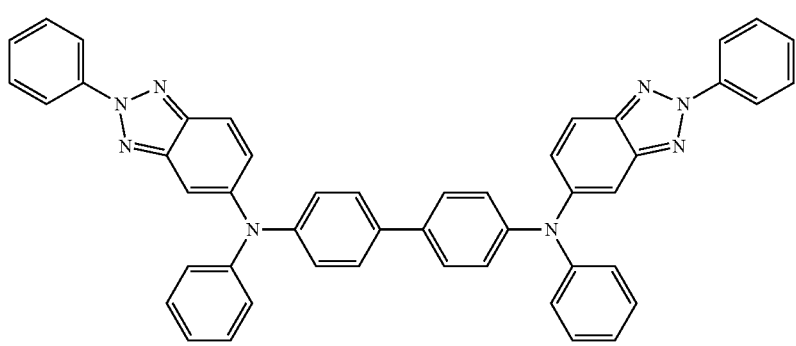
D130
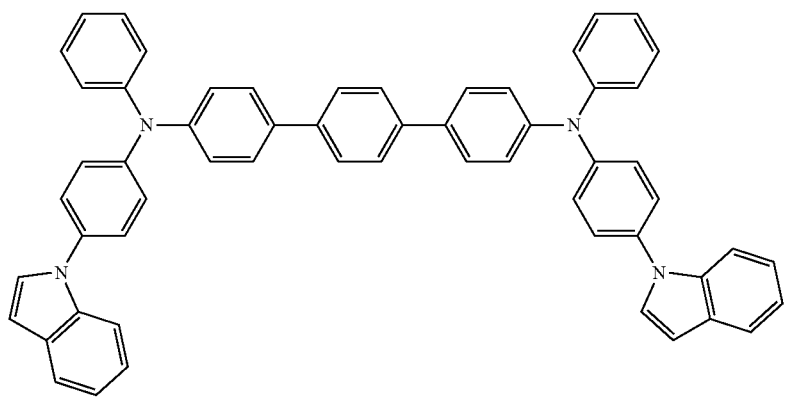
D131
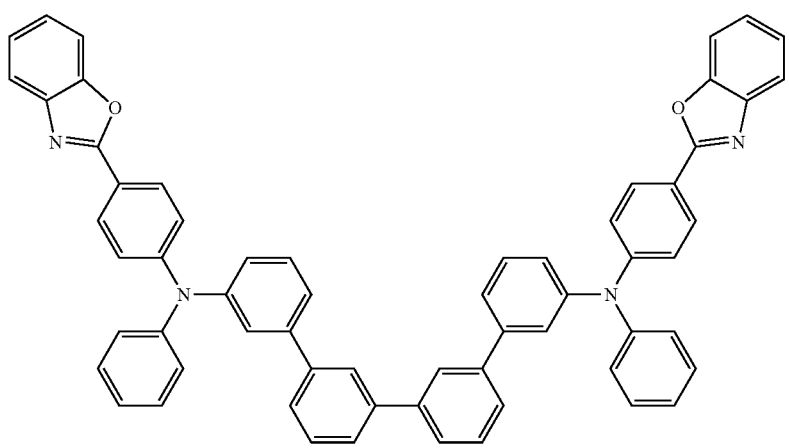
D132

D133
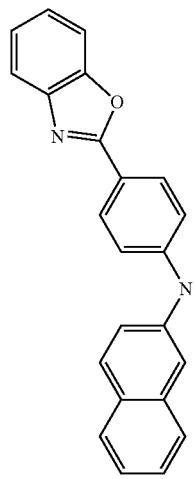
D134
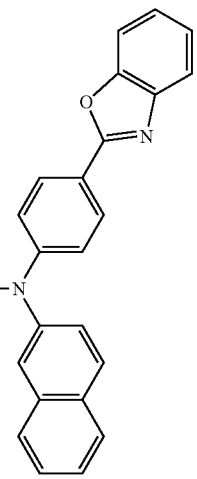
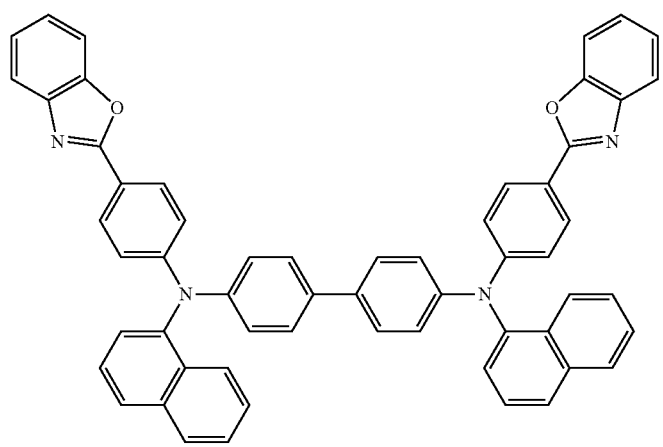
D135
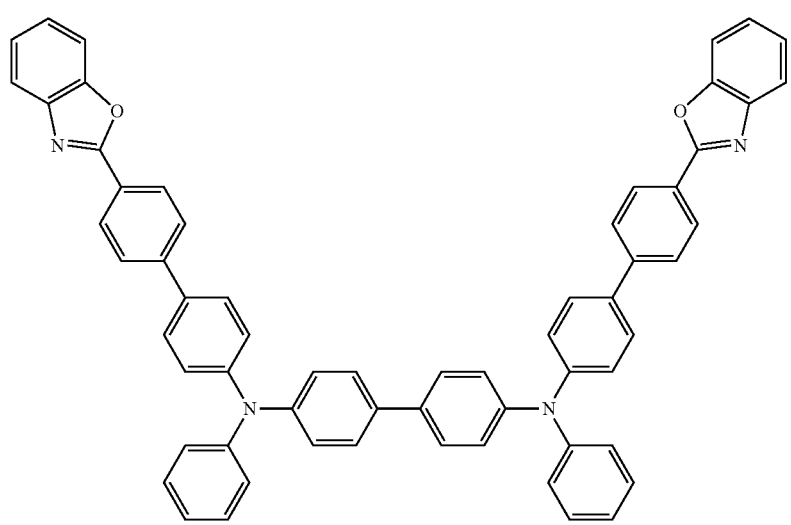

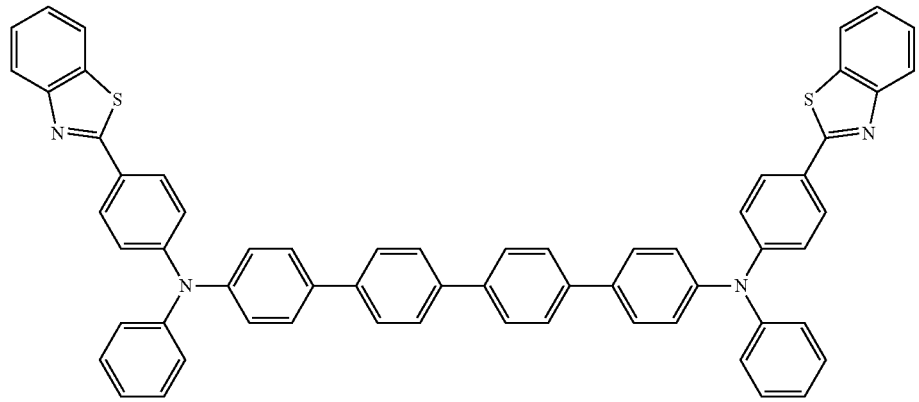
D136
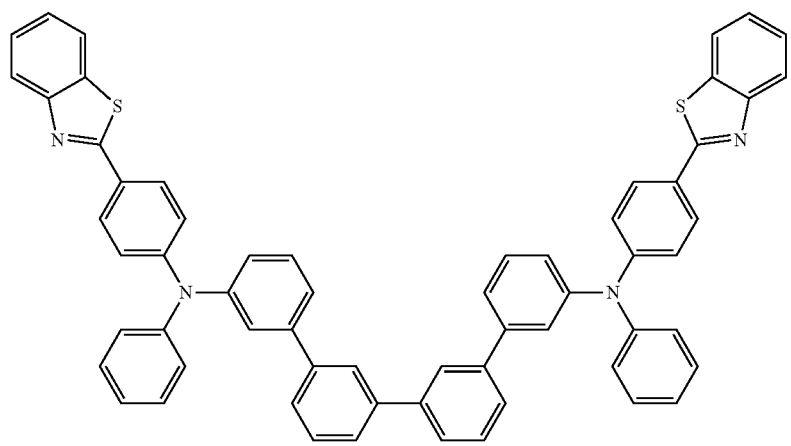
D137
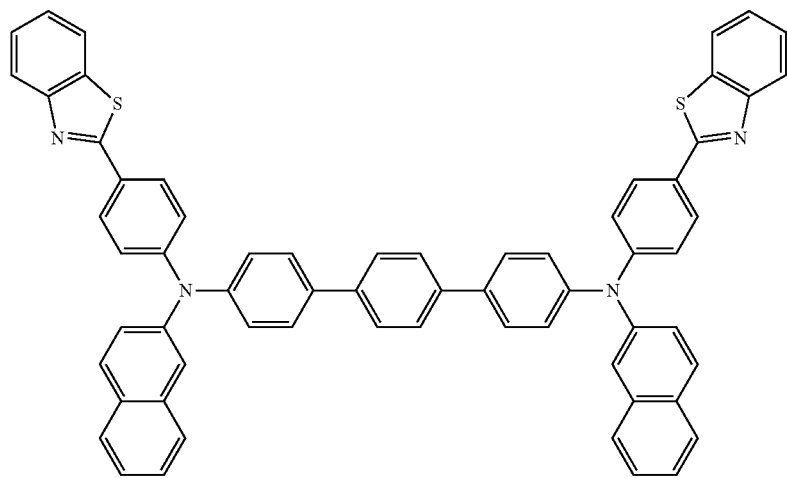
D138

D139
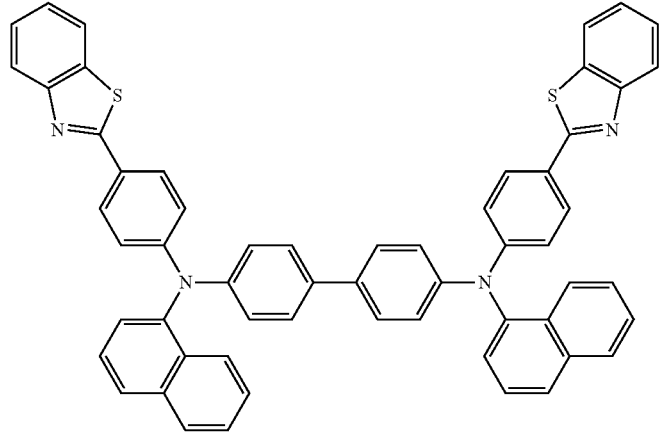
D140
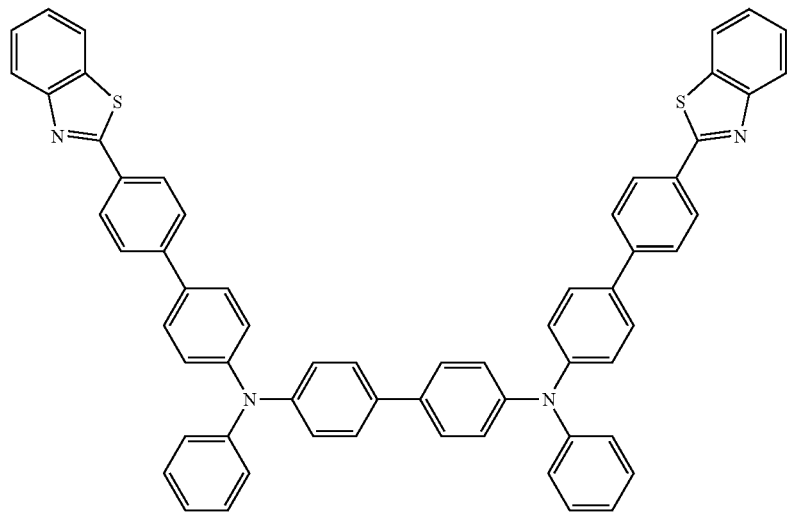
D141
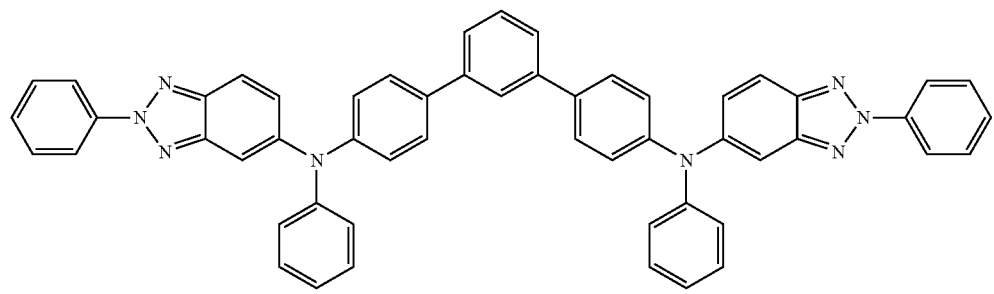
D142
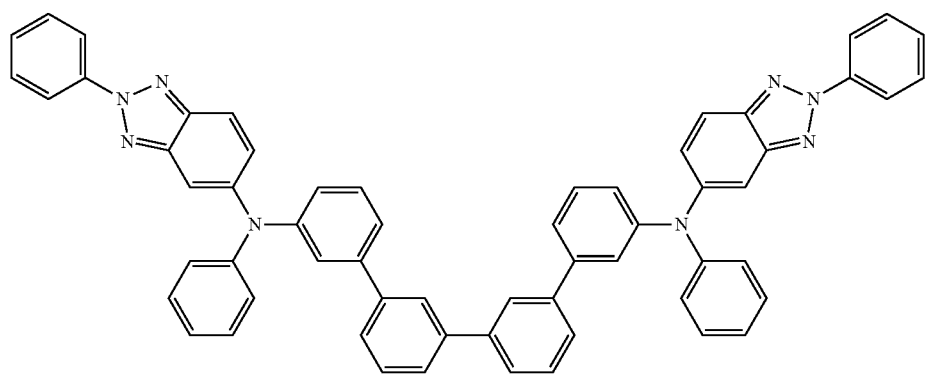

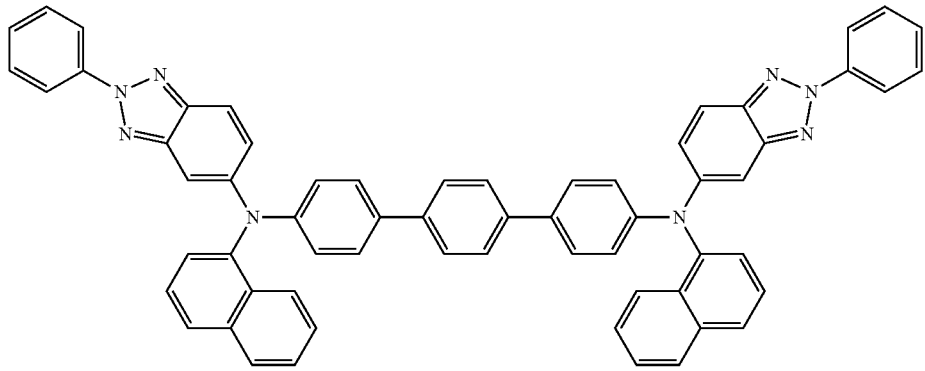

D143

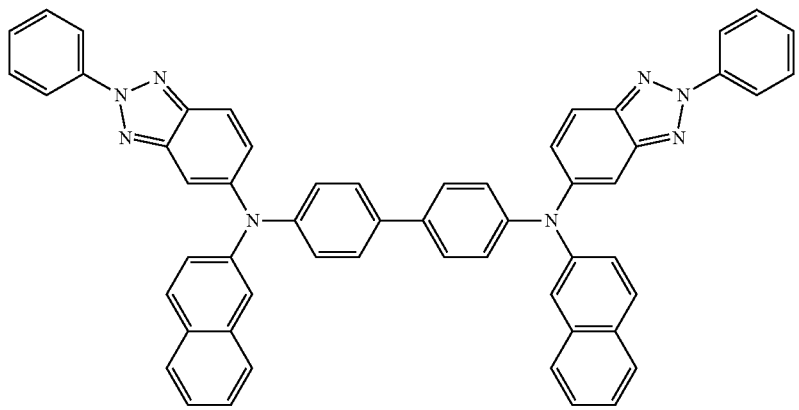

D144

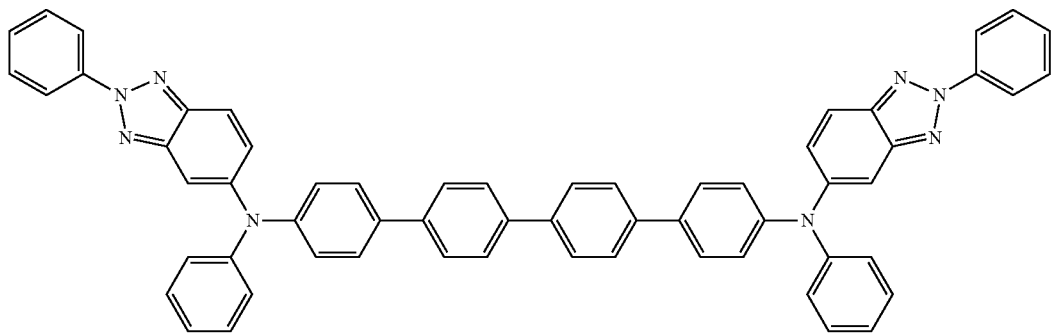

D145

14. The organic electroluminescent device according to claim 8, wherein each of the hole transport layer, the electron blocking layer, and the capping layer comprises a compound represented by Formula F:

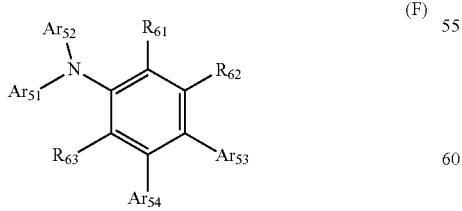

wherein $R_{61}$ to $R_{63}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, substituted or unsubstituted $C_1$-$C_{30}$ alkylgermanium, substituted or unsubstituted $C_1$-$C_{30}$ arylgermanium, cyano, nitro, and halogen, and $Ar_{51}$ to $Ar_{54}$ are identical to or different from each other and are each independently substituted or unsubstituted $C_6$-$C_{40}$ aryl or substituted or unsubstituted $C_2$-$C_{30}$ heteroaryl.

15. The organic electroluminescent device according to claim 14, wherein at least one of $Ar_{51}$ to $Ar_{54}$ is represented by Formula E:

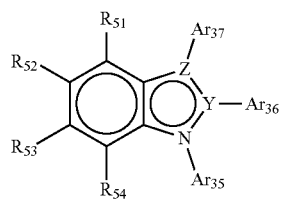

(E)

wherein $R_{51}$ to $R_{54}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, which are optionally linked to each other to form a ring, Y is a carbon or nitrogen atom, Z is a carbon, oxygen, sulfur or nitrogen atom, $Ar_{35}$ to $Ar_{37}$ are identical to or different from each other and are each independently selected from substituted or unsubstituted $C_5$-$C_{50}$ aryl and substituted or unsubstituted $C_3$-$C_{50}$ heteroaryl, provided that when Z is an oxygen or sulfur atom, $Ar_{37}$ is nothing, provided that when Y and Z are nitrogen atoms, only one of $Ar_{35}$, $Ar_{36}$, and $Ar_{37}$ is present, provided that when Y is a nitrogen atom and Z is a carbon atom, $Ar_{36}$ is nothing, with the proviso that one of $R_{51}$ to $R_{54}$ and $Ar_{35}$ to $Ar_{37}$ is a single bond linked to one of the linkers $Ar_{51}$ to $Ar_{54}$ in Formula F.

16. The organic electroluminescent device according to claim 14, wherein the compound of Formula F is selected from the compounds of Formulae F1 to F33:

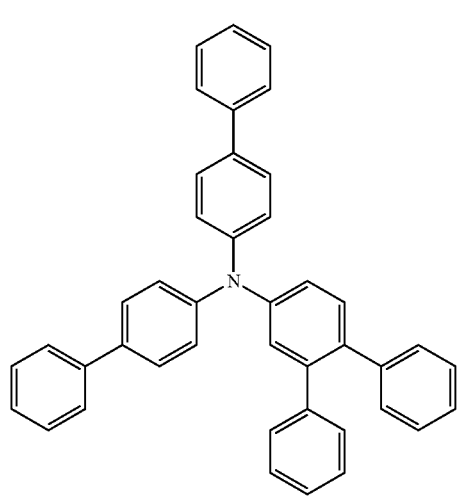

F1

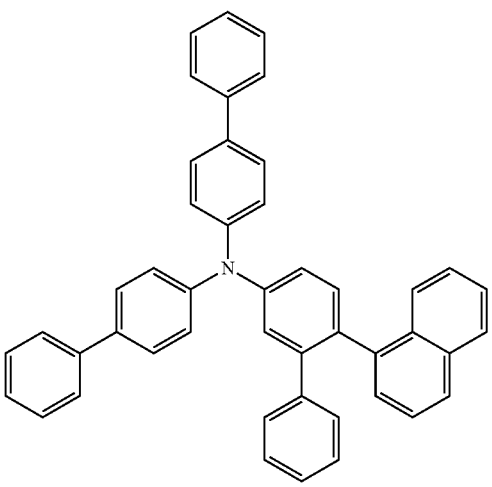

F2

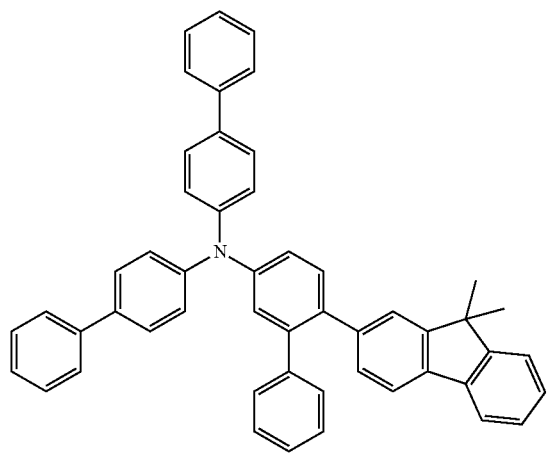

F3

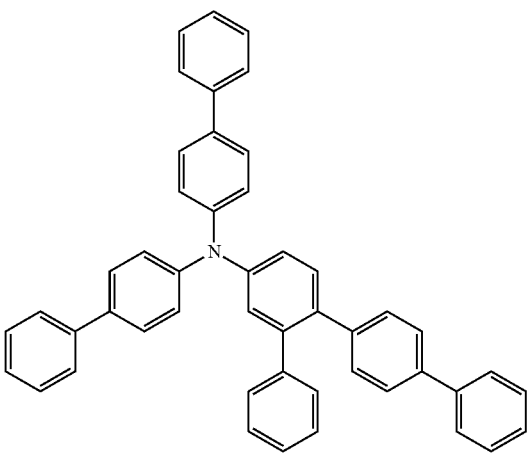

F4

-continued
F5
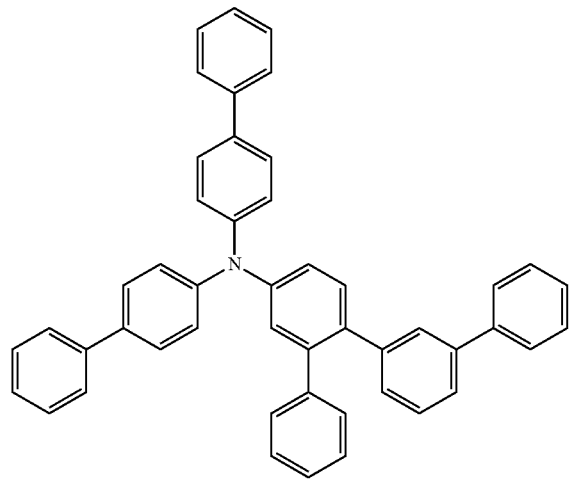
F6
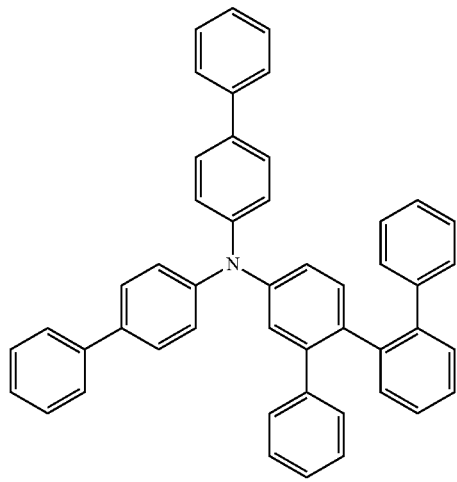
F7
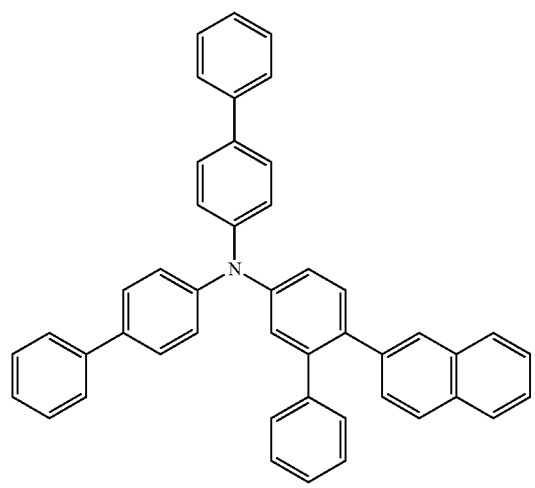
F8
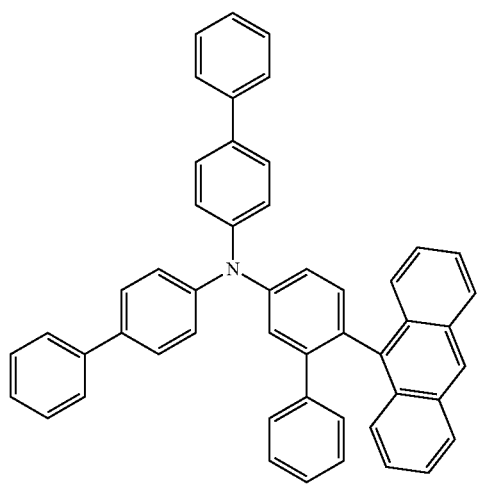
F9
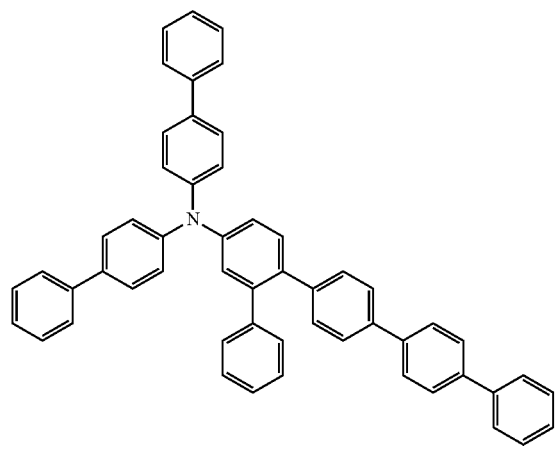
F10
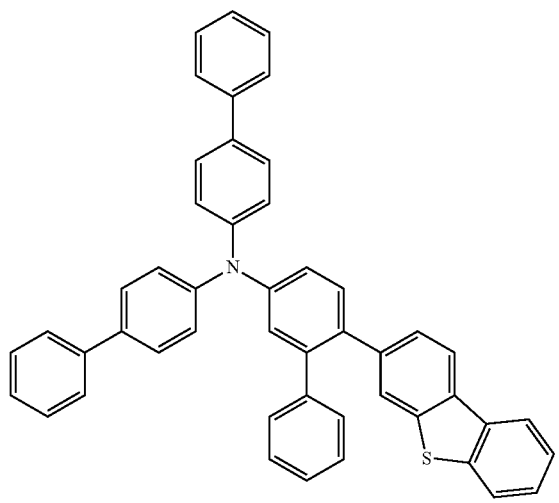

-continued
F11
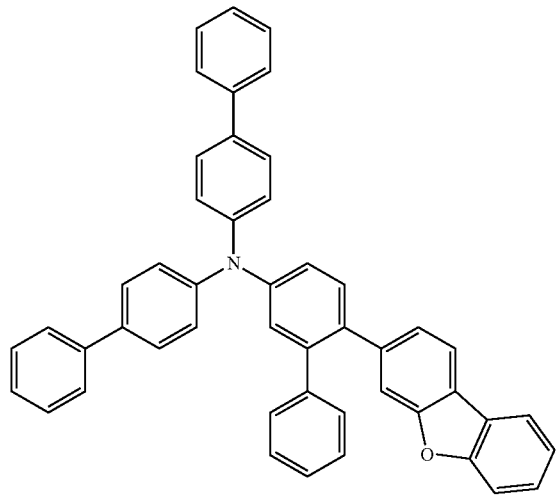
F12
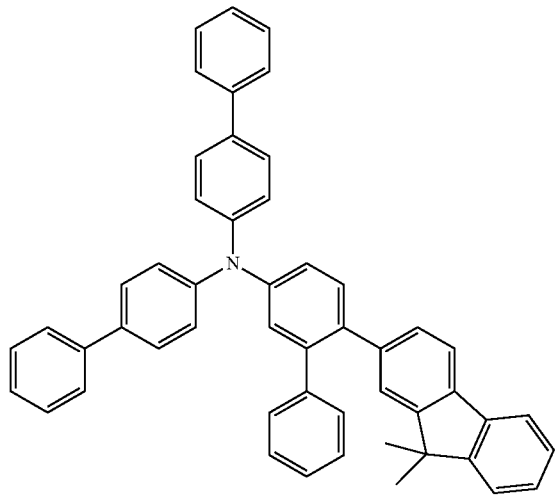
F13
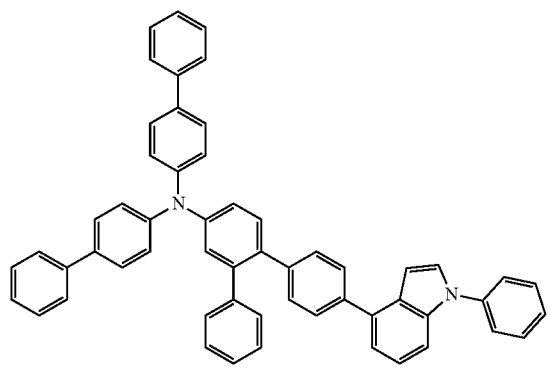
F14
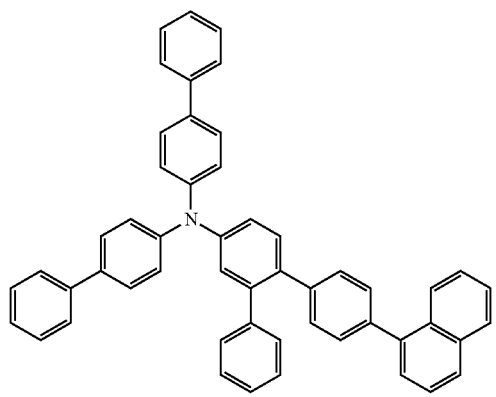
F15
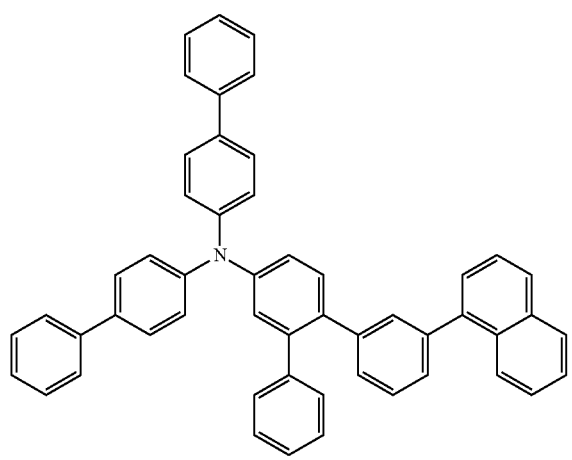
F16
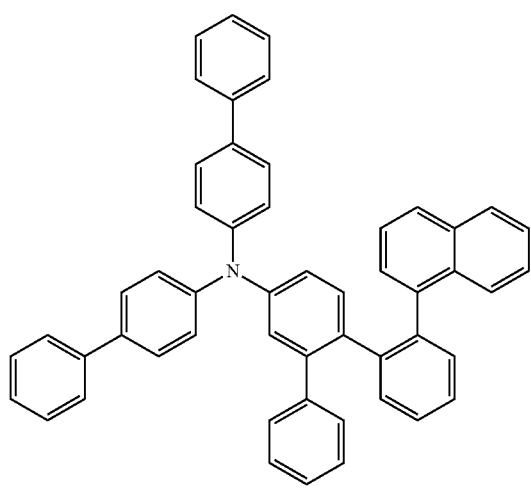

-continued
F17
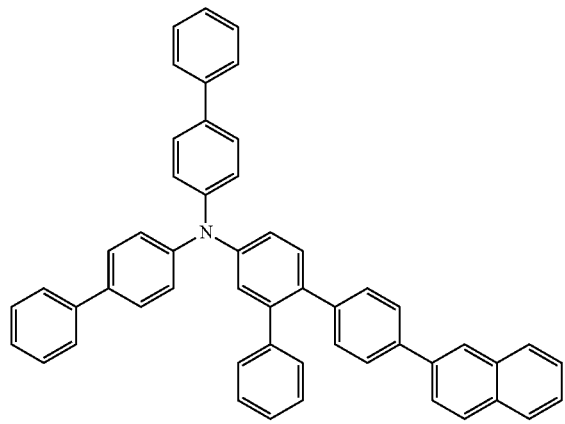
F18
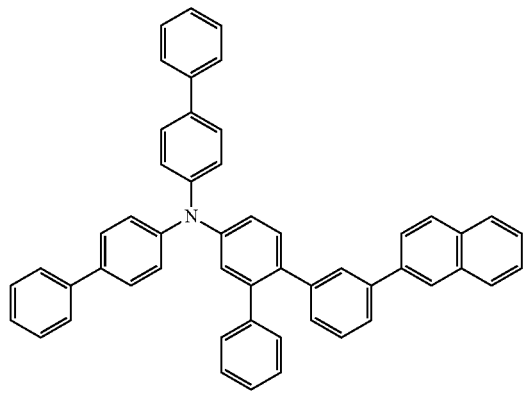
F19
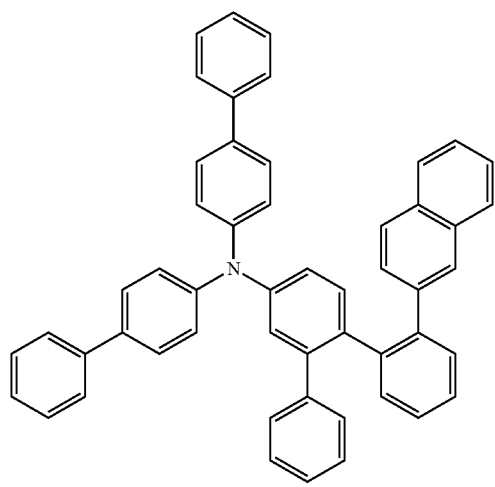
F20
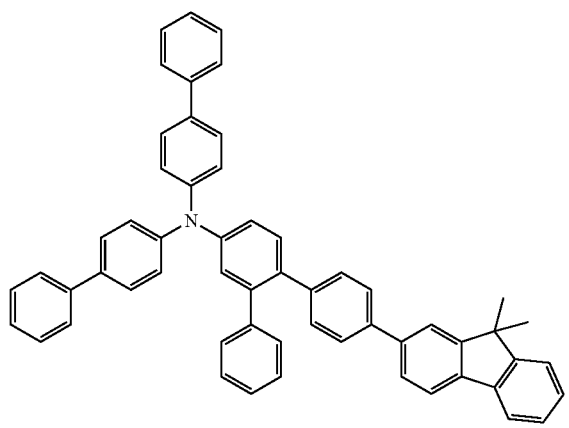
F21
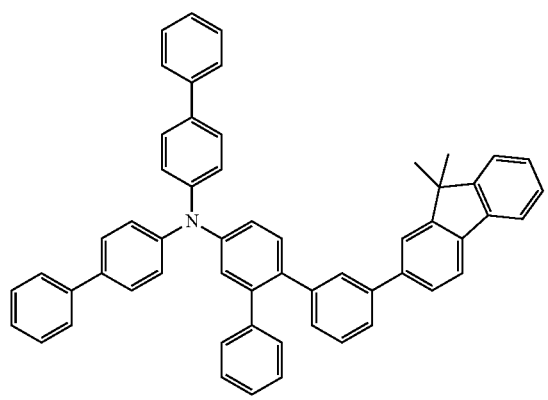
F22
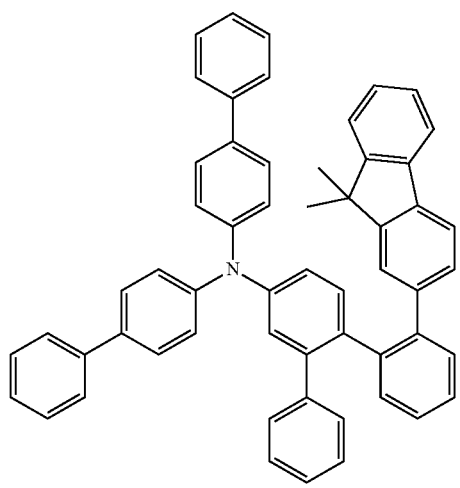

-continued
F23
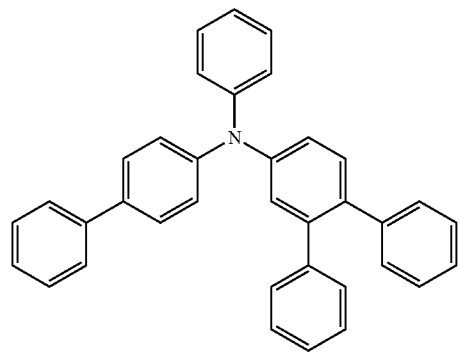
F24
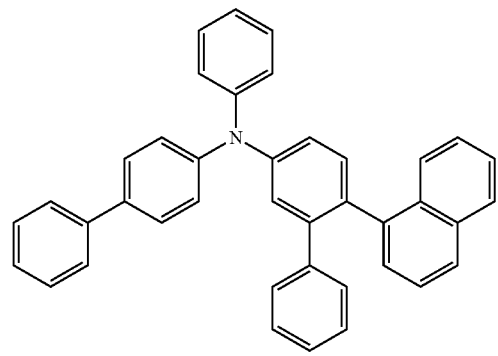
F25
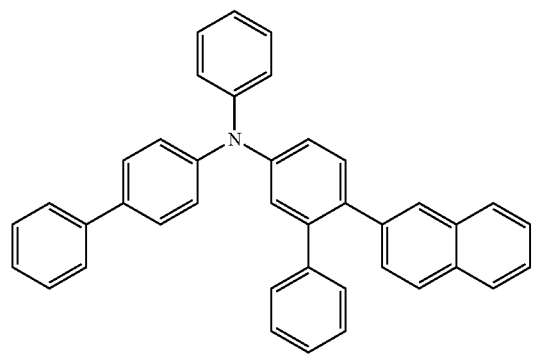
F26
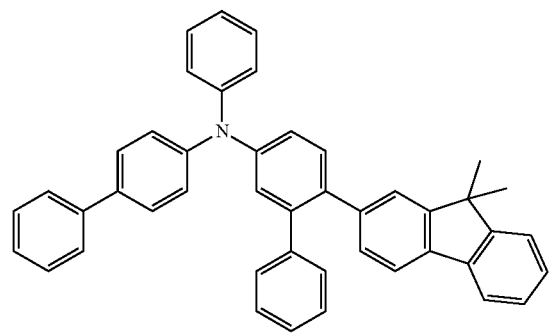
F27
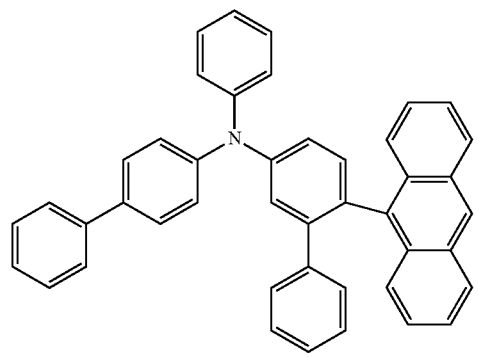
F28
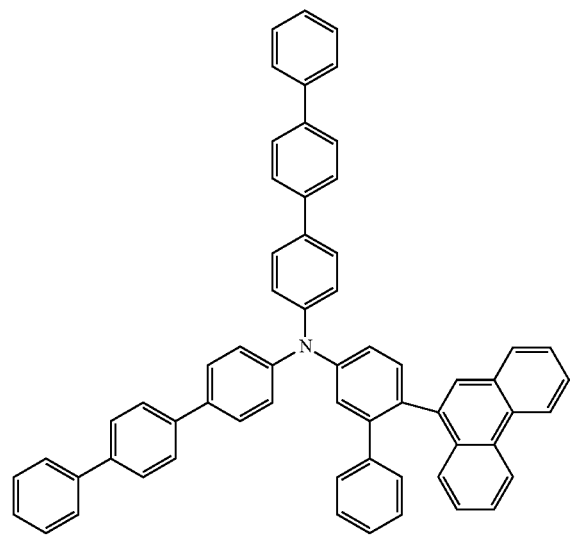

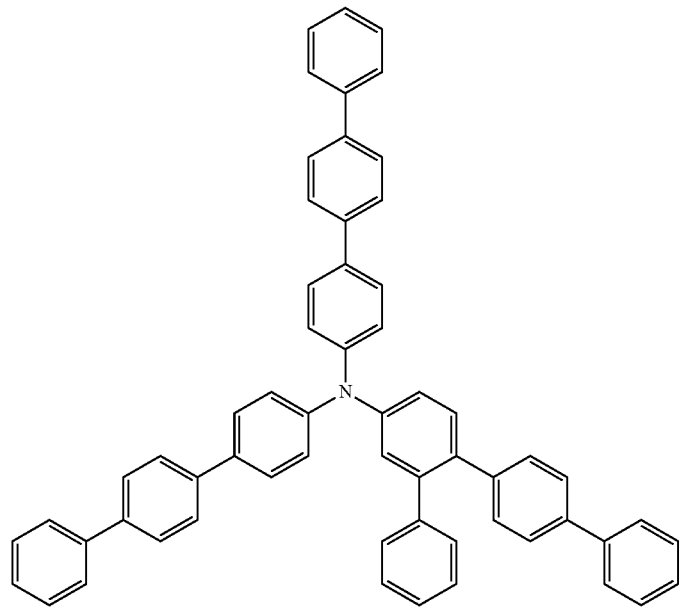
F29
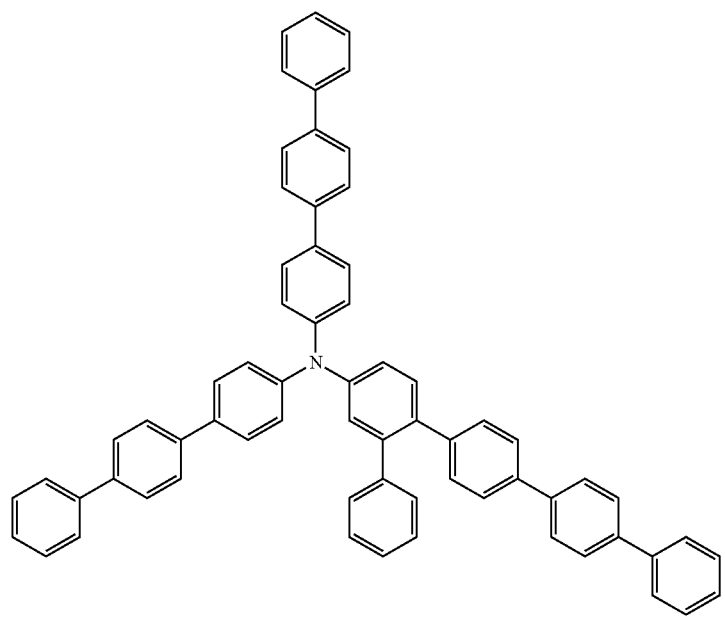
F30

-continued
201 F31
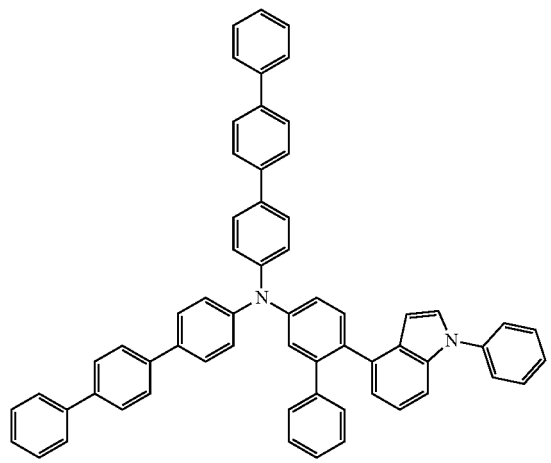
202 F32
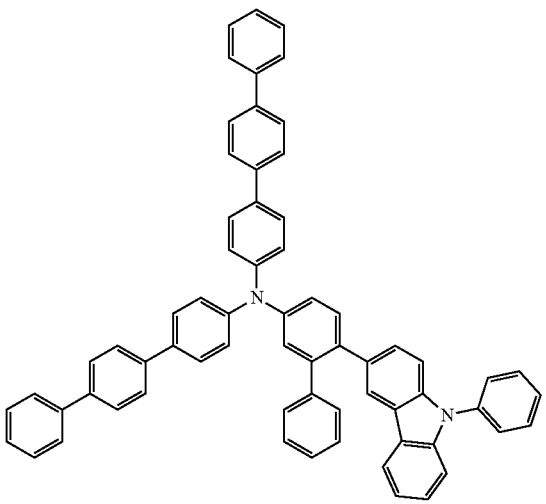
F33
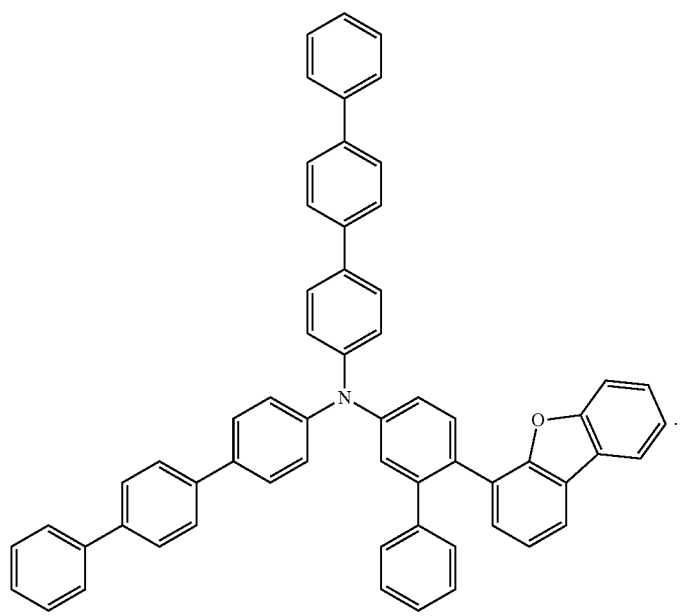
* * * * *